US006498685B1

(12) United States Patent
Johnson

(10) Patent No.: US 6,498,685 B1
(45) Date of Patent: Dec. 24, 2002

(54) MASKLESS, MICROLENS EUV LITHOGRAPHY SYSTEM

(76) Inventor: Kenneth C. Johnson, 2502 Robertson Rd., Santa Clara, CA (US) 95051

( * ) Notice: Subject to any disclaimer, the term of this patent is extended or adjusted under 35 U.S.C. 154(b) by 0 days.

(21) Appl. No.: 09/478,233

(22) Filed: Jan. 4, 2000

Related U.S. Application Data

(60) Provisional application No. 60/115,451, filed on Jan. 11, 1999, provisional application No. 60/119,403, filed on Feb. 1, 1999, provisional application No. 60/116,074, filed on Jan. 15, 1999, provisional application No. 60/119,655, filed on Feb. 11, 1999, provisional application No. 60/123,527, filed on Mar. 8, 1999, provisional application No. 60/124, 140, filed on Mar. 12, 1999, provisional application No. 60/124,422, filed on Mar. 15, 1999, provisional application No. 60/125,487, filed on Mar. 22, 1999, provisional application No. 60/133,450, filed on May 11, 1999, provisional application No. 60/135,636, filed on May 24, 1999, provisional application No. 60/136,925, filed on Jun. 1, 1999, provisional application No. 60/137,309, filed on Jun. 3, 1999, provisional application No. 60/139,002, filed on Jun. 14, 1999, provisional application No. 60/143,470, filed on Jul. 12, 1999, provisional application No. 60/151,461, filed on Aug. 30, 1999, and provisional application No. 60/162, 684, filed on Nov. 1, 1999.

(51) Int. Cl.[7] .......................... G02B 27/10; B41J 15/14; B41J 27/00
(52) U.S. Cl. ....................................... 359/626; 347/241
(58) Field of Search ........................ 250/492.2, 492.22, 250/492.1; 359/619, 626; 355/44, 45, 55; 347/239, 241, 244; 378/34, 35, 84, 85

(56) References Cited

U.S. PATENT DOCUMENTS

| 4,327,966 A | 5/1982 | Bloom | 350/162 |
| 4,638,334 A | 1/1987 | Burnham et al. | 346/108 |
| 5,263,073 A | 11/1993 | Feldman | 378/34 |
| 5,517,279 A | 5/1996 | Hugle et al. | 355/46 |

(List continued on next page.)

FOREIGN PATENT DOCUMENTS

| JP | 05224396 | 10/1992 | G03F/1/08 |
| WO | WO 97/05526 | 2/1997 | G03F/1/100 |
| WO | WO 97/34171 | 9/1997 | G02B/21/06 |
| WO | WO 98/04950 | 2/1998 | G02B/26/00 |
| WO | WO 98/12603 | 3/1998 | G03F/7/00 |
| WO | WO 99/00706 | 1/1999 | G03F/7/20 |
| WO | WO-00/42618 A1 * | 7/2000 | G21K/1/06 |

OTHER PUBLICATIONS

Davidson, Mark, "A Microlens Direct–Write Concept for Lithography," SPIE vol. 3048, pp. 346–355 (1977).
Carter, et al., "Zone–plate array lithography (ZPAL): A new maskless approach," SPIE, vol. 3676, Mar. 1999, pp. 324–332 (Santa Clara, CA).

(List continued on next page.)

Primary Examiner—Ricky Mack
(74) Attorney, Agent, or Firm—Townsend and Townsend and Crew LLP

(57) ABSTRACT

A maskless, extreme ultraviolet (EUV) lithography system uses microlens arrays to focus EUV radiation (at an operating wavelength of 11.3 nm) onto diffraction-limited (58-nm FWHM) focused spots on a wafer printing surface. The focus spots are intensity-modulated by means of microshutter modulators and are raster-scanned across a wafer surface to create a digitally synthesized exposure image. The system uses a two-stage microlens configuration to achieve both a high fill factor and acceptable transmission efficiency. EUV illumination is supplied by a 6 kHz xenon plasma source, and the illumination optics comprise an aspheric condenser mirror, a spherical collimating mirror, and two sets of flat, terraced fold mirrors that partition the illumination into separate illumination fields covering individual microlens arrays. (The system has no projection optics, because the image modulator elements are integrated with the microlens arrays.) The printing throughput is estimated to be 62 (300-mm) wafers per hour (assuming a resist exposure threshold of 20 mJ/cm$^2$), and print resolution is estimated at 70 nanometers for mixed positive- and negative-tone patterns (at $k_1=0.6$).

33 Claims, 36 Drawing Sheets

U.S. PATENT DOCUMENTS

| | | | |
|---|---|---|---|
| 5,619,245 A | 4/1997 | Kessler et al. | 347/241 |
| 5,625,471 A | 4/1997 | Smith | 359/30 |
| 5,691,541 A | 11/1997 | Ceglio et al. | 250/492.1 |
| 5,870,176 A | 2/1999 | Sweatt et al. | 355/53 |
| 5,882,468 A | 3/1999 | Crockett et al. | 156/345 |
| 5,900,637 A | 5/1999 | Smith | 250/492.22 |
| 5,958,605 A | 9/1999 | Montcalm et al. | 428/627 |
| 5,959,763 A | 9/1999 | Bozler et al. | 359/290 |
| 6,016,185 A | 1/2000 | Cullman et al. | 355/52 |

OTHER PUBLICATIONS

Carter et al., "Maskless, parallel patterning with zone–plate array lithography," *J. Vac. Sci. Technol.* B 17(6), Nov./Dec. 1999, pp. 3449–3452.

Chen et al., "Design and implementation of capacitive proximity sensor using microelectromechanical systems technology," *IEEE Transactions on Industrial Electronics*, vol. 45(6) Dec. 1998, pp. 886–894.

Choksi et al., "Maskless EUV lithography based on elastic micromirrors," Slides 1 through 10, *Solid State and Photonics Laboratory*, Stanford University, Aug. 7, 1999.

Choksi et al., "Maskless extreme ultraviolet lithography," *J. Vac. Sci. Technol.* B 17(6), Nov./Dec. 1999, pp. 3047–3051.

DeJule, R., "Masks: What's behind rising costs?" *Semiconductor International*, Sep. 1999, pp. 58–64.

Feldman, M., "Use of zone plate arrays in projection x–ray lithography," *OSA Proceedings on Soft X–Ray Projection Lithography*, 1993, vol. 18 (Andrew M. Hawryluk and Richard H. Stulen, eds.), pp. 207–209.

Fernandez, A. et al., "Methods for fabricating arrays of holes using interference lithography," *J. Vac. Sci. Technol.* B 15(6), Nov./Dec. 1997, pp. 2439–2443.

Folta, James A. et al., "Advances in multilayer reflective coatings for extreme–ultraviolet lithography," *SPIE Proc.* vol. 3676 (Mar. 1999), pp. 702–709.

Folta, J.A. et al., "High density arrays of micromirrors," Feb. 1999, pp. 1–9 (UCRL–ID–133164/*National Technical Information Service*, US Dept. of Commerce, Springfield, VA 22161).

Gale, M.T., "Direct writing of continuous–relief micro–optics," *Micro–optics, Elements, systems and applications*, (Chapter 4) (Hans Peter Herzig, ed.) (Taylor & Francis, 1997), pp. 87–152.

Grunwald, Rüediger et al., "Microlens formation by thin–film deposition with mesh–shaped masks" *Applied Optics*, vol. 38(19), (Jul. 1, 1999), pp. 4117–4124.

Hutchinson, John M., "The shot noise impact on resist roughness in EUV lithography," *SPIE Proc.*, vol. 3331 (1998), pp. 531–533.

Hutley, M.C., "Optical techniques for the generation of microlens arrays," *Journal of Modern Optics*, vol. 37(2) (1990), pp. 253–265.

"Nomenclature and Definitions for Illuminating Engineering," ANSI/IESNA RP–16–1996, *Illuminating Engineering Society of North America* (ANSI Approval Date: Nov. 29, 1996), pp. 1–2.

Kanouff, Michael P. et al., "A gas curtain of mitigating hydrocarbon contamination of EUV lithographic optical components," *SPIE Proc.* vol. 3676 (Mar. 1999), pp. 735–742.

Kim, Myeongcheol et al., "The growth of nanometer Si/SiGe/Si quantum well with wires local molecular beam epitaxy in dependence on the shadow mask geometry," *Journal of Crystal Growth* 167 (1966), pp. 508–515.

Köhler, J. et al., "Direct growth of nanostructures by deposition through an $Si_3N_4$ shadow mask," *Physica E 4* (1999) (Elsevier Science B.V.), pp. 196–200.

Kubiak, Glenn D. et al., "Scale–up of a cluster jet laser plasma source for extreme ultraviolet lithography," *Spie Proc.* vol. 3676 (1999), pp. 669–678.

Kubiak, Glenn D. et al., "High–power extreme ultraviolet source based on gas jets," *Spie Proc.* vol. 3331 (1998), pp. 81–89.

Lüthi, Roli et al., "Parallel nanodevice fabrication using a combination of shadow mask and scanning probate methods," *Appl. Phys. Lett.*, vol. 75(9), Aug. 1999, pp. 1314–1316.

McClelland, J.J. et al., "Nanofabrication via atom optics with chromium," *SPIE Proc.* vol. 2995 (1997), pp. 90–96.

Karpinsky, John R. et al., "MEMS Micro–shutter SLM for Intensity modulation," *SPIE Proc.* vol. 3633 (1999), pp. 254–259.

Malek, C. Khan et al., "Fabrication of high–resolution multilayer reflection zone plate microlenses for the soft x–ray range," *Optical Engineering*, vol. 30(8) (Aug. 1991), pp. 1081–1085.

Malzer, S. et al., "Properties and applications of the 'epitaxial shadow mask molecular beam epitaxy technique,'" *J. Vac. Sci. Technol.* B (14(3), May/Jun. 1996; 2175–2179.

Miyamoto, Kenro, The phase fresnel lens, *J. of the Optical Society of America*, 51(1), Jan. 1961, pp. 17–20.

Montcalm, Claude et al., "Multilayer coatings of 10X projection optics for extreme–ultraviolet lithography," *SPIE Proc.* vol. 3676 (1999), pp. 710–716.

Montcalm, Claude et al., "Multilayer reflective coatings for extreme–ultraviolet lithography," *SPIE Proc.* vol. 3331(1998), pp. 42–51.

Schattenburg, M.L., Reactive–ion etching of 0.2 $\mu$m period gratings in tungsten and molybdenum using $CBrF_3$, *J. Vac. Sci. Technol.* B 3(1), Jan./Feb. 1985, pp. 272–275.

*Microlithography*, Science and Technology, Alignment and Overlay, (James R. Sheats and Bruce W. Smith, eds., Marcel Dekker, Inc., NY) (1998) pp. 319–321.

Shroff, Yashesh et al., "EUV nanomirror light modulator array for maskless lithography," U.C. Berkeley Microfabrication Laboratory, http://ilpsoft.eecs.berkeley.edu:9636/~ilpsoft/99abstracts/yashesh.2.html (DARPA) MDA972–97–1–0010 and (SRC) 96–LC–460.

Sinzinger, Stefan et al., "4. Refractive microoptics," *Microoptics* (Wiley–VCH, NY, 1999); pp. 86–103.

Smith, Bruce W. et al., "Materials for reflective multilayer coatings for EUV wavelengths," *SPIE Proc.* vol. 3331 (1998), pp. 544–549.

Smith, Henry I., "A proposal for maskless, zone–plate–array nanolithography," *J. Vac. Sci. Technol.* B 14(6), Nov./Dec. 1996, pp. 4318–4322.

Sweeney, Donald W. et al., "EUV optical design for a 100 nm CD imaging system," *SPIE Proc.* vol. 3331 (1998), pp. 2–10.

Völkel, R. et al, "Microlens lithography," Conference: 1996 Display Manufacturing Technology Conference, Digest of Technical Papers, First Edition, pp. 95–96 (Publisher: Soc. Inf. Display, Santa Ana, Ca).

Völkel, R. et al., "Microlens array imaging system for photolithography," *Opt. Eng.* 35(11) (Nov. 1996); pp. 3323–3330.

Völkel, R. et al., "Microlens lithography: A new approach for large display fabrication," *Microelectronic Engineering* 30 (1996); pp. 107–110.

Völkel, R. et al., "Microlens lithography and smart masks," *Microelectronic Engineering* 35 (1997); pp. 513–516.

* cited by examiner

| Lens design (all dimensions in µm) | | | | | |
|---|---|---|---|---|---|
| surface | element | media | diameter | $z_{vertex}$ | $z_{f1}$ | $z_{f2}$ |
| 1 (902) | $L_1$ | Vac/Mo | 5.000 | 0 | ∞ | ∞ |
| 2 (903) | $L_1$ | Mo/Vac | | 0.020 | ∞ | 171.368 |
| 3 (1003) | $L_2$ | Vac/Mo | 1.000 | 171.388 | -171.368 | 6.308 |
| 4 (1004) | $L_2$ | Mo/Vac | | 171.408 | 6.288 | 3.226 |
| 5 (108) | wafer | | | 174.634* | | |

*174.500 at optimum focus

View *A-A*:

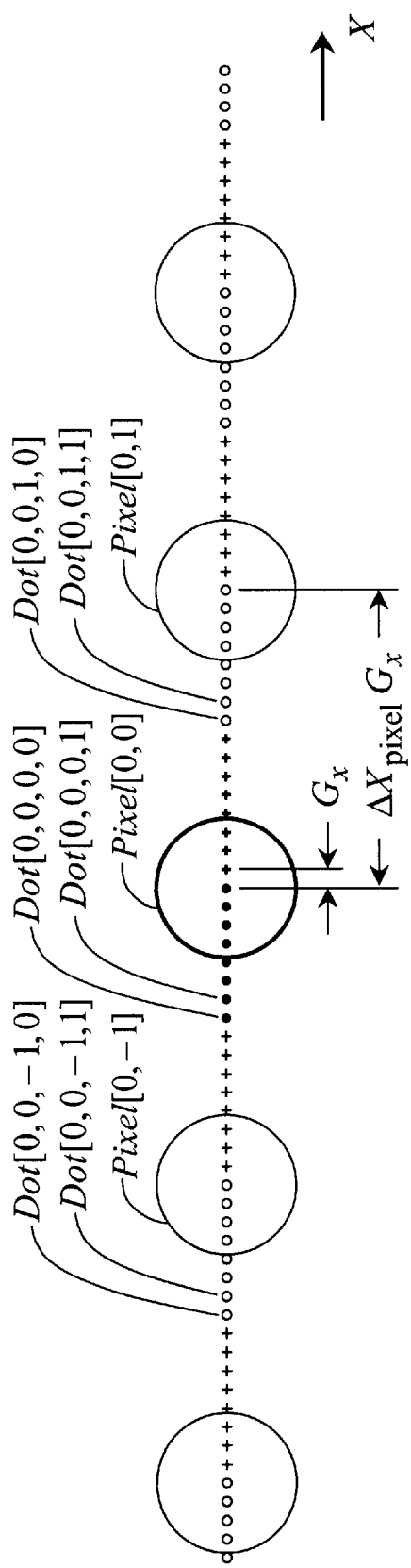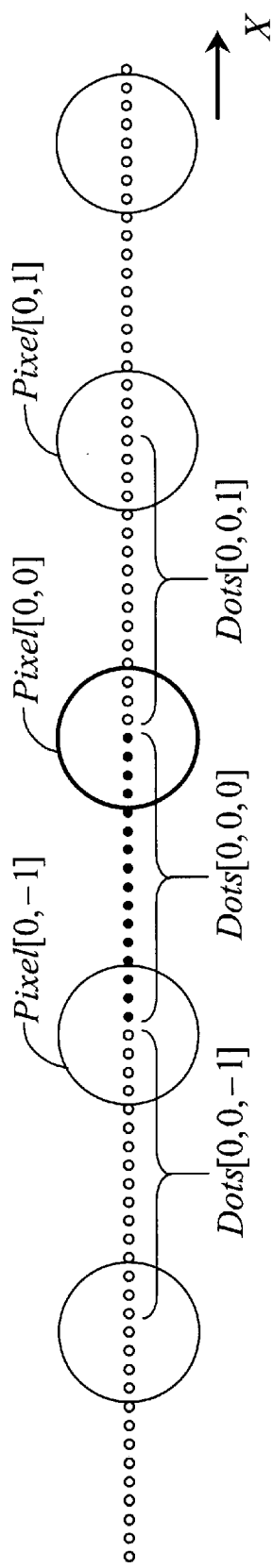
Fig 34A
Fig 34B

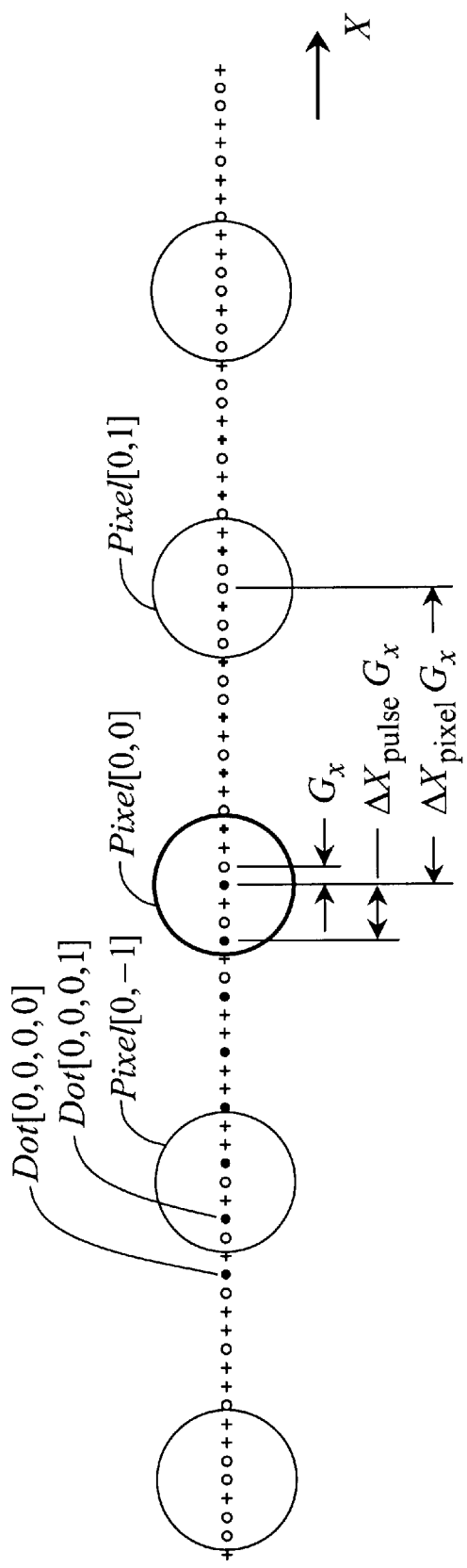
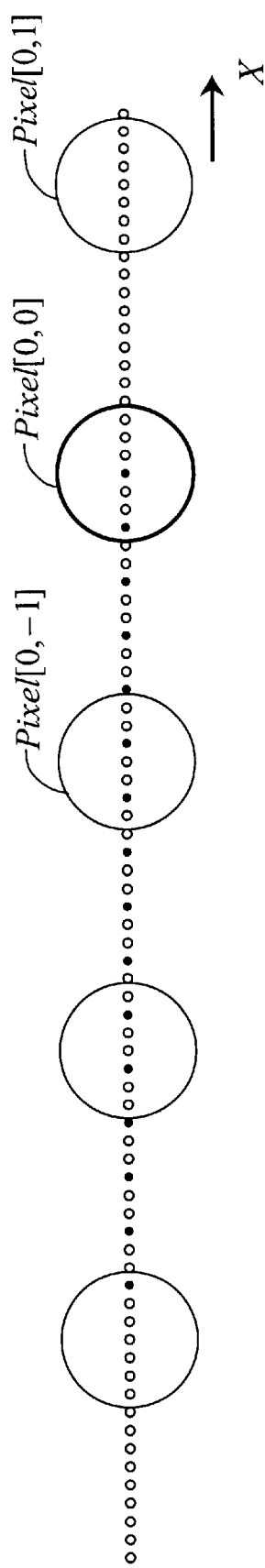
Fig 35A
Fig 35B

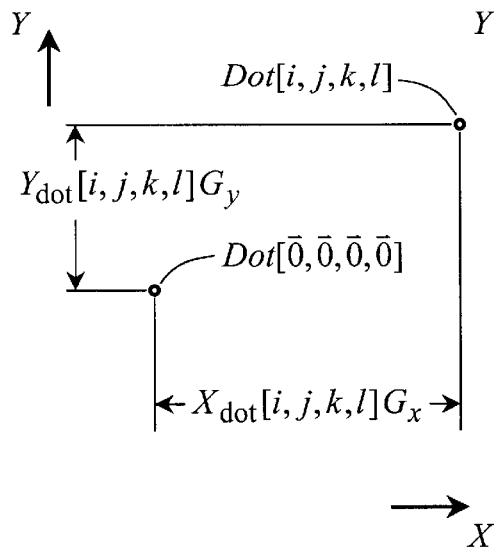
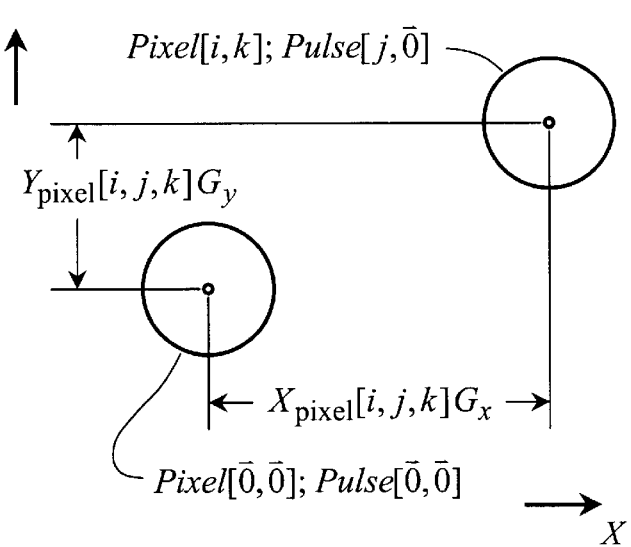
Fig 40    Fig 41
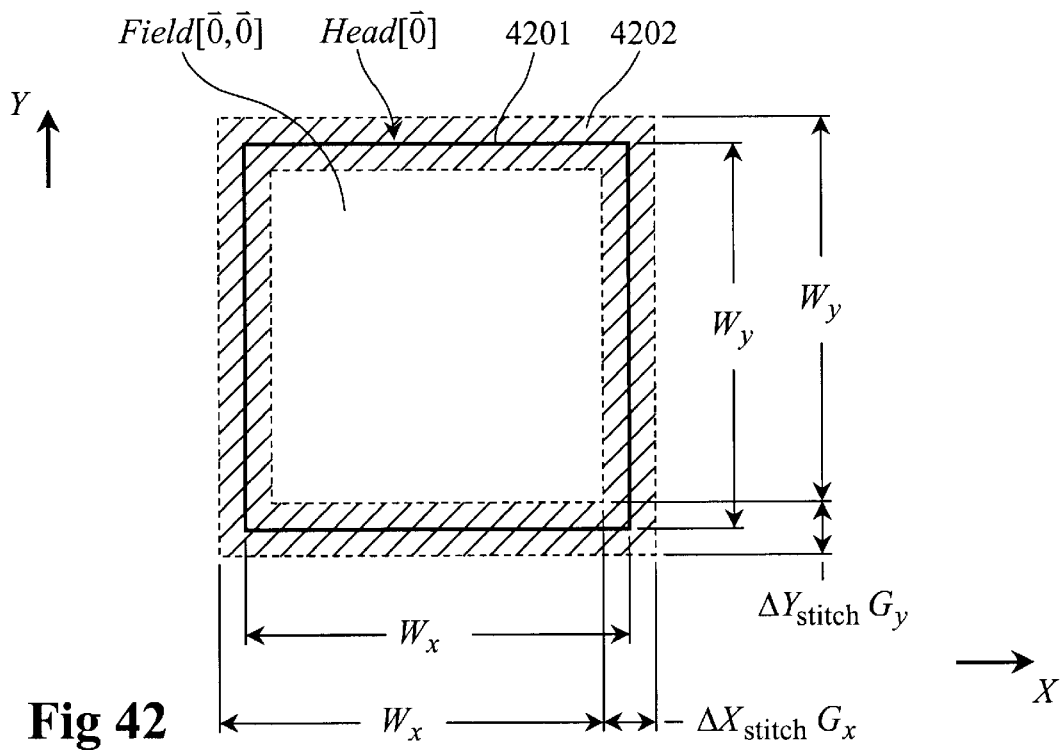
Fig 42

Scan parameters (lens scan)

$W_x = 20$ mm (from Eq 1.4)
$W_y = 20$ mm (from Eq 1.5)
$G_x = 6.861$ nm (from Eq 8.92)
$G_y = 6.860$ nm (from Eq 8.97)
$N_{pulse/line} = 1586$ (from Eq 8.23)
$N_{line/scan} = 425$ (from Eq 8.24)
$N_{pulse/scan} = 674050$ (from Eq 8.18)
$N_{pixel/row} = 1838$ (from Eq 8.91)
$N_{row/head} = 6860$ (from Eq 8.96)
$N_{pixel/head} = 12608680$ (from Eq 8.35)
$N_{row/period} = 2$ (from Eq 8.58)
$N_{period/head} = 3430$ (from Eq 8.36)
$N_{x\,scan} = 2$ (from Eq 8.98)
$N_{y\,scan} = 2$ (from Eq 8.99)
$N_{scan} = 4$ (from Eq 8.47)

$\Delta X_{pulse} = 23$ (from Eq 8.86)
$\Delta Y_{line} = 21$ (from Eq 8.87)
$\Delta X_{scan} = 36478$ (from Eq 8.19)
$\Delta Y_{scan} = 8925$ (from Eq 8.20)
$\Delta X_{pixel} = 1586$ (from Eq 8.88)
$\Delta X_{offset} = 793$ (from Eq 8.57)
$\Delta Y_{pixel} = 425$ (from Eq 8.89)
$\Delta Y_{period} = 850$ (from Eq 8.59)
$\Delta X_{field} = 2915068$ (from Eq 8.39)
$\Delta Y_{field} = 2915500$ (from Eq 8.40)
$\Delta X_{stitch} = 36478$ (from Eq 8.41)
$\Delta Y_{stitch} = 8925$ (from Eq 8.42)
$\Delta X_{head} = 5830136$ (from Eq 8.48)
$\Delta Y_{head} = 5831000$ (from Eq 8.49)

Fig 45

Scan parameters (wafer scan)

$W_x = 10$ mm  (from Eq 8.118)
$W_y = 20$ mm  (from Eq 8.119)
$G_x = 6.866$ nm  (from Eq 8.156)
$G_y = 6.860$ nm  (from Eq 8.157)
$N'_{pulse/line} = 132414$  (from Eq 8.158)
$N_{line/scan} = 10$  (from Eq 8.24)
$N'_{pulse/scan} = 1324140$  (from Eq 8.107)
$N_{pixel/row} = 22$  (from Eq 8.153)
$N_{row/head} = 291545$  (from Eq 8.155)
$N_{pixel/head} = 6413990$  (from Eq 8.35)
$N_{row/period} = 87$  (from Eq 8.141)
$N_{period/head} \cong 3351.1$  (from Eq 8.36)
$N'_{x\,scan} = 1$  (from Eq 8.109)
$N_{y\,scan} = 2$  (from Eq 8.160)

$\Delta X_{pulse} = 22$  (from Eq 8.138)
$\Delta Y_{line} = 23$  (from Eq 8.134)
$\Delta X'_{scan} = 2913108$  (from Eq 8.159)
$\Delta Y_{scan} = 230$  (from Eq 8.20))
$\Delta X_{pixel} = 66207$  (from Eq 8.145)
$\Delta X_{offset} = 1522$  (from Eq 8.149)
$\Delta Y_{pixel} = 10$  (from Eq 8.133)
$\Delta Y_{period} = 870$  (from Eq 8.142)
$\Delta X'_{field} = 2913108$  (from Eq 8.159)
$\Delta Y_{field} = 2915450$  (from Eq 8.40)
$\Delta X_{stitch} = 1456554$  (from Eq 8.116)
$\Delta Y_{stitch} = 230$  (from Eq 8.42)
$\Delta X_{head} = 2913108$  (from Eq 8.159)
$\Delta Y_{head} = 5830900$  (from Eq 8.49)

Fig 50

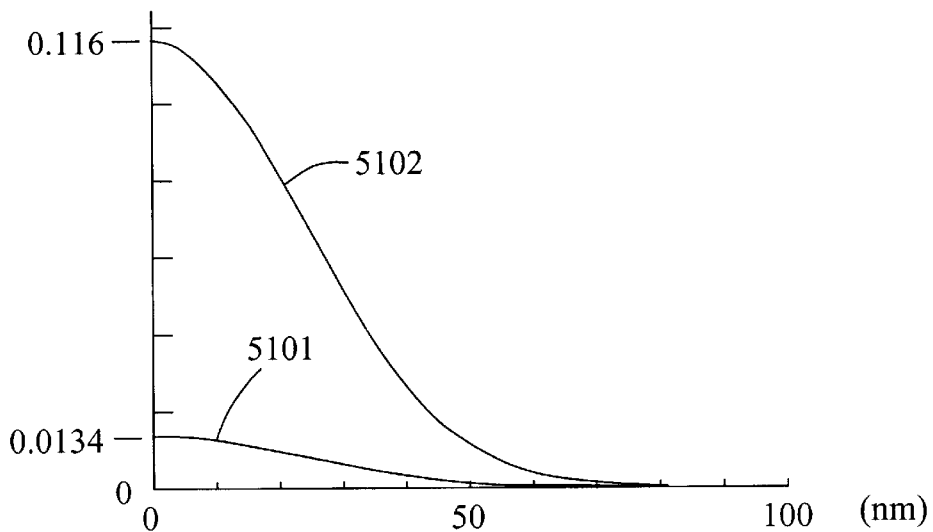
Fig 51
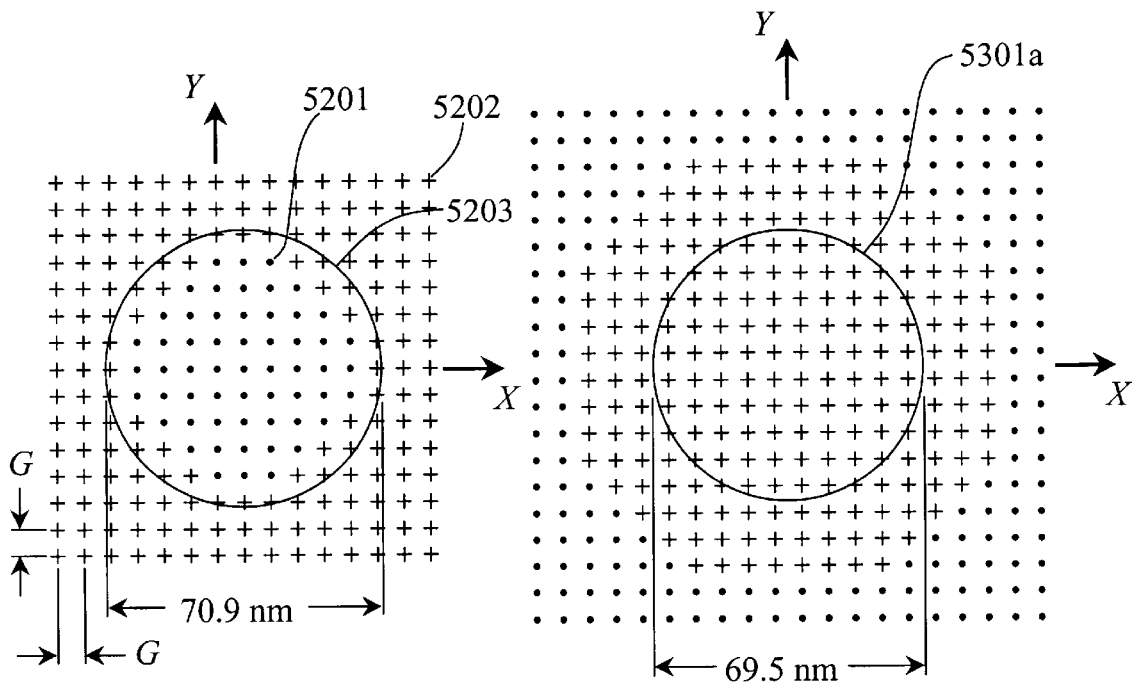
Fig 52                    Fig 53

← 69.8 nm →

← 71.4 nm →

MASKLESS, MICROLENS EUV LITHOGRAPHY SYSTEM

CROSS-REFERENCES TO RELATED APPLICATIONS

This application claims priority from the following provisional applications, the disclosures of which are incorporated by reference:

"Conformal Imaging Microlens Array", provisional application 60/115,451, filed Jan. 11, 1999.

"Conformal Imaging Microlens Array with High Fill Factor", provisional application 60/119,403, filed Feb. 1, 1999.

"Spatially modulated microlens array for EUV maskless lithography", provisional application 60/116,074, filed Jan. 15, 1999.

"High-Resolution EUV Microlens Design", provisional application 60/119,655, filed Feb. 11, 1999.

"EUV Microlens System Design Outline", provisional application 60/123,527, filed Mar. 8, 1999.

"Improved grating modulator design for EUV maskless lithography", provisional application 60/124,140, filed Mar. 12, 1999.

"ETV Microlens System Design Outline", provisional application 60/124,422, filed Mar. 15, 1999.

"EUV Modulator Design Concepts", provisional application 60/125,487, filed Mar. 22, 1999.

"EUV Microlens System Design Variations and Refinements", provisional application 60/133,450, filed May 11, 1999.

"Collection Optics Design for EUV Microlens Lithography", provisional application 60/135,636, filed May 24, 1999.

"EUV Microlens Design Options", provisional application 60/136,925, filed Jun. 1, 1999.

"Moiré Alignment Tracking System for EUV Microlens Lithography", provisional application 60/137,309, filed Jun. 3, 1999.

"Phase-Measuring Microlens Microscopy", provisional application 60/139,002, filed Jun. 14, 1999.

"EUV Microlens Fabrication Options", provisional application 60/143,470, filed Jul. 12, 1999.

"Twice-improved grating modulator design for EUV maskless lithography", provisional application 60/151,461, filed Aug. 30, 1999.

"Maskless EUV Lithography System Employing Transmission Micro-Optics", provisional application 60/162,684, filed Nov. 1, 1999.

BACKGROUND OF THE INVENTION

This invention relates primarily to microlithography, and more specifically to extreme ultraviolet (EUV) lithography. The invention is applicable to semiconductor lithography and lithographic patterning of microstructures such as micromechanical systems, micro-optics, porous membranes, etc.

EUV lithography is a leading candidate technology for next-generation semiconductor lithography, which will require sub-100-mn printing resolution. An industry consortium (the EUV Limited Liability Company) is focusing development efforts on an engineering approach that is basically an evolutionary extension of LW and DUV projection lithography, the main difference being that the EUV system requires all-reflective optics due to the lack of EUV-transmitting lens materials (Ref. 1). The basic system design has nine reflective surfaces between the EUV source and the wafer, including four condenser mirrors, the photomask, and four projection camera mirrors. Seven of the reflectors (including the photomask) comprise multilayer coatings that operate at near-normal incidence and are optimized for peak reflectance at a wavelength of 13.4 nm.

Mirror coatings are one of the key enabling technologies that have made EUV lithography possible. Presently, multilayer Mo/Si (molybdenum/silicon) multilayer mirrors routinely achieve peak reflectance efficiencies of 67.5% at the 13.4-nm operating wavelength, with a spectral reflectance bandwidth of 0.56-nm FWHM (Refs. 2, 3). Nevertheless, the lithography system's optical efficiency is significantly limited by the compound reflectance losses of seven multilayer mirrors operating in series.

The mirror surface figure tolerances scale in proportion to the operating wavelength, which is an order of magnitude smaller than DUV wavelengths at the 13.4-nm EUV wavelength. Furthermore, tolerance requirements for mirrors are generally much more stringent than lenses. Thus, the four EUV projection camera mirrors which image the mask onto the wafer must be fabricated to extremely tight (i.e., atomic-scale) absolute figure tolerances over large aperture areas.

The system uses multilayer reflective masks, which operate at 4:1 reduction. Mask fabrication presents significant technical challenges due to factors such as the short operating wavelength and small feature dimensions, lack of EUV pellicle materials, and very stringent registration requirements. EUV masks are expected to cost approximately $50,000 at 100-nm print resolution (Ref. 4).

Two research groups at the University of California at Berkeley and Stanford University are currently investigating maskless EUV lithography approaches (Refs. 5, 6). Their basic approach is to replace the mask with a spatial light modulator (SLM) comprising a programmable array of micromirrors whose reflectance properties can be varied by modulating the mirrors' tilt or translational positions. Although these are maskless systems, they nevertheless require EUV projection optics to image the micromirror array onto the wafer. Due to minimum size limits of the SLM pixel elements, the projection optics must operate at a very high reduction ratio, (e.g., 20 to 40× demagnification), which precludes the use of current-generation (4×) EUV projection optics.

Another limitation of micromirror systems is that the SLM must operate at a very high frame rate (e.g., multi-megahertz) in order to achieve requisite throughput requirements. (The system's total data throughput requirement is at least 10 bits per second.) This requires a continuous EUV source such as a synchrotron, and precludes the use of a pulsed EUV source such as a high-power, laser-produced plasma (LPP) source that is currently being developed by Sandia National Laboratories for EUV lithography (Refs. 7, 8).

Several recent patents and publications describe a variety of other SLM-based maskless lithography design concepts, some of which are applicable to EUV (Refs. 9–18). Most of these systems employ projection optics, but one of these inventions, a Fresnel zone plate microlens system (Refs. 16–18), eliminates the need for projection optics as well as the mask. The system is designed primarily for x-ray lithography at a wavelength of 4.5 nm, but the basic design principle could be applied equally well to EUV. The device comprises an array of zone plate microlenses that focus an incident x-ray (or alternatively, EUV) beam onto an array of diffraction-limited points on a wafer surface. Each microlens transmission is modulated by a micro-actuated shutter as the wafer is raster-scanned across the focal point array to build up a synthesized, high-resolution image.

Since the zone plate system does not use projection optics, it could conceivably use a very large number of zone plate lenses in multiple, large-area arrays, all operating in parallel. Based on printing throughput requirements, the required modulation frame rate would scale in inverse proportion to the number of lenses, so with a sufficiently large number of lenses the system could conceivably use an LPP EUV source operating at a moderate frame rate (e.g., 6 kHz, Ref. 8). However, the proposed method for manufacturing the zone plates lenses (spatial-phase-locked e-beam lithography) is not very practical for large-quantity production, and there are also other complicating factors that preclude the use of an LPP source with the zone plate system.

The plasma source in the LPP has a fairly large spatial extent (approximately 200 $\mu$m diameter, Ref. 7), and since each focus point on the wafer is a diffraction-limited image of the source, optical resolution would be limited by the source's geometric image size. Furthermore, the LPP would be used in conjunction with EUV mirrors that have a 2% combined spectral bandwidth, and the zone plate's chromatic dispersion within this band could also significantly limit focus resolution. The source's geometric image size on the wafer and the image's chromatic spread should preferably both be significantly smaller than the diffraction-limited image of an ideal monochromatic point source. This condition could be achieved, in principle, by using very small microlenses with short focal lengths; but the zone plate lens elements must be sufficiently large to accommodate the shutter mechanism, data paths, and supporting framework, while also maintaining an acceptably high aperture fill factor. Due to this aperture size limitation, a practical zone plate system would probably perform poorly with an LPP, and a more costly synchrotron source would thus be required.

Another limitation of zone plate lithography is that the printing resolution and contrast can be significantly degraded by extraneous diffracted orders. Continuous-profile, refractive microlenses such as those shown in Ref. 13 would not have this limitation, but for EUV application such microlenses would be either too highly absorbing or too small to be of practical utility when used in the mode described in Ref. 13.

SUMMARY OF THE INVENTION

The present invention overcomes the limitations of prior-art microlens printing systems by using multiple microlenses in series to focus exposure illumination onto a printing surface such as a semiconductor wafer. In a preferred embodiment of the invention, the microlenses are used in pairs, each pair consisting of first- and second-stage microlenses, respectively designated as lens $L_1$ and lens $L_2$, wherein $L_1$ focuses illuminating radiation onto $L_2$, and $L_2$ thence focuses the radiation to a focal point on the printing surface. Each such microlens pair forms a printer pixel, and multiple such pixels are combined to form a printhead, which focuses the radiation onto multiple focal points on the printing surface. A modulator mechanism modulates the focal points' exposure intensity levels, and as the points are modulated, the printhead is scanned relative to the printing surface (either the surface or the printhead, or both, can be moved for the scanning) to build up a synthesized, high-resolution exposure image on the print surface.

In general, a printer pixel can comprise a sequence of two or more microlenses $L_1, L_2, \ldots L_N$ (N being an integer greater than 1), wherein each lens $L_m$ ($1 \leq m < N$) focuses the illuminating radiation onto the next lens $L_m+1$ in the sequence, and the last lens $L_N$ focuses the radiation onto a focal point on the printing surface. Typically $L_1$ is a comparatively large element with low optical power, and the succeeding lenses are progressively smaller and have progressively higher optical power.

The modulator mechanism preferably comprises modulator elements that are incorporated as components of the printer pixels, with each modulator element providing independent, digital control of the exposure level at a corresponding focal point. However, in some embodiments a single modulator could be used to modulate the radiation before it is conveyed to the printhead. This option would be useful for applications that do not require independently modulated pixels, for example, in the fabrication of hole arrays for microfiltration membranes. The preferred embodiments use binary-state (i.e., ON/OFF) modulators, but gray scale (continuous-level) modulation may also be employed.

The disclosed embodiments relate primarily to the ETV lithography application, although the disclosed design methods and configurations are also applicable or adaptable to other wavelength ranges such as DUV. In a preferred embodiment, molybdenum microlenses are used to focus an incident EUV beam (at a wavelength of 11.3 nm) onto an array of diffraction-limited (58-nm FWHM) focal points on a wafer surface. A modulator mechanism, such as an SLM comprising microshutters proximate to the microlens apertures, modulates the beam intensity at each focal point. As the points are modulated, the focal point array is raster-scanned across the wafer to build up a digitally synthesized, high-resolution image.

The microlenses are preferably continuous-profile, refractive elements. A refractive EUV lens with sufficient optical power to achieve the requisite focus spot resolution (<100-nm spot size) would have to be very small—on the order of 1 $\mu$m diameter or less; otherwise the lens would be too thick to allow acceptable EUV transmittance. A single array of microlenses and modulators of this size could not be practicably manufactured without incurring unacceptable fill factor losses. But this limitation is circumvented by using a multi-stage microlens system. In a two-stage embodiment, comparatively large (5-$\mu$m diameter), low-power (NA= 0.015) first-stage lenses focus EUV illumination onto much smaller (1-$\mu$m diameter) second-stage lenses which have much higher optical power (NA$\geq$0.1). Each first-stage lens's diffraction-limited focused spot overfills the 1-$\mu$m aperture of a corresponding second-stage lens; and the second-stage lens focuses the illumination down to a much smaller (58-nm FWHM) focus spot on the wafer. This design approach makes it possible to use a sparsely distributed array of second-stage lens elements without incurring significant fill factor losses. The sparse distribution simplifies fabrication processes, and the wide spacing between second-stage lens apertures provides accommodation for structural support and for the SLM data paths and actuators.

The disclosed two-stage embodiments of the invention have a number of advantages over prior-art EUV lithography systems, including some or all of the following: (1) The need for EUV photomasks is eliminated. (2) By integrating the SLM with the microlens arrays, the need for image projection optics is eliminated. (3) The optical tolerance requirements for the microlenses are very moderate compared to all-reflective EUV projection optics. (4) Proximate image points are exposed sequentially—not simultaneously—so they do not interact coherently, and the printed image would thus be devoid of the kind of coherent proximity effects that are exhibited by projection systems. (5) The second-stage lens apertures function as spatial filters that eliminate stray radiation and scatter from sources such as flare in the EUV illumination optics. (6) The EUV illumination source is imaged onto the second-stage microlens apertures, not onto the wafer; so the source size and spatial energy distribution do not significantly affect optical resolution (although these factors do have a minor influence on optical efficiency). (7) In contrast to zone plate lenses, the refractive lens elements could produce very clean and highly resolved focus spots free of spurious diffraction orders and scatter, and exhibiting negligible chromatic dispersion.

The wafer exposure process is commonly referred to as "printing", and the combination of each associated first- and second-stage (or more generally, first- through N-th stage) microlenses and their associated modulator component is referred to herein as a "printer pixel". (In some alternative embodiments, the SLM need not be integrated with the microlens arrays and the focus spot intensities need not be controlled by separate modulator elements. In this case the pixels would not include the modulator components.) The pixels are assembled into arrays termed "printheads"; and the printheads are typically assembled into larger arrays, termed "wafer print modules", each of which covers and exposes a full 300-mm wafer. The complete exposure system (or "printer") typically comprises multiple wafer print modules covering separate wafers, which are all supplied EUV illumination from a single EUV source.

In a specific embodiment, each printhead comprises approximately $1.3 \times 10^7$ pixels distributed over a 20-mm square area. In addition to housing the microlenses and SLM components, each printhead can be equipped with peripheral microsensors that sense its position relative to an alignment pattern on the wafer, such as a periodic tracking pattern formed in the wafer scribe lines. Each printhead can also be provided with its own micro-positioning actuators that dynamically maintain focus, tilt, and overlay alignment in response to the position sensor feedback from a large number of microsensors. This design approach has two advantages relative to more conventional "through the lens" or "off axis" alignment sensors employed in projection lithography systems (Ref. 19, Chap. 5). First, the effect of nonsystematic errors such as noise in the tracking signals is minimized by using a large number of microsensors in the alignment tracking system. Second, by combining the printing microlenses, positioning sensors, and positioning actuators in a single, compact unit in close proximity to the wafer, tolerance stack-up in the tracking servo is minimized and very accurate and responsive tracking control can be achieved.

Thermal expansion differences between the printhead and the wafer could result in significant effective magnification errors and overlay misregistration. For example, a 0.1° C. temperature difference could induce a 5-nm overlay error (which is most of the alignment tolerance budget). Magnification errors can be substantially eliminated by forming each second-stage microlens on an individually controllable micromechanical actuator which makes nanometer-scale lateral positioning adjustments in response to the tracking sensor feedback. The microlens actuators could also be used to correct a variety of other critical error factors. (For example, the allowable tolerance range on tilt and coma in the second-stage microlenses can be more than doubled by applying a calibrated position offset to each actuator.)

The system is designed for use with a high-power (1700 W), xenon LPP source operating at a 6 kHz repetition rate (Ref. 8). The system's total data throughput requirement ($>10^{12}$ bits per sec) and the low (6 kHz) frame rate necessitate the use of a very large number of printer pixels ($>10^8$). Furthermore, an even higher number of pixels is needed if the system is designed to optimize optical efficiency. The microlens efficiency is affected by the source collimation, and efficiency would be significantly compromised if the EUV illumination's angular spread were much more than 1 mrad. Given that the source diameter is close to 200 $\mu$m (Ref. 7), this implies that the collimation optics should preferably have a minimum effective focal length of at least 200 mm (i.e., 200 $\mu$m/0.001 rad). With a focal length this large, acceptable optical efficiency can only be achieved by collecting radiation over a very large area; and hence a very large number of microlenses is used to efficiently utilize the source.

The high microlens number requirement is achieved by distributing the ETV illumination over a large number of printheads covering multiple wafers. The printer comprises a total of 360 printheads (i.e., $4.6 \times 10^9$ pixels), which are divided among eight wafer print modules, each module comprising 45 printheads distributed over a 300-mm wafer. Eight wafers are simultaneously exposed with a single LPP illumination source.

This "massively parallel" design approach is feasible because the SLM is not imaged through projection optics. Aside from considerations of LPP source compatibility, this approach has the advantage that the SLM frame rate and tracking speed, which scale in inverse proportion to the number of pixels, would be very moderate. (The micromechanical and tracking servo design requirements for a 6 kHz system would be much simpler than alternative multi-megahertz SLM systems.) The SLM power consumption and radiative heat gain are also minimized with this approach. Additionally, the large number of printheads (360) makes the data flow easier to handle. The system's total data rate for pattern generation is $2.8 \times 10^{13}$ bits per sec. This translates to $7.7 \times 10^{10}$ bits per sec per printhead (i.e., $2.8 \times 10^{13}/360$), which can be managed, for example, with several fiber optic data lines and integrated demultiplexers. The data storage and data processing hardware would make up a significant portion of the system cost, but this cost can be minimized by supplying a common data stream to all eight modules.

The EUI illumination encounters four mirror surfaces between the source and the printheads. These include a deep, aspheric condenser element, a shallow, spherical collimator element, and two sets of flat, terraced fold mirrors that partition the collimated beam into individual rectangular illumination fields on the printheads. The condenser and collimator mirrors are multilayer Mo/Be (molybdenum/beryllium) mirrors optimized for peak reflectivity at a wavelength of 11.3 nm, whereas the fold mirrors operate at glancing incidence and can therefore use a much simpler broadband reflective coating (such as a ruthenium film).

The Mo/Be mirrors have a reflectance bandwidth of 0.27-nm FWHM per mirror, about half that of Mo/Si mirrors optimized for 13.4 nm (Ref. 2). Nevertheless, the total reflected EUV power is much higher with Mo/Be mirrors because the xenon LPP source's emission spectrum has a sharp peak near 11 nm (Ref. 7). The narrow bandwidth of Mo/Be mirrors is problematic with EUV projection systems because it is difficult to accurately match spectral reflectance peaks between seven mirrors (Ref. 3). But with just two multilayer mirrors the maskless system's matching tolerance is much less critical, and it is easier to take advantage of the higher source emission at 11 nm.

The system's printing resolution is estimated at 70 nm for mixed positive- and negative-tone images. Printing throughput is estimated at 62 300-mm wafers per hour, based on an assumed resist solubility threshold of 20 mJ/cm$^2$. (The maximum attainable flood-exposure level is 80 mJ/cm$^2$.) Projection EUV system designs typically assume a more stringent exposure sensitivity of 10 mJ/cm$^2$, based on 100-nm print resolution and a 13.5-nm exposure wavelength. But the microlens system is designed for higher resolution (70-nm feature size) and operates at a shorter (11.3-nm) exposure wavelength, making the print quality more susceptible to line edge roughness induced by shot noise (Ref. 20). The higher 20-mJ/cm$^2$ exposure threshold would counterbalance the system's higher shot noise sensitivity. (If a 10-mJ/cm$^2$ exposure threshold were assumed, throughput could be doubled.)

The microlens elements can be manufactured with nanometer-scale profile control by adapting shadow-mask deposition and etching processes that are used, for example, in shadow-mask molecular beam epitaxy (MBE), Refs. 21–24. Interference lithography methods can also be used to scale up the shadow-mask processes for high-volume production. Since the refractive index of molybdenum is very close to one at EUV wavelengths, the optical surface tolerances are comparatively loose in relation to mirror optics. The estimated figure tolerances are 4 nm RMS for the first-stage (5-$\mu$m diameter) element and 2 nm RMS for the second-stage (1-$\mu$m diameter) element, assuming that a calibrated lateral position offset is applied to the second-stage elements. (By comparison, EUV projection mirrors are required to meet a 0.25-nm RMS figure tolerance across aperture dimensions exceeding 100 mm, Ref. 1.) Additionally, the microlens system is very tolerant of isolated pixel defects. For example, an isolated nonfunctional pixel (i.e., a pixel that is permanently stuck in either the ON or OFF state) would only induce an estimated 1% uncorrected dimension shift on a 70-nm feature.

A further understanding of the nature and advantages of the present invention may be realized by reference to the remaining portions of the specification and the drawings.

BRIEF DESCRIPTION OF THE DRAWINGS

FIG. 25 shows the fold mirrors, wafer print module, and wafer, from a perspective looking at the second set of fold mirrors edge-on;

FIGS. 34A and 34B illustrate a simple sequential dot row exposure pattern in which each pixel exposes a contiguous sequence of dots;

FIGS. 35A and 35B illustrate an interleaved dot exposure pattern;

FIG. 40 illustrates the image dot positional coordinates;

FIG. 41 illustrates the printer pixel positional coordinates;

FIG. 42 illustrates a scan field covered by a printhead;

FIG. 45 summarizes the lens-scan design parameters;

FIG. 50 summarizes the wafer-scan design parameters;

FIG. 51 illustrates a radial "point exposure profile" for a single, isolated image dot, and a cross-sectional "line exposure profile" of an isolated dot row;

FIG. 52 illustrates a dot pattern exposing a positive-tone disk image;

FIG. 53 illustrates a dot pattern exposing a negative-tone disk image;

DESCRIPTION OF SPECIFIC EMBODIMENTS

§1 System Overview

Following is a general overview of the system design concept, in a preferred embodiment. Later sections provide more detail on the system architecture, operational principles, methods of manufacture, and alternative embodiments.

Figure 1:
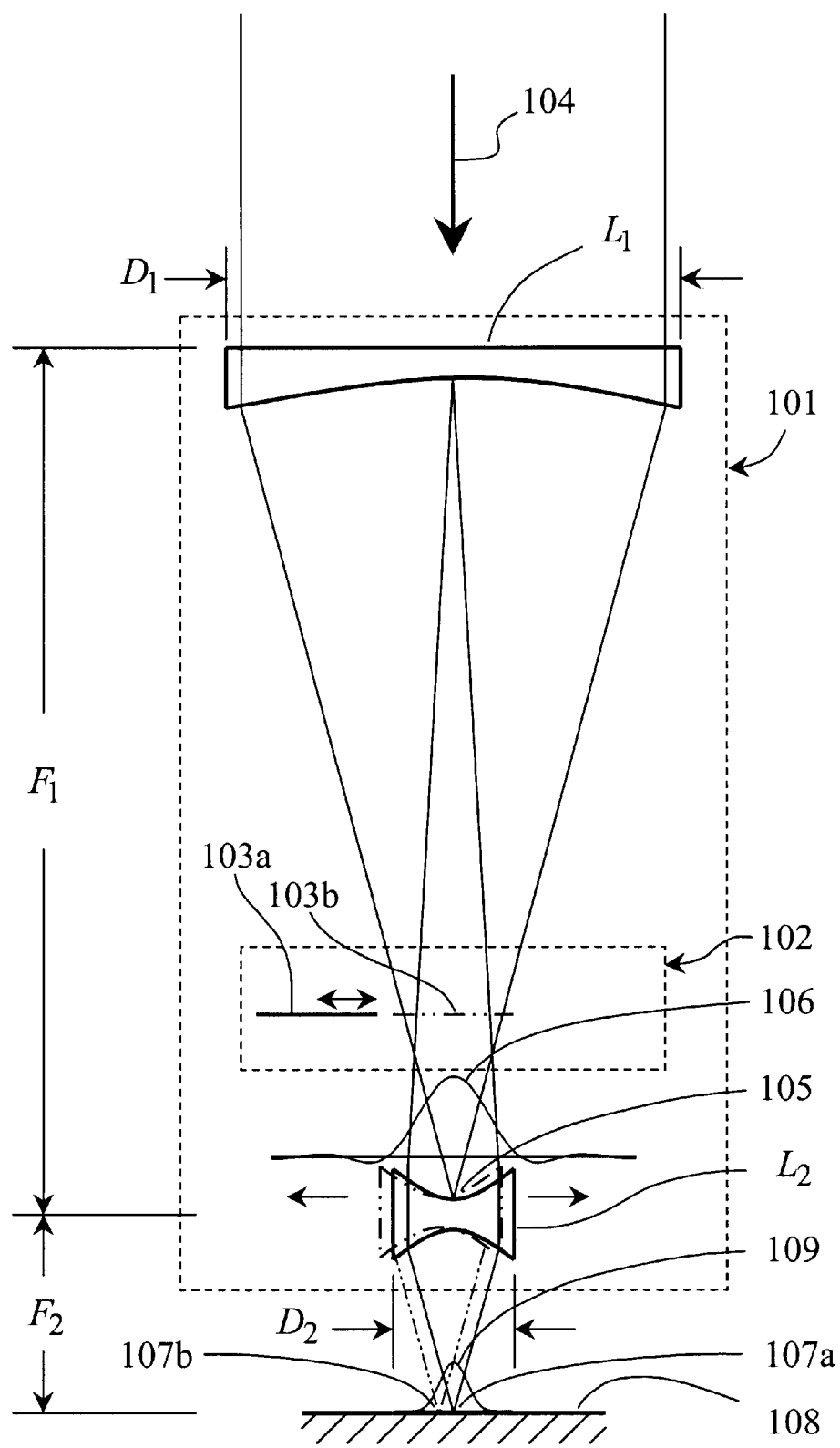
FIG. 1 is a cross-sectional schematic view of a printer pixel comprising two EUV microlenses and a modulator.

FIG. 1 is a cross-sectional, schematic illustration of a printer pixel 101. The pixel comprises a first-stage microlens $L_1$, a second-stage microlens $L_2$, and a modulator 102, which may be a digitally controlled, micromechanical shutter 103a. The lenses are preferably composed of molybdenum. Although the lenses function as focusing elements, each lens has a meniscus form (i.e., it is thinner at the center than at the edge) because the refractive index of molybdenum is less than 1 at EUV wavelengths. A collimated incident EUV beam 104 is focused by lens $L_1$ toward a point 105 at the center of lens $L_2$'s aperture, but the diffraction-limited focus spot (illustrated by the amplitude profile 106) actually overfills the lens aperture. (In this design the illumination source's geometric image at point 105 is much smaller than the diffraction-limited spot size; although the geometric image could dominate the diffraction limit in alternative embodiments.) Lens $L_2$ further condenses the beam onto a point 107a on the surface of a wafer 108. The diffraction-limited, wafer-plane focused amplitude distribution is illustrated as profile 109. The respective clear aperture diameters $D_1$ and $D_2$, and nominal focal lengths $F_1$ and $F_2$ of lenses $L_1$ and $L_2$ are $D_1=5$ $\mu$m, $D_2=1$ $\mu$m, $F_1=171$ $\mu$m, and $F_2=3.25$ $\mu$m. (More detail on the lens design is provided in §2.)

The "focusing" action of the microlenses is more analogous to that of a condenser lens than of an imaging lens, in that each microlens functions to condense incident illuminating radiation onto a target illumination spot. Unlike conventional imaging systems, the microlenses do not necessarily have well-defined focal planes, or if they do, they need not operate at exactly their design focal lengths. For example, the wafer plane is positioned slightly above lens $L_2$'s design focal plane in the present design because the diffraction-limited focus is not actually optimum at the design focal plane (as defined by geometric optics). Furthermore, lens $L_1$ is not operated at its best (diffraction-limited) focus position because this would (according to optical simulations) significantly increase sensitivity to lens aberrations. (Tolerance issues are addressed in §11.)

The shutter 103a is shown in its open position in FIG. 1. In an alternative position 103b it blocks the radiation, switching off the pixel. The shutter is preferably located proximate to lens $L_2$ in order to minimize its positional travel range. The travel range could, in principle, be reduced by an order of magnitude by positioning the shutter very close to the wafer, but in this design it is positioned above $L_2$ so that it does not affect the working distance between the printhead and the wafer. (Alternative modulator mechanisms are discussed in §4.)

Lens $L_2$ is preferably provided with a micromechanical actuator for fine-adjusting its lateral position. As illustrated in FIG. 1, focus point 107a on the wafer can be moved to proximate point 107b by moving the lens. The lens actuation mechanism is used to make nanometer-scale adjustments to maintain overlay alignment, and can also be used to counterbalance critical tolerance factors such as thermally induced magnification errors and asymmetry in lens $L_2$'s surface form.

Figure 2:
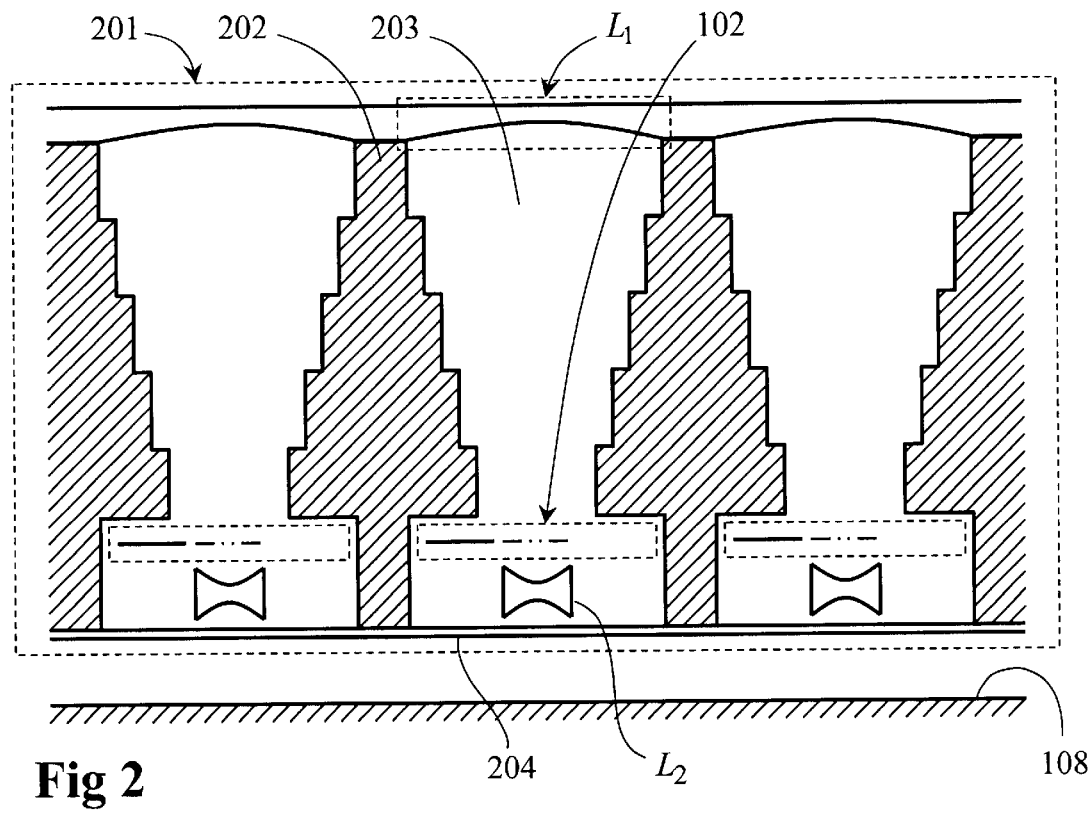
FIG. 2 is a cross-sectional schematic view of a printhead comprising multiple pixels.

The printer pixels are assembled into an array forming a printhead. FIG. 2 schematically illustrates a portion of a printhead 201 in cross-section. A silicon plate 202 supports the first-stage microlenses (such as lens $L_1$) on its top side and the modulators (such as modulator 102) and second-stage microlenses (such as lens $L_2$) on its bottom side. Tapered or terraced holes, such as hole 203, are etched through plate 202 to accommodate the converging EUV beam paths. The spaces between second-stage lens apertures provide accommodation for structural support and for the modulators' and second-stage microlenses' associated positional actuators and data paths (not shown).

The printhead optics could potentially be degraded by hydrocarbon outgassing from the wafer (Ref 25). This is particularly a concern for the second-stage lenses due to their close proximity to the wafer. Corrosion-resistant optical coatings may be used to mitigate degradation, but a more practical alternative may be to cover the bottom of each printhead with an EUV-transparent pellicle 204, such as a diamond membrane or a beryllium layer with a corrosion-resistant coating, which can be periodically cleaned or replaced. (The printheads could also function as vapor barriers to prevent hydrocarbon deterioration of the EUV illumination mirrors.) In contrast to pellicles used for projection lithography masks, the printhead pellicles need not be self-supporting over a large aperture area, and can hence be very thin and highly transmitting. For the present design, a pellicle transmission efficiency $\eta_{pellicle}$ of 0.95 is assumed, $$\eta_{pellicle} = 0.95 \quad \text{Eq. 1.1}$$

For example, a diamond film of thickness 7 nm, or a beryllium film of thickness 45 nm, would have 95% transmittance at an operating wavelength of 11.3 nm. A practical pellicle material could be beryllium with a protective coating similar to coatings used for EUV mirrors (Ref 26).

Figure 3:
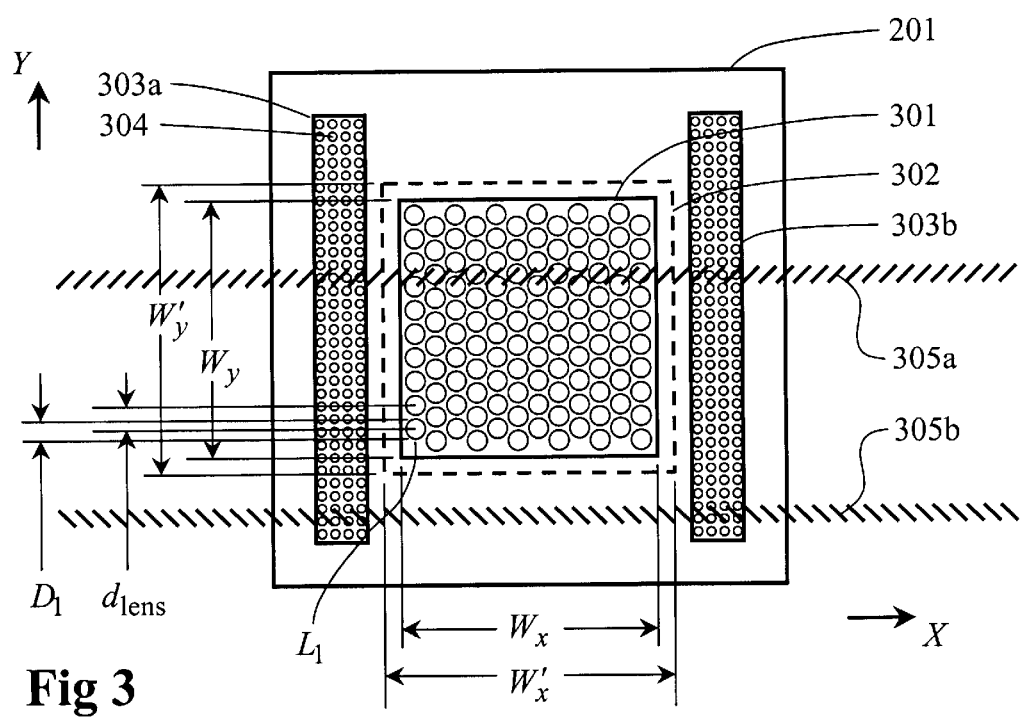
FIG. 3 is a plan view of a printhead comprising a printer pixel array and two position sensor arrays.

FIG. 3 is a plan view of printhead 201. The first-stage microlenses (e.g., lens $L_1$) are distributed in a triangular centering pattern across a square printhead aperture 301. The lens apertures are preferably circular for two reasons: First, for a given lens aperture area and focal length, the circular shape maximizes lens transmittance efficiency. Second, the circular symmetry minimizes the number of degrees of freedom that need to be controlled in the manufacturing process. Given that the apertures are circular, the triangular array layout illustrated in FIG. 3 is preferred because this optimizes the lens fill factor.

The center spacing $d_{lens}$ between adjacent lens centers (FIG. 3) is approximately 6 $\mu$m, $$d_{lens} \cong 6\ \mu m \quad \text{Eq. 1.2}$$

(This value is chosen to provide a 1-$\mu$m clearance between lens apertures.) The lens fill factor $\eta_{FF}$ (defined as the fraction of the area of aperture 301 covered by the first-stage lens apertures) is approximately $$\eta_{FF} = \left(\frac{\pi}{4}D_1^2\right) \bigg/ \left(\frac{\sqrt{3}}{2}d_{lens}^2\right) \cong \left(\frac{\pi}{4}(5\ \mu m)^2\right) \bigg/ \left(\frac{\sqrt{3}}{2}(6\ \mu m)^2\right) = 0.630 \quad \text{Eq. 1.3}$$

The dimensions $W_x$ and $W_y$ of aperture 301 in the respective X and Y directions are both 20 mm, $$W_x = 20\ \text{mm} \quad \text{Eq. 1.4}$$

$$W_y = 20\ \text{mm} \quad \text{Eq. 1.5}$$

The number of pixels per printhead, $N_{pixel/head}$, is approximately $$N_{pixel/head} \cong W_xW_y \bigg/ \left(\frac{\sqrt{3}}{2}d_{lens}^2\right) \cong (20\ \text{mm})^2 \bigg/ \left(\frac{\sqrt{3}}{2}(6\ \mu m)^2\right) = 1.283 \times 10^7 \quad \text{Eq. 1.6}$$

The total number of pixels per printer system, $N_{pixel}$, is equal the number per printhead ($N_{pixel/head}$) multiplied by the number of printheads per wafer print module (45), and the number of modules per system (8)

$$N_{pixel} = N_{pixel/head} \times 45 \times 8 \cong 4.62 \times 10^9 \quad \text{Eq. 1.7}$$

The EUV illumination covers a square illumination field 302 having dimensions $W'_x$ and $W'_y$ of 22 mm in the respective X and Y directions and overfilling aperture 301, $$W'_x = 22\ \text{mm} \quad \text{Eq. 1.8}$$

$$W'_y = 22\ \text{mm} \quad \text{Eq. 1.9}$$

Thus the printheads have an aperture collection efficiency $\eta_{head\ ap}$ of $$\eta_{head\ ap} = \frac{W_xW_y}{W'_xW'_y} = \left(\frac{20\ \text{mm}}{22\ \text{mm}}\right)^2 = 0.826 \quad \text{Eq. 1.10}$$

Two position sensor arrays 303a and 303b comprising position sensors (such as sensor element 304) border illumination field 302. The sensor elements could, for example, be confocal-imaging microlens arrays (Ref. 13) operating at a visible wavelength (e.g., 633 nm), or capacitance sensors, or a combination of such elements. The sensor arrays would detect focus height (e.g., by means of the confocal elements' depth response). Also, they would detect lateral alignment (X-Y position, rotation, and magnification) by sensing the printhead's lateral position relative to an alignment pattern such as a periodic tracking patterns 305a and 305b formed in the wafer scribe lines. (Tracking system options are discussed in §5.)

Figure 4:
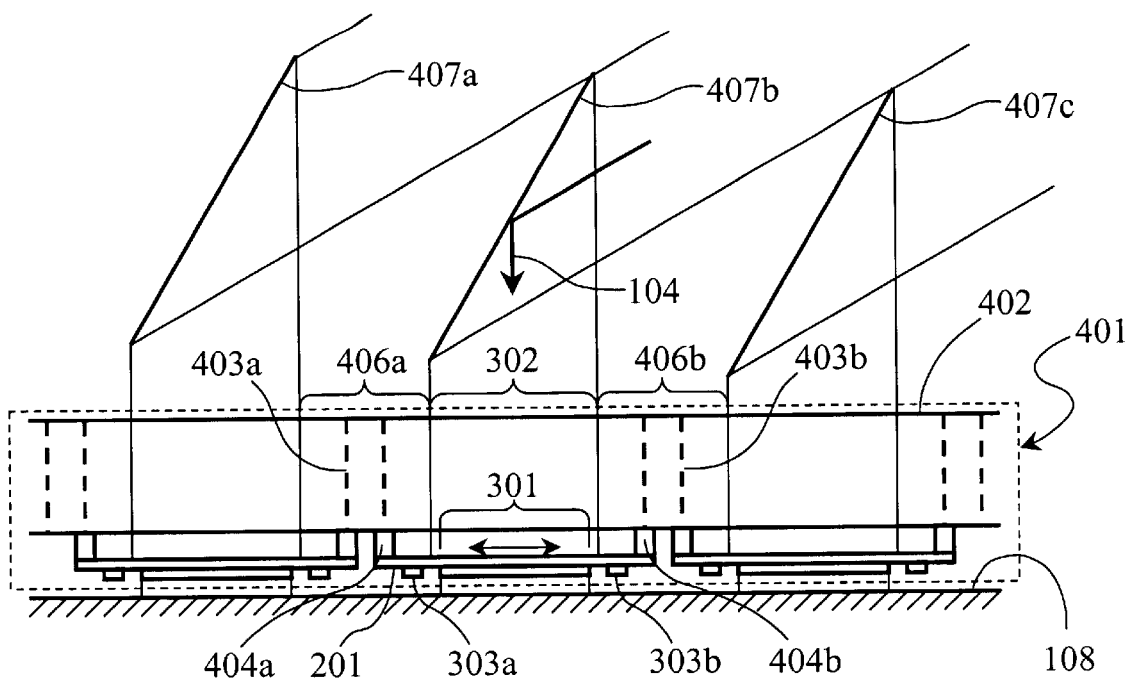
FIG. 4 is a cross-sectional schematic view of a wafer print module comprising multiple printheads.
Figure 5:
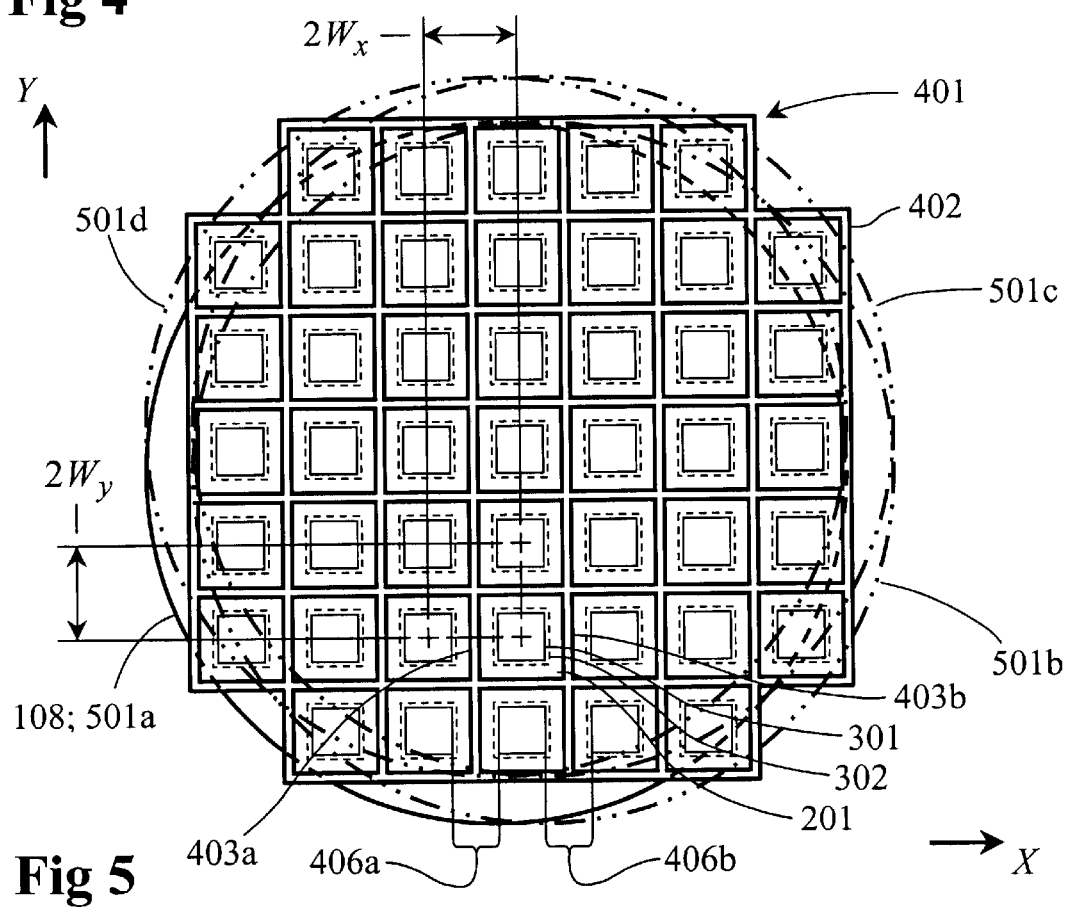
FIG. 5 is a plan view of a wafer print module and wafer.

Multiple printheads are assembled into an array forming a wafer print module, which covers a 300-mm wafer. FIG. 4 schematically illustrates a portion of a wafer print module 401 in cross-section, and FIG. 5 is a plan view of module 401. Multiple printheads are attached to a structural framework 402 comprising a network of joist elements. For example, printhead 201 is supported by joists 403a and 403b (FIGS. 4, 5). The center spacing between the printheads is $2W_x$ in the X direction and $2W_y$ in the Y direction. Micropositioning actuators 404a and 404b between printhead 201 and joists 403a and 403b raster-scan the printhead across the wafer during exposure. The scan range is approximately 250 $\mu$m. (The optics may be sealed off from wafer-generated hydrocarbon contaminants by means of bellows couplings or flexible seals between the printheads and their supporting joists.) Actuators 404a and 404b are controlled by position sensor feedback from sensor arrays 303a and 303b. In addition to performing the scanning function, the actuators control alignment, fine focus and tilt. Also, the second-stage lens actuators are used in conjunction with printhead actuators 404a and 404b to make fine adjustments in the focus spot positions (e.g., to correct magnification errors due to thermal expansion differences between the wafer and printhead).

As the printhead scans the wafer, each printer pixel follows a serpentine raster scan path and is modulated in synchronization with the pulsed LPP source to expose a rectangular array of image points. The scan paths of proximate pixels are interleaved so that isolated pixel defects have minimal influence on the printed image. The wafer 108 is exposed with four sequential raster scans. It is first scanned at position 501a (FIG. 5). The wafer is then stepped by a distance $W_x$ in the X direction to position 501b where it is scanned a second time; it is stepped by a distance $W_y$ to position 501c and scanned a third time; and is then stepped by a distance $W_x$ in the negative X direction to position 501d and is scanned a fourth time. At each scan position, the wafer remains stationary while the printheads raster-scan the wafer.

The scanning method outlined above is termed a "lens-scan" technique. In an alternative "wafer-scan" method, the wafer moves during exposure while the printheads remain substantially stationary, except for slight positional corrections to maintain focus and alignment. (Scan methods are discussed in detail in §8.)

As mentioned above, for efficiency it is preferred that the system use EUV illumination that is collimated and of uniform irradiance, and which is efficiently partitioned among the illumination fields. A system of terraced fold mirrors is used to partition a large-aperture, collimated EUV beam into square illumination fields covering individual printhead apertures. For example, FIG. 4 illustrates a fold mirror 407b that directs EUV illumination 104 onto illumination field 302 covering printhead aperture 301. Adjacent fold mirrors 407a and 407c are positionally displaced from mirror 407b so that shadow zones 406a and 406b are not illuminated. Two such sets of fold mirrors operate in conjunction to subdivide the beam into a two-dimensional array of square illumination fields.

Figure 6:
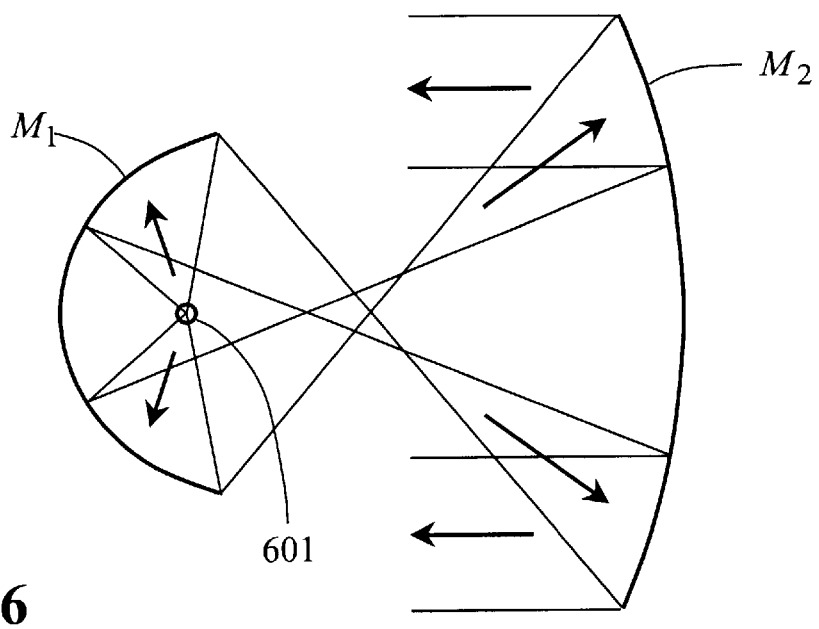
FIG. 6 is a cross-sectional view of the EUV collection optics' condenser and collimator mirrors.

As illustrated in FIG. 6, the collimated beam is generated from a xenon LPP source 601 by two mirrors M1 and M2. Mirror M1 is a deep, aspheric, condenser element, and mirror M2 is a much larger but shallower, spherical collimator element. Two beam-shaping mirrors are provided to simultaneously satisfy the collimation and uniformity requirements. (The mirrors' reflectivity variation with incidence angle could affect beam uniformity, but the mirror geometry is designed to counterbalance this effect. Also, the design compensates for nonuniformity of the source's angular emission profile.) The collimated output from mirror M2 is distributed among eight wafer print modules and the system exposes eight 300-mm wafers in parallel.

§2 Microlens Design

Figure 7:
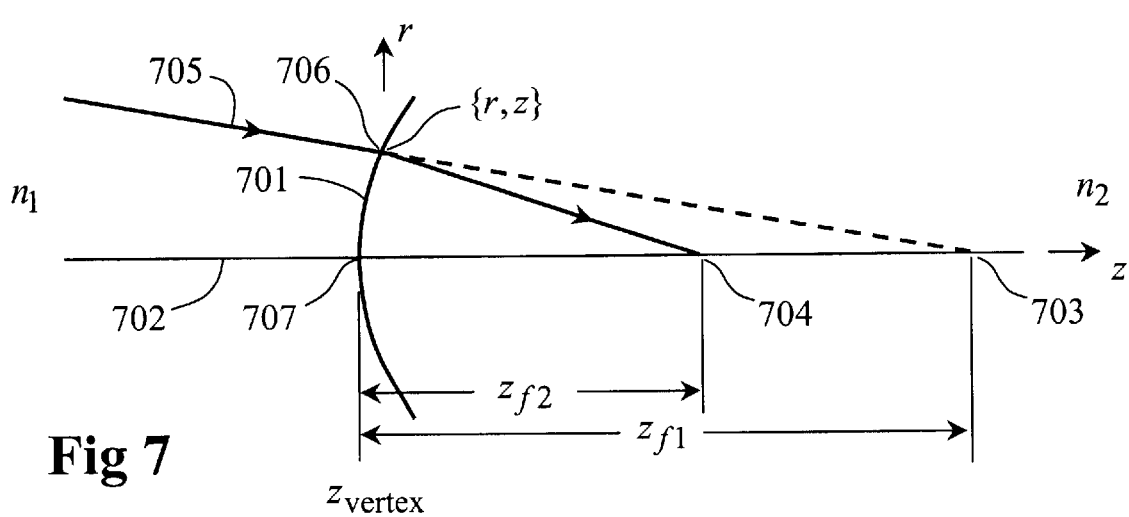
FIG. 7 illustrates the optical geometry of a "refractive conjugate surface"

Each microlens surface is designed as a "refractive conjugate surface" (RCS), whose geometry is defined relative to cylindrical coordinates {r,z} as illustrated in FIG. 7. An RCS 701 has axial symmetry about a z axis 702, and is designed to image a first axial conjugate point 703 onto a second axial conjugate point 704. For example, an incident ray 705, initially directed toward point 703, intercepts surface point 706 and is refracted toward point 704. The respective axial displacements of points 703 and 704 from the surface vertex point 707 (at $z=z_{vertex}$) are denoted $z_{f1}$ and $z_{f2}$ ((In general, $z_{f1}$ and $z_{f2}$ can be positive, negative, or infinity.) If the z origin is at the surface vertex (i.e., $z_{vertex}=0$), then the {r,z} coordinates at any surface point 706 are related by the equation $$n_1 \frac{2z - c_{f1}(r^2 + z^2)}{1 + \sqrt{1 - 2c_{f1}z + c_{f1}^2(r^2 + z^2)}} = \quad \text{Eq. 2.1}$$

$$n_2 \frac{2z - c_{f2}(r^2 + z^2)}{1 + \sqrt{1 - 2c_{f2}z + c_{f2}^2(r^2 + z^2)}}$$

wherein $c_{f1}$ and $c_{f2}$ are the respective incident and refracted field curvatures at vertex 707, $$c_{f1} = \frac{1}{z_{f1}} \quad \text{Eq. 2.2}$$

$$c_{f2} = \frac{1}{z_{f2}} \quad \text{Eq. 2.3}$$

and $n_1$ and $n_2$ are the refractive indices on the incidence and transmitted sides of surface 701. (For weakly-absorbing media such as molybdenum $n_1$ and $n_2$ are the real parts of the complex refractive indices.) An approximate paraxial representation of the surface form is $$z \cong \frac{1}{2}c_S r^2 + \frac{1}{8}c_S^3(1 + k_S)r^4 \quad \text{Eq. 2.4}$$

wherein $c_S$ is the surface curvature and $k_S$ is the surface's conic constant, $$c_S = \frac{n_2 c_{f2} - n_1 c_{f1}}{n_2 - n_1} \quad \text{Eq. 2.5}$$

$$k_S = \frac{n_1 n_2 (c_{f2} - c_{f1})^2 (n_2 c_{f1} - n_1 c_{f2})}{(n_2 c_{f2} - n_1 c_{f1})^3} \quad \text{Eq. 2.6}$$

(If $z_{vertex} \neq 0$, the substitution $z \leftarrow z - z_{vertex}$ should be made in Eqs. 2.1 and 2.4.)

Figure 8:
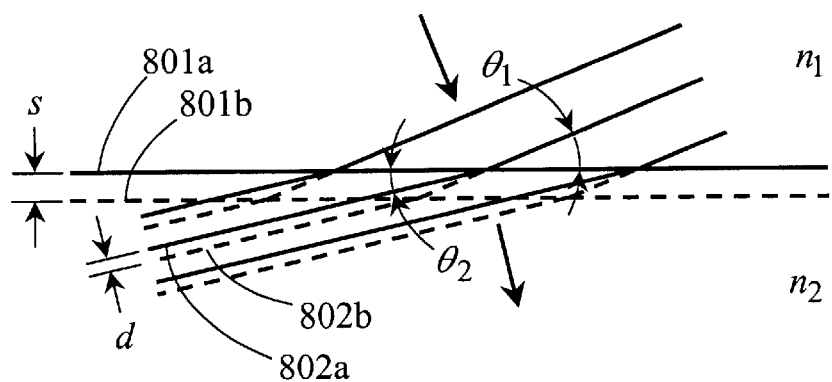
FIG. 8 illustrates the relationship between optical surface positioning error and resulting optical phase error.

The microlens design is determined not only by imaging requirements, but also by surface tolerance considerations. FIG. 8 illustrates the relationship between positional error of a refracting surface 801a and the resultant optical phase error of a transmitted electromagnetic wave 802a. If surface 801a is translationally displaced by an incremental distance s to position 801b, the plane wave 802a will be positionally shifted by a corresponding distance d to position 802b. The corresponding phase shift $\phi$ in the transmitted field is $$\phi = 2\pi \frac{s}{\lambda}(n_2 \cos\theta_2 - n_1 \cos\theta_1) \quad \text{Eq. 2.7}$$

wherein $\lambda$ is the wavelength (in vacuum), $n_1$ and $n_2$ are the refractive indices on the respective incidence and transmitted sides of surface 801a, $\theta_1$ is the incident angle, and $\theta_2$ is the refracted angle. The right-hand term in the above expression defines a "surface tolerance factor" (stf), $$\text{stf} = n_2 \cos\theta_2 - n_1 \cos\theta_1 \quad \text{Eq. 2.8}$$

which should be minimized in the lens design. For a refractive conjugate surface, the stf at point {r,z} (i.e., point 706 in FIG. 7) can be represented by the following paraxial approximation, $$\text{stf} \cong (n_2 - n_1)\left(1 + \frac{1}{2}\theta_1 \theta_2\right) \cong \quad \text{Eq. 2.9}$$

$$(n_2 - n_1)\left(1 + \frac{1}{2}r^2(c_S - c_{f1})(c_S - c_{f2})\right)$$

Generally, the stf distribution across a lens aperture takes on its worst-case value at the aperture edge, where the incident and refracted angles $\theta_1$ and $\theta_2$ are maximized.

The design operating wavelength $\lambda$ and complex refractive index $\tilde{n}_{Mo}$ for the molybdenum lenses $L_1$ and $L_2$ are $$\lambda = 11.3 \text{ nm} \quad \text{Eq. 2.10}$$

$$\tilde{n}_{Mo} = n_{Mo} - ik_{Mo};$$

$n_{Mo}=0.9516,$  Eq 2.11

$k_{Mo}=0.00464$

Figure 9:
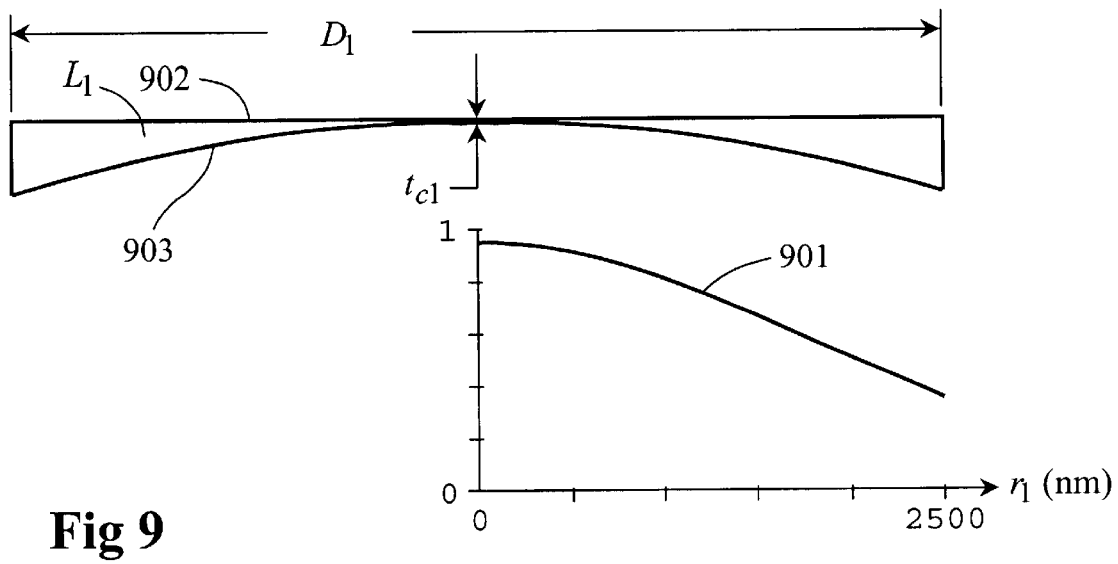
FIG. 9 is a cross-sectional view of a first-stage EUV microlens.

FIG. 9 shows a cross-section of lens $L_1$. The graph 901 illustrates the transmitted electric field's amplitude profile versus aperture radius position $r_1$, assuming a unit-amplitude incident beam. (The transmitted field intensity is proportional to the amplitude squared.) The lens's clear aperture diameter $D_1$ is 5 μm, and its center thickness $t_{c1}$ is 20 nm. The top surface 902 is planar, and the bottom surface 903 is designed to focus a collimated incident beam to a point 171 μm (the nominal focal length, $F_1$) below the top surface. (Depending on the manufacturing method, it may be more practical to make the bottom surface planar and the top surface curved; or both surfaces could be curved.)

Figure 10:
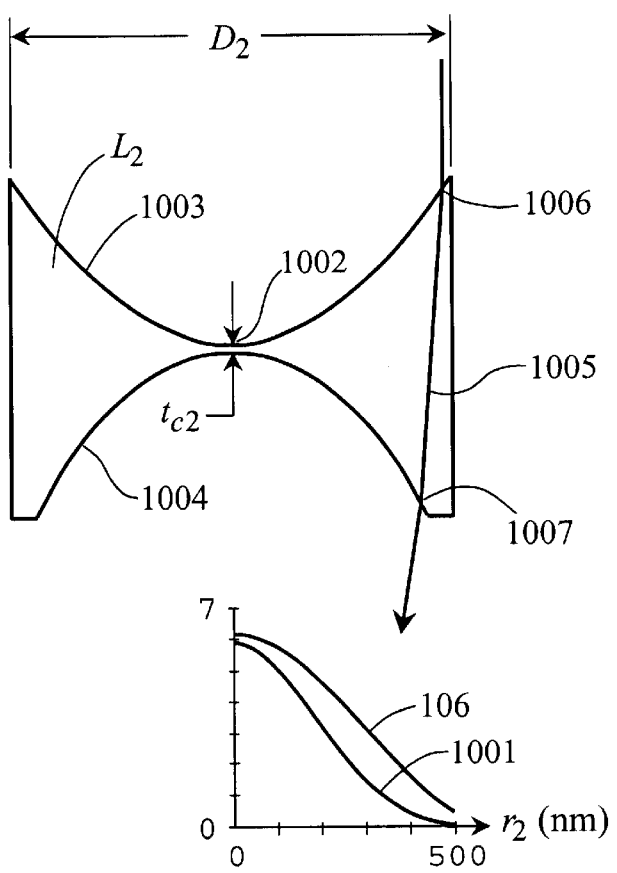
FIG. 10 is a cross-sectional view of a second-stage EUV microlens.

FIG. 10 shows a cross-section of lens $L_2$, and also illustrates its incident field amplitude profile 106 (cf. FIG. 1) and transmitted field amplitude profile 1001 versus aperture radius position $r_2$. Lens $L_2$'s top surface vertex 1002 is located at a distance of 171 μm (the nominal focal length $F_1$) below lens $L_1$, and profile 106 represents the diffraction-limited focus spot produced by lens $L_1$. Lens $L_2$'s clear aperture diameter $D_2$ is 1 μm and its center thickness $t_{c2}$ is 20 nm. The top surface 1003 is designed to image the center of lens $L_1$ to an intermediate conjugate point (not shown) 6.31 μm below vertex 1002, and the bottom surface 1004 images this intermediate conjugate onto a focal plane 3.25 μm (the nominal focal length $F_2$) below vertex 1002. This design prescription balances the optical power between surfaces 1003 and 1004 so that the stf (Eq. 2.8) of geometric edge ray 1005 is the same at points 1006 and 1007 where the ray intercepts the surfaces (i.e., the refraction angles at the two surfaces are matched). Thus, lens $L_2$'s worst-case stf is minimized.

(Actually, the definition of "worst case" may be over-conservative in this design because the transmittance of edge ray 1005 is essentially zero, as evidenced by transmission profile 1001.)

Figures 11, 12, 13:
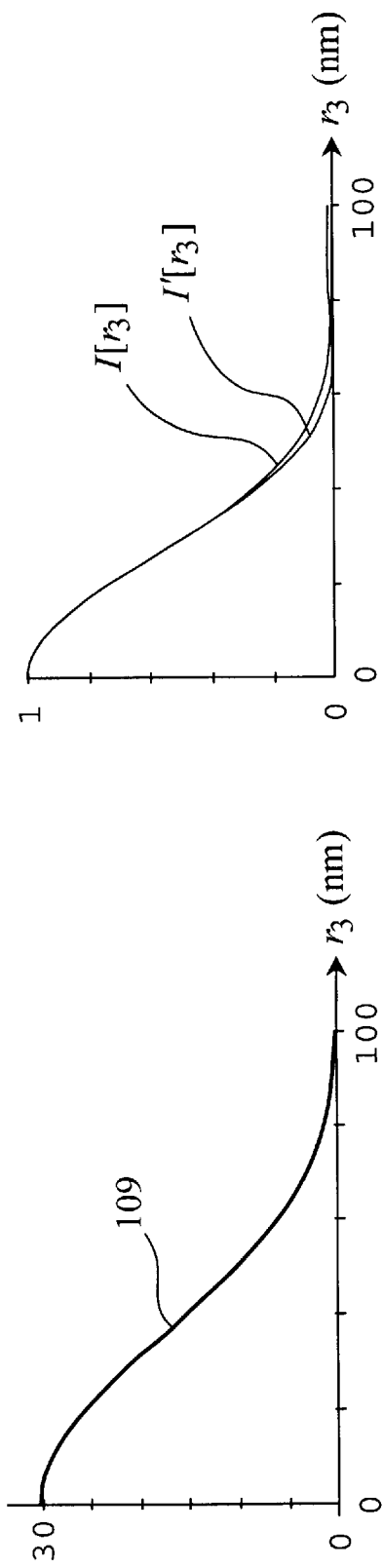
FIG. 11 is a wafer-plane amplitude profile plot for the focused beam produced by a second-stage EUV microlens.
FIG. 12 is a wafer-plane, peak-normalized intensity plot for the focused beam produced by a second-stage EUV microlens, in comparison to that of an ideal, unapodized, circular-aperture lens.
FIG. 13 is a tabular summary of the lens design parameters.

FIG. 11 illustrates the focused beam's amplitude profile 109 at the wafer plane versus the beam radius position $r_3$ (cf. FIG. 1). This represents the diffraction-limited focus spot produced by lens $L_2$. FIG. 12 shows the peak-normalized intensity profile $I[r_3]$ (which is proportional to the amplitude squared). This profile can be closely approximated as a Gaussian, $$I[r_3] \approx \exp[-(r_3/34.5 \text{ nm})^2]$$  Eq 2.12

For comparison, FIG. 12 also shows a classical Airy-disk profile $I'[r_3]$ that would be produced by an ideal, unapodized, circular-aperture lens of numerical aperture NA=0.1. The functional form of this profile is $$I'[r_3] = \left( \frac{J_1[2\pi NA \, r_3/\lambda]}{\pi NA \, r_3/\lambda} \right)^2$$  Eq. 2.13 wherein $J_1$ is a Bessel function.

The lens design parameters are selected to balance a three-way tradeoff between optical resolution, efficiency, and practicality. Circular lens apertures are preferred because the circular shape maximizes EUV transmittance for a given aperture area and focal length, and the circular symmetry minimizes the number of degrees of freedom that need to be controlled in the manufacturing process. The aperture diameters $D_1$=5 μm and $D_2$=1 μm are selected as an estimated best compromise between optical efficiency and manufacturability. (For a specified optical resolution, smaller lenses would have less absorption loss because the edge thickness would be reduced, but they would also be more difficult to manufacture.) Given the diameter specification, the lenses' remaining design parameters are constrained to maintain a specified focus spot resolution at the wafer plane, and are optimized (subject to the resolution constraint) to maximize optical throughput. The resolution requirement is specified in terms of an "effective numerical aperture" parameter, as described below.

A lithography system's printing resolution (RES) can be roughly estimated by the equation $$RES = k_1 \lambda / NA$$  Eq. 2.14 wherein λ is the exposure wavelength, NA is the illumination numerical aperture at the wafer, and $k_1$ is a process-dependent constant that is typically close to 0.6. The geometric numerical aperture $NA_{geo}$ of lens $L_2$, as determined by a geometric raytrace of edge ray 1005 (FIG. 10), is $NA_{geo}$=0.156. This value actually has little relevance to the lens's resolution performance because the lens is essentially opaque near its periphery. (In practice, the lens need not even be provided with an aperture stop.) However, an "effective numerical aperture" $NA_{eff}$ can be defined to provide a common basis of comparison with projection lithography systems. $NA_{eff}$ is defined as the numerical aperture of an ideal, unapodized lens that would provide imaging resolution comparable to that of lens $L_2$, as defined by a criterion such as the focus spot's full-width-at-half-maximum (FWHM). As illustrated in FIG. 12, lens $L_2$'s focused intensity profile $I[r_3]$ closely matches a classical Airy-disk profile $I'[r_3]$ corresponding to a 0.1-NA lens, so the system's effective numerical aperture is $NA_{eff}$=0.1.

The effective numerical aperture can be used in the above resolution equation (Eq. 2.14) to roughly compare the microlens system to projection lithography systems. But this comparison is limited because unlike projection systems, the microlens system exposes proximate image points sequentially—not simultaneously—and the points therefore do not interact coherently. The printed image would thus be devoid of coherent proximity effects that are characteristic of projection lithography systems.

The combined transmission efficiency of lenses $L_1$ and $L_2$ (i.e., ratio of the wafer-plane energy to the incident energy intercepted by lens $L_1$'s clear aperture, neglecting any pellicle or modulator transmission losses) is 17.5%. This value is based on a diffraction simulation (with the conventional approximations of Fresnel-Kirchoff diffraction theory), assuming that an ideal monochromatic, collimated beam is incident on lens $L_1$. However, the incident beam produced by the EUV illumination system actually has a finite spectral bandwidth of approximately 0.3 nm and an angular divergence full angle of approximately 1 mrad. The bandwidth is insignificant, but the source divergence causes some spreading of the diffraction-limited source image on lens $L_2$'s aperture, resulting in some energy loss through $L_2$. Assuming (conservatively) that the plasma source can be modeled as a spherical, Lambertian (i.e., uniform-radiance) emitter subtending 1 mrad at the microlens $L_1$ aperture plane, an efficiency attenuation factor of 0.963 is required to account for the source size. Thus the actual lens efficiency $t_{lens}$ is $$\eta_{lens} = 0.175 \times 0.963 = 0.169$$  Eq. 2.15

If the source divergence were significantly greater than 1 mrad the attenuation factor would be much lower; for example, at 2 mrad it would be reduced from 0.963 to 0.880. (But although the source size affects efficiency, it does not limit imaging resolution because the source is not imaged onto the wafer.)

FIG. 13 is a tabular summary of the lens design parameters. The surfaces are numbered in order of traversal by the EUV beam, and the "surface" column also indicates the surface reference numbers in FIGS. 1, 9, and 10. The "media" column indicates the optical media above and below each surface (e.g., "Vac/Mo" means vacuum above and molybdenum below). The "diameter" column indicates the aperture stop diameters. (As noted above, lens $L_2$ does not actually require an aperture stop.) The "$z_{vertex}$" column indicates each surface vertex's position along the optical axis, as measured from the first surface, and the "$z_{f1}$" and "$z_{f2}$" columns indicate the positions of each surface's conjugate points relative to the surface vertex (cf. FIG. 7).

Estimated surface form tolerances are 4 nm RMS for $L_1$ and 2 nm RMS for $L_2$. In addition, if a calibrated lateral position offset is not applied to $L_2$, the odd-symmetric component of $L_2$'s surface error (i.e., tilt and coma) would need to be limited to approximately 0.75 nm RMS. (Design tolerance issues are discussed in §11.)

The above design is not very well optimized for focus because the diffraction-limited focus of a finite-conjugate lens is not actually optimum at the nominal focal plane (as defined by geometric optics). For example, system efficiency could (according to simulations) be improved somewhat by moving $L_2$ slightly closer to $L_1$. This would improve optical efficiency, but it would also increase image sensitivity to lens aberrations, so $L_1$'s operating focal plane is kept at its design position in the current design. However, $L_2$ should operate at optimum focus because its focus range must include positioning tolerances and the wafer flatness tolerance. Therefore the operating wafer plane would be shifted slightly (by −134 μm) from its design position, as indicated by the footnote in FIG. 13. (This shift is based on simulated printing performance, which is discussed in §10.) Other design improvements can also be made. For example, the RCS design geometry (as defined by FIG. 7) could be varied to optimize optical performance. The above design is based on optimization of the point spread function ($I[r_3]$, FIG. 12), using approximations of Fresnel-Kirchoff diffraction theory; whereas a more refined design would be based on simulated printing performance, using more accurate electromagnetic simulations. Also, the design procedure should take into account the image sensitivity to lens aberrations and should properly balance any tradeoffs between optical efficiency and aberration sensitivity.

Figure 14A:
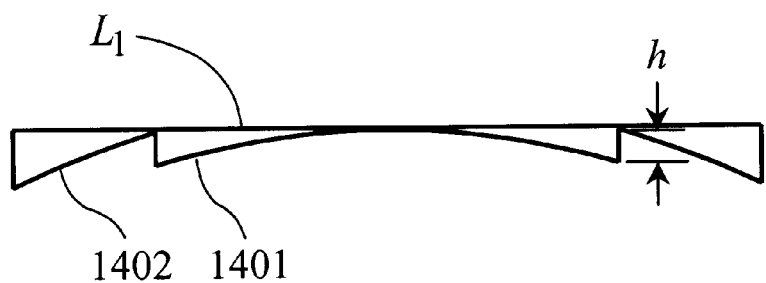
FIGS. 14A and 14B illustrate an alternative phase Fresnel lens design for the first-stage microlens.
Figure 14B:
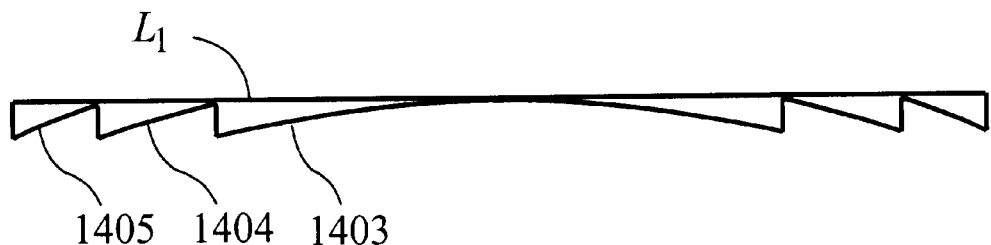

The above design configuration represents just one of a variety of possible design approaches. One alternative would be to design lens $L_1$ as a phase Fresnel lens (Ref. 27) in order to minimize the lens thickness and absorption losses. (Fresnel zone plate lenses, such as those described in Refs. 16–18, could possibly also be used, but phase Fresnel lenses would have better optical efficiency.) FIGS. 14A and 14B illustrate cross-sections of two such designs, a two-facet design comprising facets 1401 and 1402 (FIG. 14A), and a three-facet design comprising facets 1403, 1404, and 1405 (FIG. 14B). The facets on each surface can be designed as refractive conjugate surfaces with common conjugate points, and the step height h between adjacent facets is selected so that the transmitted field's phase discontinuity across each step is $2\pi$ at the design wavelength. (For a design wavelength of 11.3 nm, the step height on a molybdenum lens would be approximately 233 nm.) These designs could make it possible to use large (e.g., >10 μm diameter) or higher power (NA>0.02) first-stage lenses without incurring unacceptable absorption losses. (However, as the lens size or power are increased the resolution-limiting effects of the source size and spectral bandwidth become more significant, so even without absorption losses there would still be a practical limit on the maximum lens size or optical power.)

Figure 15:
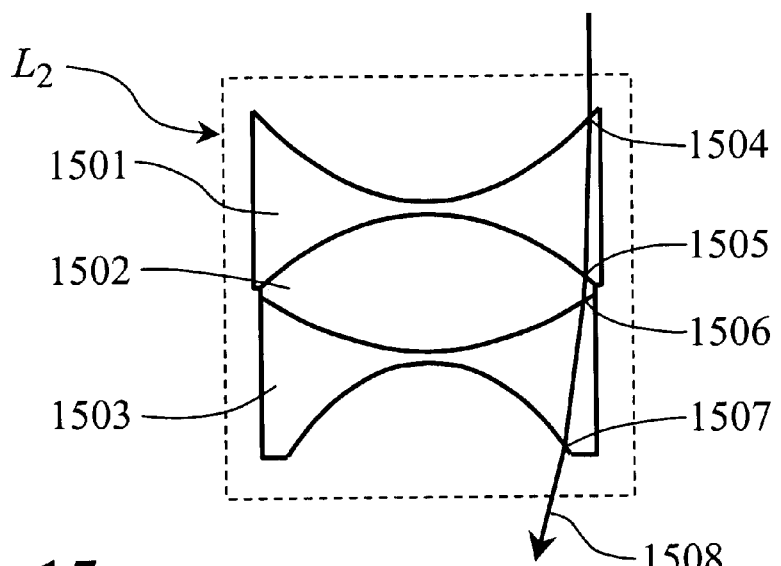
FIG. 15 illustrates an alternative triplet design for the second-stage microlens.

Phase Fresnel lenses would be less practical for the second-stage lens $L_2$ due to its small size, but $L_2$ could possibly be constructed by combining a number of comparatively low-power elements to form a composite high-power lens. An $L_2$ design of this type is illustrated in FIG. 15. The lens is a triplet comprising a molybdenum top element 1501, a beryllium middle element 1502, and a molybdenum bottom element 1503. (A method for manufacturing this type of lens is discussed in §3.) In contrast to molybdenum, the real part of beryllium's complex refractive index is greater than 1 at 11.3 nm, so a convex beryllium lens will exhibit positive optical power. (The middle element could alternatively be a vacuum space.) The triplet's optical power should preferably be balanced between the three elements so that the stf (Eq. 2.8) is matched at the four points 1504, 1505, 1506, and 1507 where geometric edge ray 1508 intercepts the four surfaces.

Figure 16:
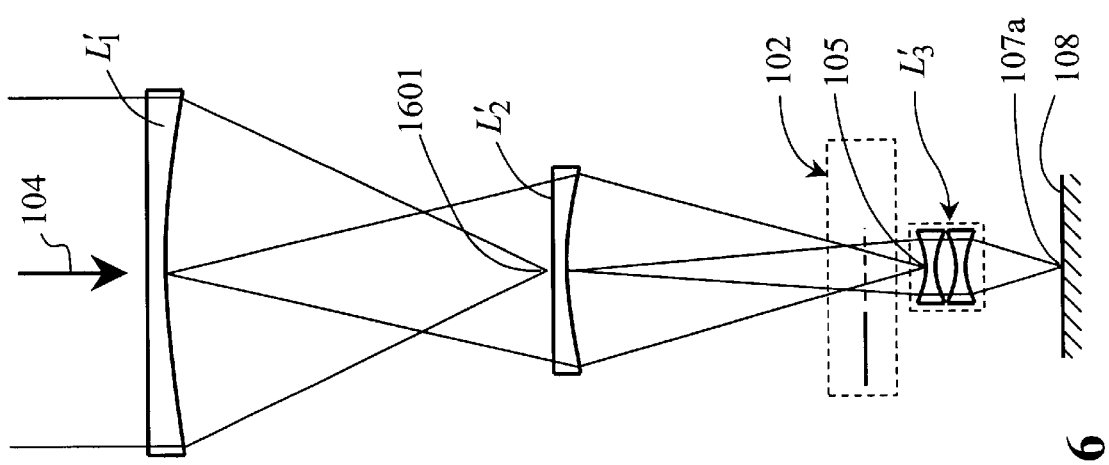
FIG. 16 illustrates an alternative pixel configuration comprising three microlenses.

Higher optical resolution could be achieved by using more steeply curved optical surfaces or more elements in the second-stage lens, although the resulting resolution improvement would come at the expense of reduced optical efficiency. Acceptable efficiency could be regained by using smaller optical components, but extreme miniaturization of the optics could result in an unmanufacturable design. On the other hand, it may be possible to circumvent this difficulty by adding additional microlens stages. For example, FIG. 16 illustrates a three-stage pixel configuration comprising a first-stage lens $L_1$, a second-stage lens $L'_2$, a third-stage lens $L'_3$, and a modulator 102. (Lenses $L'_1$ and $L'_2$ in this design are similar to lens $L_1$ in FIG. 1, and lens $L'_3$ is similar to the triplet $L_2$ design in FIG. 15.) Lens $L'_1$ focuses incident EUV illumination 104 toward a point 1601 centered in the lens $L'_2$ aperture; lens $L'_2$ focuses the illumination toward point 105 at the center of the $L'_3$ aperture; and lens $L'_3$ then focuses the illumination onto point 107a on the wafer 108 (cf. FIG. 1). (The $L'_2$ and $L'_3$ apertures may be overfilled due to diffraction spreading of the focus beams, or due to the illumination source's geometric image size.) Lens $L'_3$ could be a very small, high-power element (e.g., $NA_{eff}$>0.2), while lens $L'_1$ could still be of practical size (e.g., aperture diameter>5 μm).

Molybdenum is just one of several materials that could be used for the microlenses. Several alternative materials that have good EUV optical characteristics are niobium (Nb), ruthenium (Ru), rhodium (Rh), and yttrium (Y). Material selection criteria that apply to multilayer EUV mirrors (e.g., refractive power and absorption—Ref. 28) are also relevant to EUV microlenses. Additionally, the microlens surfaces may be coated with a thin (e.g., several nanometers thick) corrosion-resistant layer similar to passivating coatings used for EUV mirrors (Ref. 26). These material selection considerations apply primarily to EWV lithography. For operation at other wavelengths, such as DUV or visible light, more conventional optical materials such as silicon dioxide or silicon nitride could be used.

Figure 17:
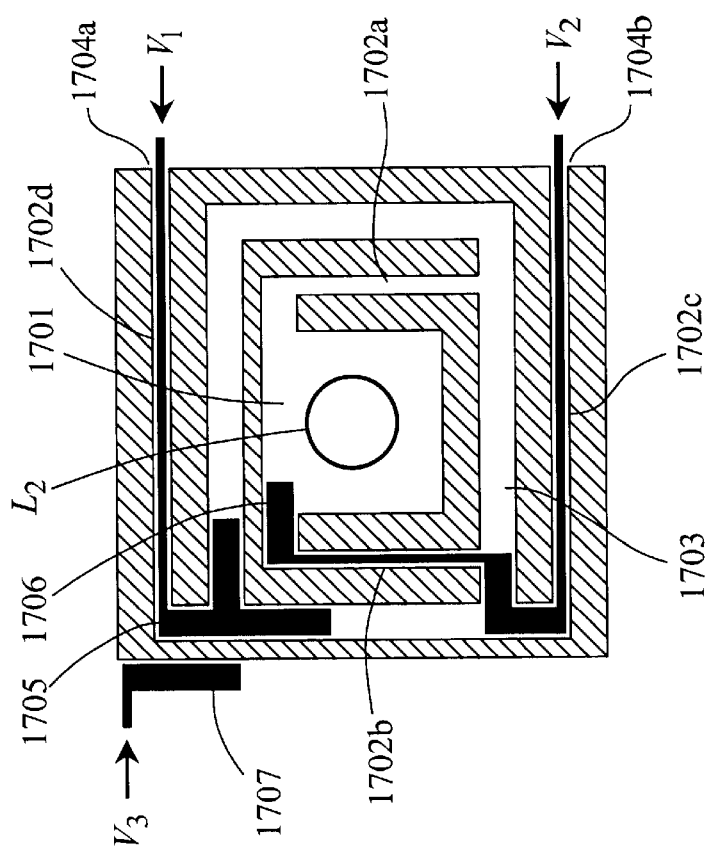
FIG. 17 illustrates a micromechanical actuator design for adjusting a second-stage microlens's lateral position.

Each second-stage microlens $L_2$ is preferably provided with a micromechanical actuator for making nanometer-scale adjustments in its lateral translational position. A possible design for the actuator is illustrated conceptually in FIG. 17. Lens $L_2$ is housed in an inner silicon frame 1701 that is attached, via contiguous leaf springs 1702a and 1702b, to an outer silicon frame 1703. The outer frame is attached, via contiguous leaf springs 1702c and 1702d, to anchor points 1704a and 1704b. The frames and leaf springs are made from a thin silicon layer that has been etched through over the hatched areas in FIG. 17. The lens position is actuated by means of electrostatic attraction or repulsion between proximate capacitive conductor pads 1705, 1706 and 1707, which are charged by three voltage controls (indicated as $V_1$, $V_2$, and $V_3$). The actuator's positional range would typically be on the order of 10 nm.

It could also be possible to equip each second-stage microlens with an individually controllable focus mechanism, making possible conformal printing on complex surface topographies. Due to the system's large depth of focus, a focus mechanism would probably not provide much benefit unless its positioning range is over an order of magnitude greater than the lateral positioning range. However, focus control could be useful for ultra-high-resolution systems operating at high numerical aperture (e.g., $NA_{eff} > 0.2$).

§3 Microlens Manufacture

EUV microlenses can be manufactured with nanometer-scale profile control by adapting shadow-mask deposition processes that are used, for example, in shadow-mask molecular beam epitaxy (MBE). Large-scale shadow masks have been used to deposit graded-thickness, multilayer EUV mirror coatings with subnanometer thickness accuracy (Ref. 29); and shadow-mask deposition processes have also been applied to microlens manufacture (Ref. 30). Microlens-type structures with submicron dimensions can be fabricated using shadow-mask MBE techniques (Refs. 21, 22). Some very excellent recent examples of shadow-mask process capabilities for submicron fabrication are exhibited in Refs. 23, 24.

The above methods are all deposition processes, but shadow masks can also be used with etching processes. For example, Ref. 31 describes a reactive ion etching (RIE) process that achieves nanometer-scale thickness accuracy on three-dimensional topographies by using a movable shadow mask. Molybdenum can be reactive-ion etched (Refs. 32, 33), and accurately profiled molybdenum microlenses could be fabricated by a combination of shadow-mask etching and deposition processes.

Figure 18A:
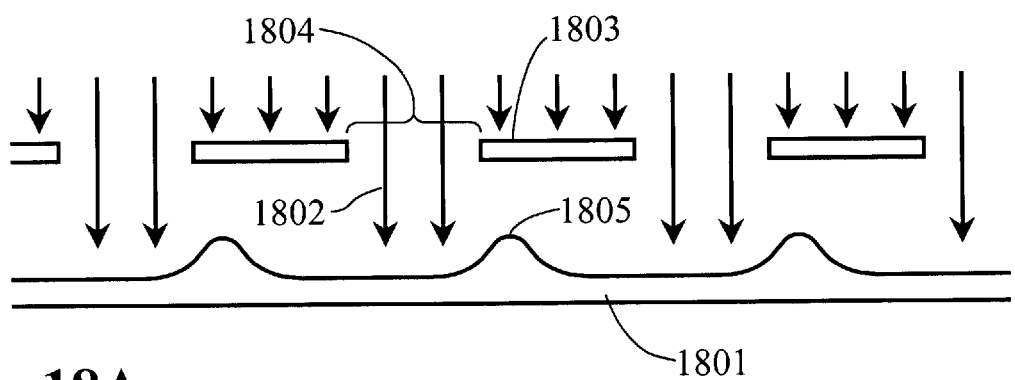
FIGS. 18A–18F illustrate a method for fabricating three-element second-stage lenses.
Figure 18B:
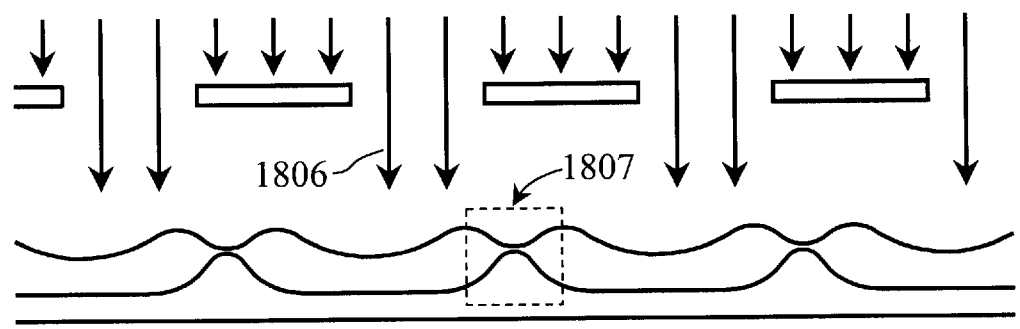
Figure 18C:
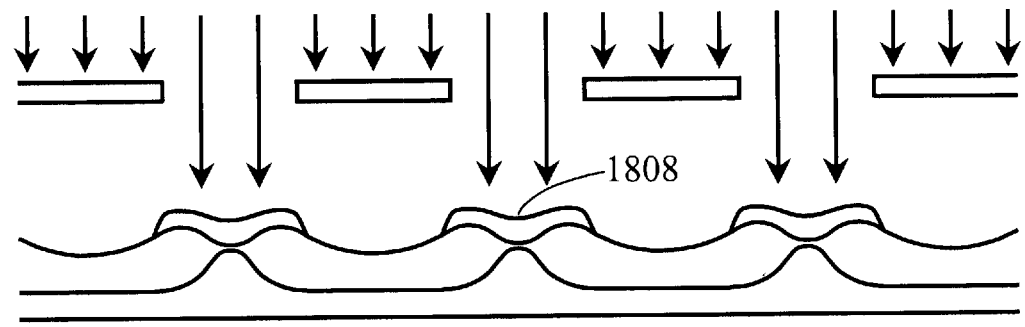
Figure 18D:
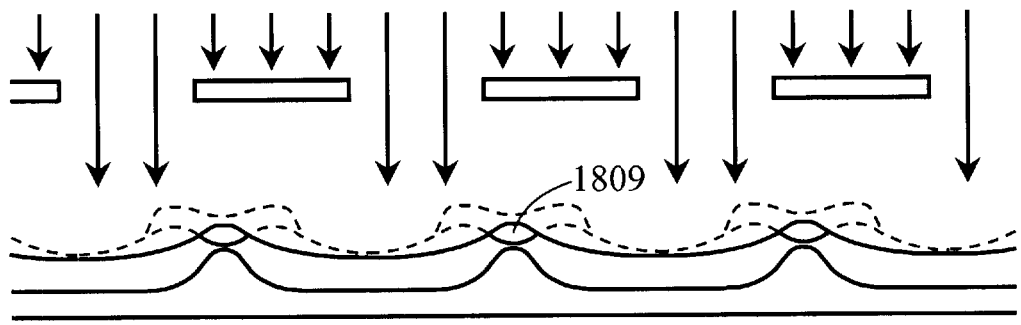
Figure 18E:
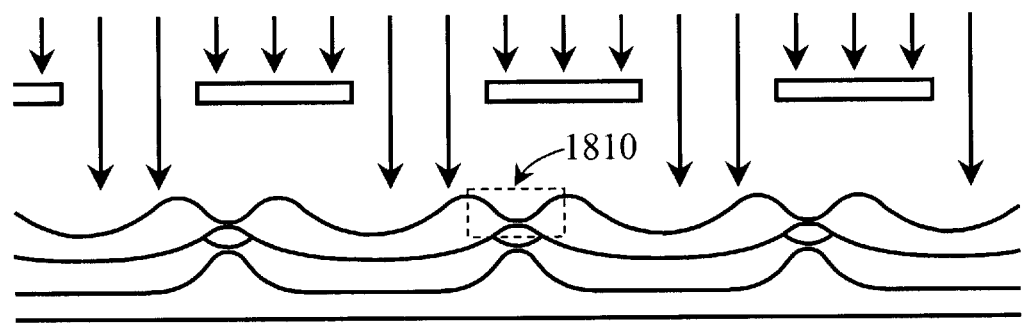
Figure 18F:
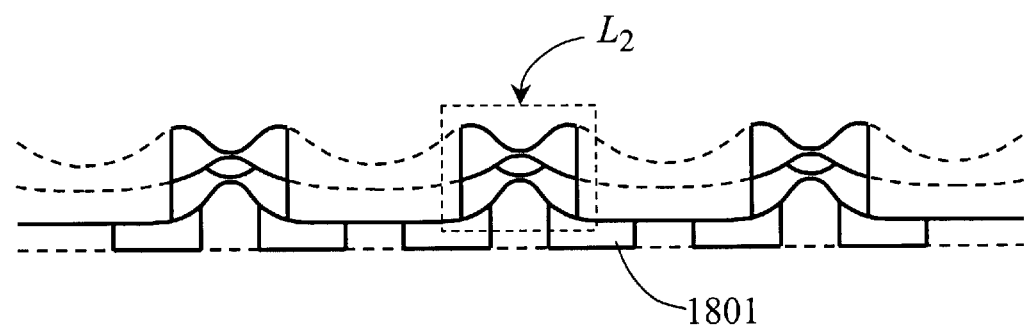

FIGS. 18A–18F illustrate a method for fabricating three-element second-stage lenses $L_2$ of the type illustrated in FIG. 15. (The single-element $L_2$ design illustrated in FIG. 10 could be similarly formed by leaving out the process steps shown in FIGS. 18C–18E.) In the first process step (FIG. 18A), a substrate 1801 is etched by a particle beam 1802 which is masked by a shadow mask 1803 comprising an array of circular apertures such as aperture 1804 (shown cross-sectionally). Either the substrate or the mask is scanned in a circular pattern during etching to form an array of rotationally symmetric convex mold surfaces such as surface 1805. (The substrate should preferably be stepped during the etch process so that each mold surface is etched through multiple mask apertures, in order to mitigate the effects of nonuniformities in either the apertures or the particle beam. A similar stepping technique could be used in subsequent processing steps, FIGS. 18B–18E.) Next (FIG. 18B), vapor-phase molybdenum 1806 is shadow-deposited onto the substrate, again using a circular scan so that rotationally symmetric, meniscus molybdenum structures (such as structure 1807) are formed over the molds. A beryllium layer 1808 is then deposited through the shadow mask (FIG. 18C); and the beryllium and molybdenum are subsequently shadow-etched to form convex beryllium lens elements (such as element 1809) over the meniscus structures (FIG. 18D). Then another molybdenum layer is shadow-deposited to form a second array of meniscus structures (such as structure 1810) over the beryllium elements (FIG. 18E). In subsequent process steps, the lens elements are lithographically isolated to form separate lens structures, such as lens $L_2$ (FIG. 18F; cf. FIG. 15); and the substrate 1801 is back-etched to expose the lenses and to form a positional actuator mechanism (such as that illustrated in FIG. 17).

An advantage of the above process is that all of the critical lens deposition steps are performed with a single shadow mask, so accurate alignment is maintained between process steps. Moreover, the shadow mask aperture diameter can be significantly larger than the microlens clear aperture diameter. Thus, the shadow mask apertures could easily be formed by using an interference lithography technique, which is very accurate and more economical than alternative processes such as electron-beam or focused-ion-beam lithography.

The mask aperture array would be designed to match the triangular microlens centering layout (FIG. 3). A lens centering pattern comprising equilateral triangles can be produced by interference lithography, using a three-beam exposure technique in which three collimated laser beams are directed onto a photoresist-coated substrate at equal incidence angles and symmetrically distributed azimuthal angles. (A similar three-beam interference method has been used to lithographically pattern microlens arrays, Ref. 34. The three-beam interference technique is much simpler than alternative four-beam interference methods or image-reversal processes that are used for patterning rectangular hole arrays, Ref 35.) Each beam should preferably be polarized in its plane of incidence. Provided that the incidence angles are sufficiently large, the resulting interference pattern will contain localized intensity maxima that can be developed into etched holes with a high degree of circular symmetry and accurate center placement. (Symmetric intensity minima can similarly be generated if the beams are polarized parallel to the substrate.)

The shadow-mask lithography technique described above is not the only option for microlens fabrication. Refs. 36 and 37 review a variety of alternative methods such as gray-scale lithography. For non-EUV applications, any of a variety of lens forms such as molded microlenses, gradient-refractive-index planar microlenses, melted-resin microlens arrays, etc., may be used. One technique that might be suitable for EUV application would be laser-assisted deposition and etching (Ref. 36, Sect. 4.4.3) in combination with interference lithography (i.e., a stationary laser interference pattern would be used instead of a scanning laser beam).

In a variation of the interference lithography method, NIST has developed an "atom lithography" process (Ref. 38) that forms extremely accurate and uniform periodic structures by using intersecting laser beams to focus an atomic beam onto interference minima or maxima on a deposition substrate. The method could be used with the three-beam geometry described above to form EUV microlens arrays with triangular centering patterns. A lens material such as molybdenum could perhaps be deposited directly. Alternatively, deposited layers of a material such as chromium could be used as molds or as sacrificial, pattern-transfer layers to form the microlenses.

§4 Modulator Options

The modulator 102 (FIG. 1) is preferably a micromechanical shutter 103a, which is located proximate lens $L_2$ in order to minimize its positional travel range. It is preferably located between $L_1$ and $L_2$ so that it does not affect the working distance between the printhead and the wafer. The shutter could, for example, comprise a comb-drive actuator similar to a mechanism that has been under development for printing applications (Ref 39). Another type of shutter mechanism which has been proposed for use in maskless x-ray lithography is a stress-biased, electrostatically activated coil or flap (Refs. 40, 18).

Figure 19:
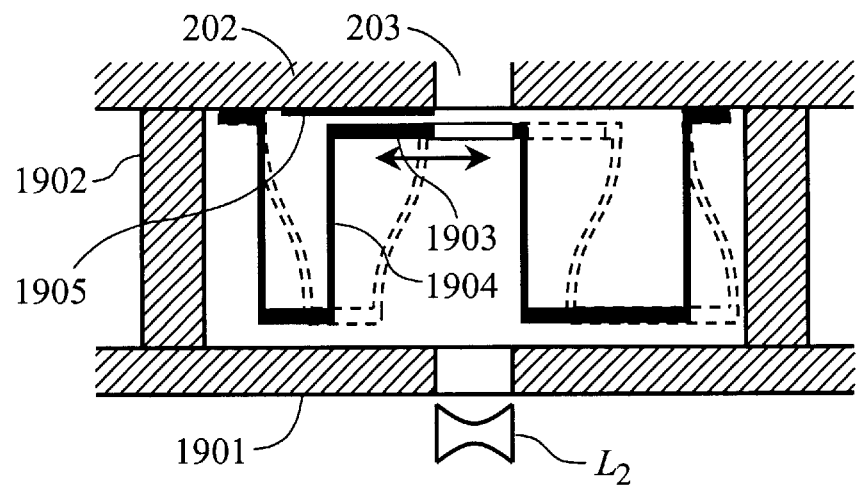
FIG. 19 illustrates a modulator mechanism comprising a micromechanical shutter.

Other types of shutters could also be used. For example, FIG. 19 shows a sectional view of one such mechanism. The second stage microlenses, such as lens $L_2$, are supported by a planar structure 1901 which is attached by support posts (such as post 1902) to a silicon plate 202. (Structure 1901 may comprise a lens position actuator such as that illustrated in FIG. 17.) EUV radiation is focused through etched holes in plate 202, such as hole 203 (cf. FIG. 2). The radiation illuminating each lens $L_2$ is shuttered by means of a movable aperture plate, such as plate 1903, which is attached to plate 202 by means of vertical leaf springs such as leaf spring 1904. (The aperture plate and leaf springs could be formed as a film deposited onto a sacrificial mold.) The aperture plates and leaf springs are conductive (or are coated with a conductive film) and are positionally actuated by means of electrostatic interaction with capacitive conductor pads such as pad 1905 deposited on plate 202.

Shutter mechanisms are generally binary-state (on/off) devices, which would not provide any gray scale modulation capability. Although a shutter proximate to $L_2$ could be positioned to only partially obstruct the illumination on $L_2$, this would significantly degrade the focused beam quality and spot size on the wafer. However, the focused beam intensity could be effectively modulated by inserting a micromechanically-actuated obscuration in the beam path close to the first-stage lens $L_1$. Due to the spatial filtering action of $L_2$, the optical diffraction and scatter caused by the obscuration would not significantly affect the wafer-plane focus spot other than to modulate its intensity level.

Figures 20A, 20B:
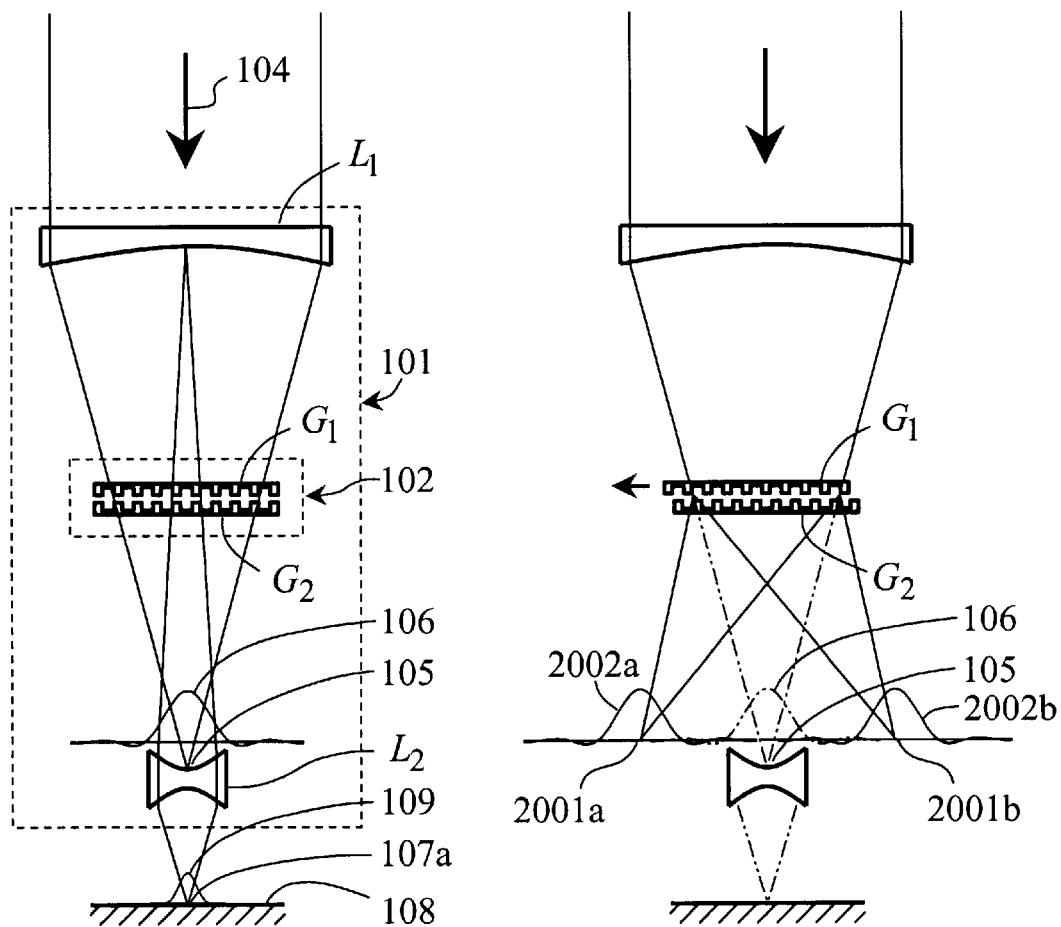
FIGS. 20A and 20B illustrate an alternative modulator mechanism comprising two proximate diffraction gratings, one of which is micromechanically actuated.

Modulator mechanisms other than shutters could also be used. For example, FIGS. 20A and 20B illustrate a pixel 101 comprising microlenses $L_1$ and $L_2$ and modulator 102, wherein the modulator comprises two proximate phase diffraction gratings $G_1$ and $G_2$. In the modulator's ON state (FIG. 20A), the gratings have minimal effect on the transmitted beam. The incident beam 104 is focused by $L_1$ toward a point 105 centered on $L_2$; and $L_2$ thence focuses the radiation toward focal point 107a on the wafer 108. (The radiation field amplitudes on $L_2$ and on the wafer are illustrated as profiles 106 and 109, respectively; cf. FIG. 1.) In the modulator's OFF state (FIG. 20B), grating $G_1$ is translationally displaced, causing the transmitted energy to be diverted into diffracted orders such as +1st and −1st orders directed toward points 2001a and 2001b. (The diffracted field amplitudes at these points are illustrated as profiles 2002a and 2002b.) The zero order at point 105 is extinguished in the OFF state. The grating modulator's operational principle is similar to that of a laser modulator described in Ref 41, and several design variations for EUV application (including a design with gray-scale modulation capability) are described in the above-referenced provisional application No. 60/162,684.

A significant drawback of grating modulators for EUV application is their high efficiency loss. For an operating wavelength of 11.3 nm, and assuming molybdenum grating lines, a grating modulator's maximum theoretically attainable ON-state transmittance is 75.7%. In practice, the efficiency would need to be much lower (e.g., 50%) to accommodate tolerance factors. Due to this limitation other micromechanical modulator mechanisms such as shutters may be more practical, although grating modulators could be useful for non-EUV applications.

For some specialized applications, multiple modulators would not be required; instead the system could simply use a single modulator at the EUV source. (For example, the LPP source's laser could be modulated by means of a grating modulator.) The printer pixels would all print identical exposure patterns, resulting in a periodic exposure distribution matching the microlens periodicity. This type of system could be used, for example, in the manufacture of porous membrane filters or periodic structures such as mass-replicated MEMS devices. For applications where individually addressable pixel modulators are required, the printer modulators could themselves be fabricated by using a microlens lithography system that is only source-modulated. A "mix-and-match" strategy could also be used in which high-resolution, periodic structures are fabricated using a source-modulated microlens lithography system, while e-beam or DUV lithography is used for other non-periodic structures.

§5 Focus and Alignment Tracking System

Positional alignment tolerances for EUV lithography are on the order of a few nanometers; thus the printheads must be equipped with very precise and accurate alignment sensors and actuators. (Focus tolerances would typically be over an order of magnitude looser than alignment tolerances, but would be more critical for very high-resolution systems.) The preferred alignment method uses an array of microsensors, such as electromagnetic proximity probes or optical sensors, which are formed integrally with the printheads and which sense each printhead's position relative to periodic tracking patterns on the wafer surface. For example, FIG. 3 illustrates a printhead 201 equipped with two position sensor arrays 303a and 303b bordering illumination field 302 and comprising position sensor elements such as element 304. A physical (e.g., electrical or optical) interaction between the sensor elements and periodic tracking patterns 305a and 305b on the wafer creates a positional feedback signal such as a Moire-type pattern in the distribution of signal levels over the sensor arrays. This pattern is digitally analyzed to determine positional information which is relayed to positioning actuators (such as printhead actuators 404a and 404b in FIG. 4) to maintain accurate lateral alignment and focus while the system is printing. Also, each second-stage microlens $L_2$ may be individually actuated to provide further control of alignment and magnification (FIG. 1).

Ref. 13 describes a confocal, microlens-imaging system that could be used for alignment tracking, and provisional application No. 60/162,684 describes an enhancement of this method that provides phase-contrast imaging capability. Ref. 13 also describes an actuator mechanism that provides warp compensation capability, as well as alignment, fine focus and tilt control. (Warp distortion might also be controlled by means of an electrically activated film, such as a piezoelectric layer, which is deposited on the printhead surface and is activated to induce a compensating shear stress across the surface.)

Focus and alignment could alternatively be tracked by means of capacitance sensors similar to fringe capacitance sensors described in Ref. 42. Such sensors are generally designed only to provide focus sensing capability, but a sensor similar to the interdigitated comb capacitor illustrated in FIG. 7 of Ref. 42 could also be sensitive to lateral alignment relative to a periodic tracking pattern on the wafer. Other sensor technologies that could be applicable to focus and alignment include proximal probe arrays and near-field optical sensors.

6 EUV Illumination System

FIGS. 21–26 show several views of the EUV illumination system (cf. FIGS. 4 and 6). The system's main elements are a xenon LPP source (Refs. 7, 8), collection optics comprising condenser mirror MI and collimator mirror M2, and distribution optics comprising two sets of terraced fold mirrors, M3 and M4. The system's primary design objectives are to provide collimated EUV illumination of uniform irradiance, optimize optical collection efficiency, and provide sufficient clearance space around the plasma source.

Figure 21:
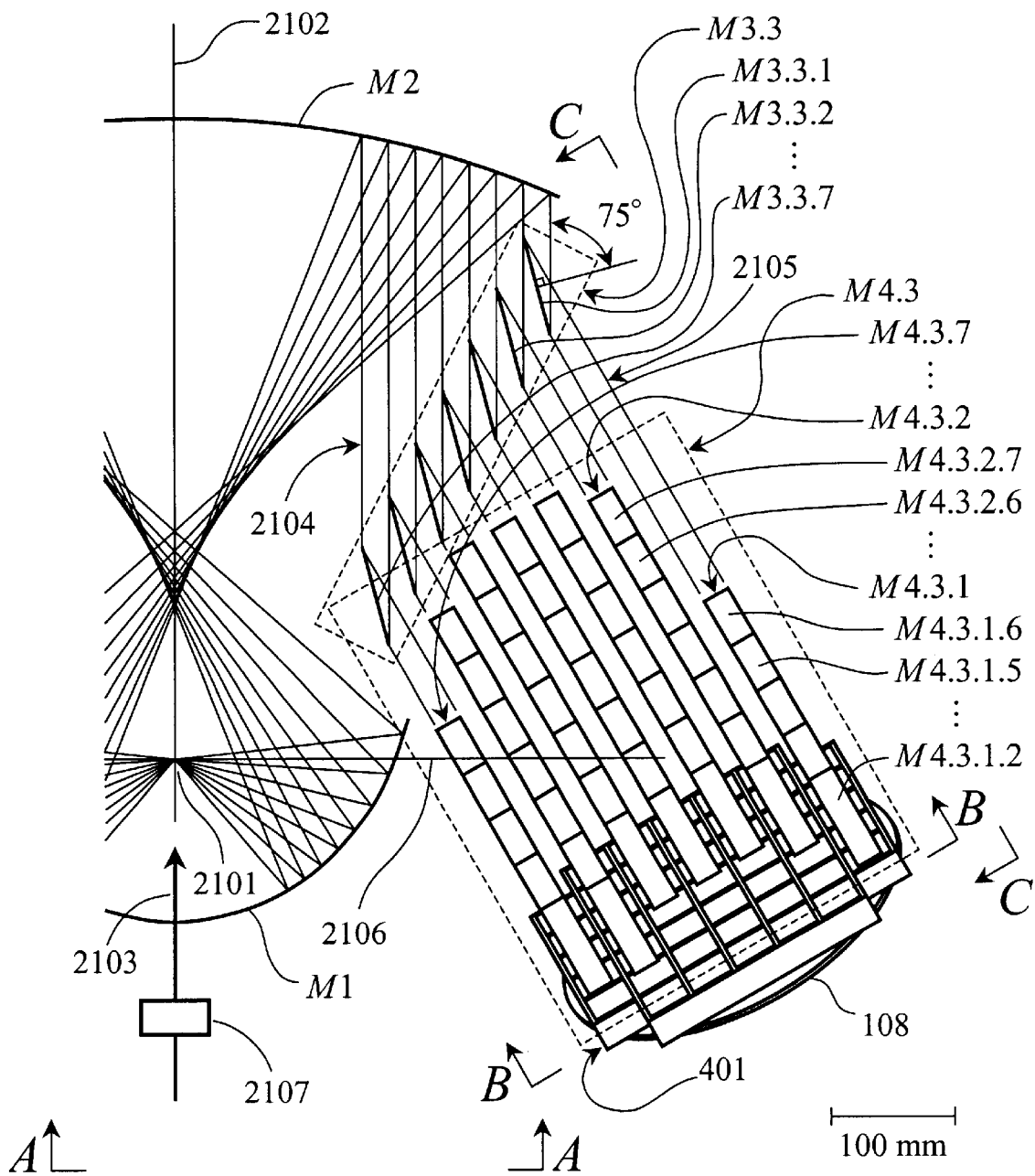
FIG. 21 illustrates an EUV illumination system comprising a condenser mirror, collimator mirror, and two sets of fold mirrors.

Referring to FIG. 21, the plasma source is centered at the focal point 2101 of condenser mirror M1. (The plasma source is indicated as 601 in FIG. 6.) Mirrors MI and M2 are axially symmetric with respect to an axis 2102 containing point 2101. (M1 is aspheric, whereas M2 may be spherical.) The mirrors are designed to produce illumination that is collimated and of uniform irradiance, taking into account the mirrors' reflectivity variation with incidence angle and the plasma's directional emission profile. The plasma is driven by a pulsed laser beam (or clustered collection of laser beams) 2103 which enters the system along axis 2102 and is focused onto point 2101. (The EUV radiation may optionally be modulated by means of a modulator mechanism 2107 in the laser beam path.) The beam's axial alignment results in an ETV plasma emission profile that is axially symmetric around axis 2102, making it possible to compensate for the emission's directional nonuniformity with an axially symmetric mirror design.

Figure 22:
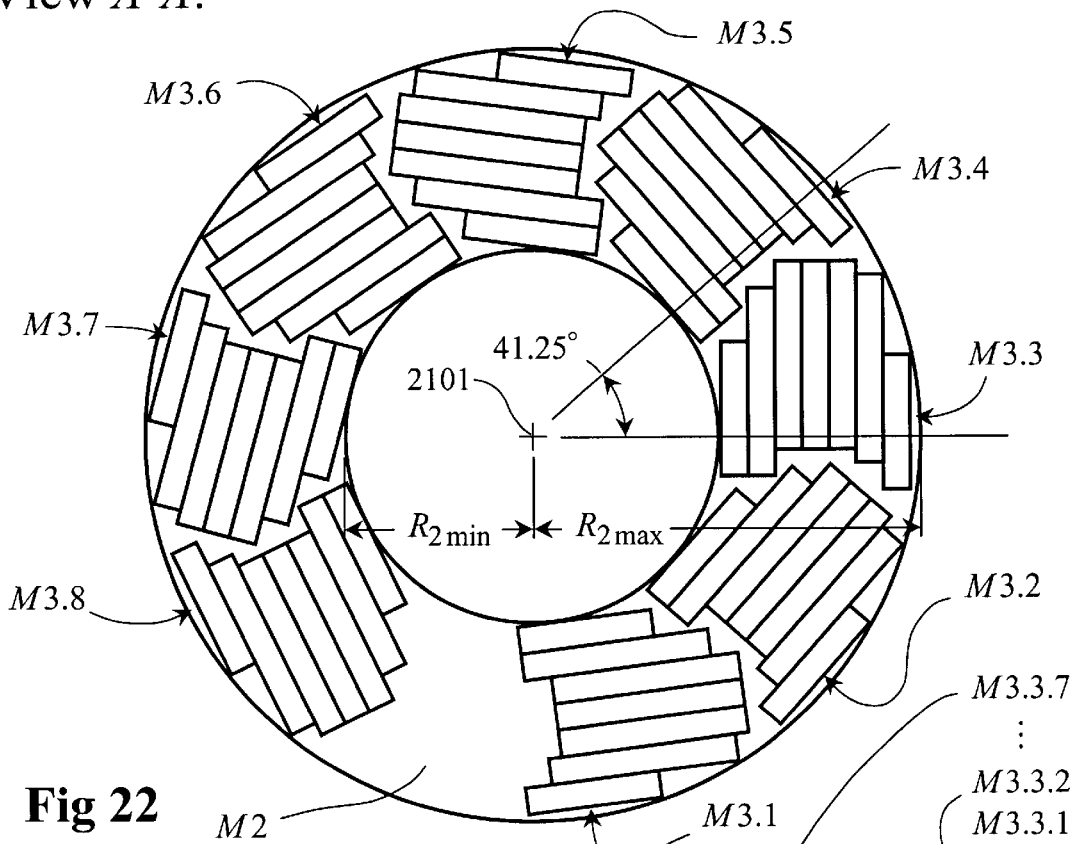
FIG. 22 illustrates the collimator mirror's aperture geometry.

The collimated EUV beam 2104 from M2 is partitioned into 56 smaller, rectangular-aperture beams by a group of fold mirrors, which are collectively designated M3. The M3 group comprises eight subgroups M3.1, . . . M3.8. FIG. 21 shows one such subgroup, M3.3, and FIG. 22 shows the aperture geometry of M2 and of all eight M3 subgroups (M3.1, . . . M3.8) from a perspective looking into collimated beam 2104 (View A—A in FIG. 21). (Mirror M2 is illustrated as having an annular clear aperture in FIG. 22, but in practice M2 could comprise eight separate mirrors, each covering one of the eight M3 subgroups. M1 could possibly also be partitioned into separate mirrors.) The azimuthal angular displacement between successive M3 subgroups is 41.25° (FIG. 22), and clearance space is provided between M3.8 and M3.1 to accommodate a xenon injection nozzle and associated mechanics (not shown).

Figure 23:
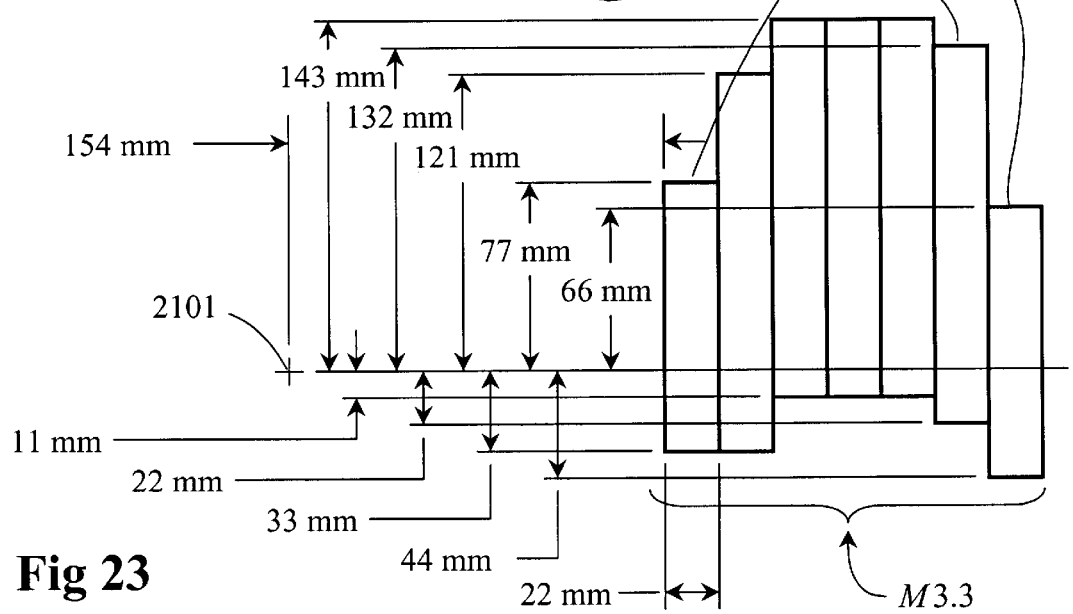
FIG. 23 shows dimensional details of the first fold mirror set, in the projected view of FIG. 22.
Figure 24:
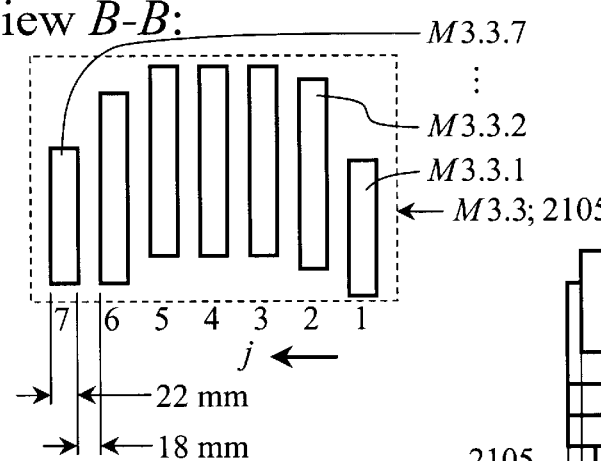
FIG. 24 shows the first fold mirror set, from a perspective looking into the reflected beams.

Each M3 subgroup comprises seven individual fold mirrors. For example, FIG. 21 illustrates subgroup M3.3 comprising fold mirrors M3.3.1 . . . M3.3.7, and FIG. 23 shows dimensional details of these mirrors in the projected view of FIG. 22. Collimated beam 2104 is incident on the M3.3 mirrors at a 75° incidence angle (FIG. 21), and is reflected into seven rectangular-aperture collimated beams 2105. FIG. 24 illustrates the aperture geometry of mirrors M3.3 and beams 2105 from a perspective looking into beams 2105 (View B—B in FIG. 21). The M3.3 mirror dimensions and positions are defined so that the beam width and spacing dimensions are 22 mm and 18 mm, respectively, in the projected view of FIG. 24.

Figure 25:
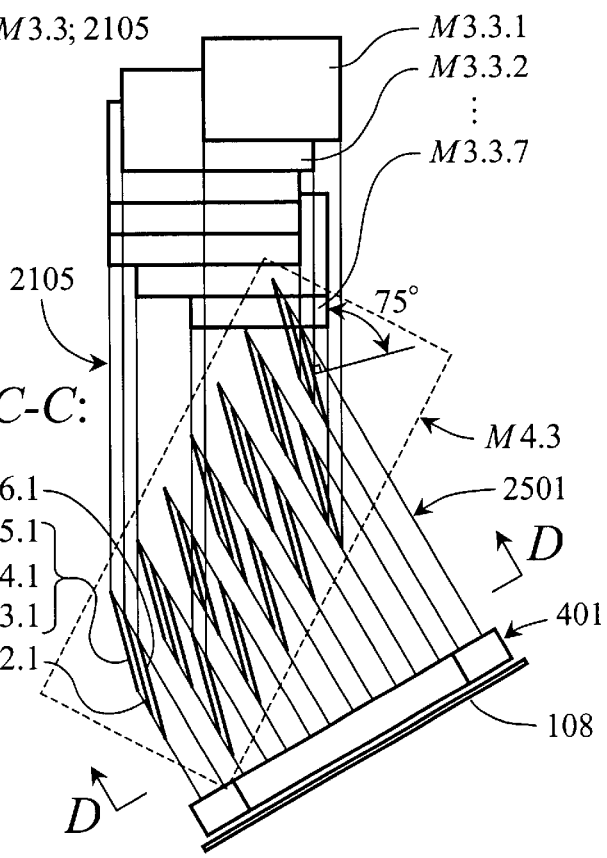

The beams reflected from the M3 mirrors are further partitioned by a second group of fold mirrors, which are collectively designated as M4. The M4 group comprises eight subgroups M4 . . . M4.8 which are associated with corresponding M3 subgroups M3.1, . . . M3.8. For example, FIG. 21 illustrates the M4 subgroup M4.3 corresponding to M3.3. Subgroup M4.3 is itself a hierarchy comprising seven lower-level subgroups M4.3 . . . M4.3.7, each of which receives illumination from a respective M3 mirror (M3.3.1 . . . or M3.3.7) and further partitions it into individual square illumination fields. FIG. 25 shows an edge view of the M4.3 mirrors (View C—C in FIG. 21). Each subgroup M4.$i.j$ (i=1, . . . 8; j=1, . . . 7) comprises seven individual fold mirrors M4.$i.j$.1, . . . M4.$i.j$.7 (FIG. 21); except that M4.$i$.1 and M4.$i$.7 each comprises only five mirrors (designated M4.$i.j$.2, . . . M4.$i.j$.6; j=1 or 7).

Figure 26:
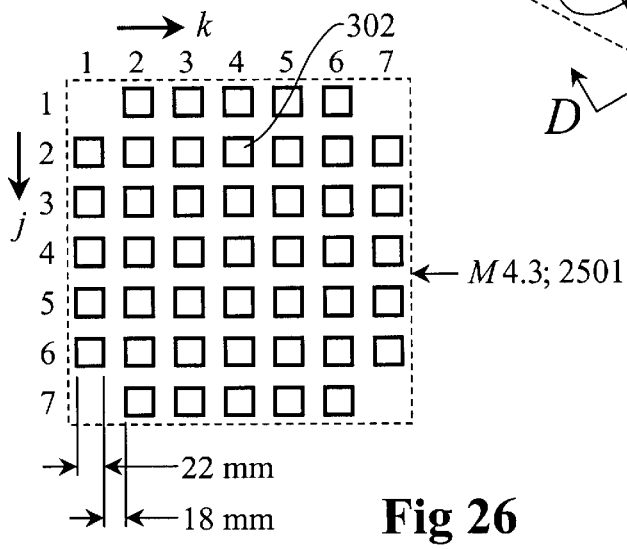
FIG. 26 illustrates the aperture geometry of the second fold mirror set, from a perspective looking into the beams reflected by the second set.

The seven rectangular-aperture beams 2105 are incident on the M4.3 mirrors at a 75° incidence angle (FIG. 25), and are reflected into 45 square-aperture beams 2501. FIG. 26 illustrates the aperture geometry of mirrors M4.3 and beams 2501 from a perspective looking into beams 2501 (View D—D in FIG. 25). Each of the 45 beams 2501 covers an individual square illumination field such as field 302 in FIGS. 5, 26. (FIG. 5 is a top view of the printhead and wafer, whereas FIG. 26 shows the illumination fields from a perspective looking up through the bottom of the wafer. In FIG. 4, the incident beam 104 illuminating printhead aperture 301 corresponds to one of the beams 2501.) Each illumination field in FIG. 26 is indexed with row and column indices j,k=1, . . . 7 identifying the corresponding fold mirrors M3.3.$j$ and M4.3.$j.k$ that define the field. For example, field 302 is positioned at row j=2 and column k=4. (In FIG. 24 the mirrors M3.3.$j$ are labeled with corresponding row indices j; and in FIG. 4 mirrors 407$a$, 407$b$, and 407$c$ correspond respectively to M4.3.2.3, M4.3.2.4, and M4.3.2.5.) The M4.3 mirror dimensions and positions are defined so that the illumination fields are column-aligned with column width and spacing dimensions of 22 mm and 18 mm, respectively, in the projected view of FIG. 26.

Each M4.$i$ mirror subgroup (i=1, . . . 8) comprises 45 fold mirrors, so the total number of M4 mirrors is 8×45=360. More specifically, this is the number of M4 mirror clear apertures corresponding to square illumination fields. In practice, the actual number of M4 mirrors could be less because multiple clear apertures can share a common substrate. For example, in the design example illustrated in FIGS. 21–26, the elements of each set of three mirrors M4.$i$.3.$k$, M4.$i$.4.$k$, and M4.$i$.5.$k$ (i=1, . . . or 8; k=1, . . . or 7) are coplaner and can hence be formed on a single, planar substrate.

The partitioned beams 2501 illuminate a wafer print module 401 which prints onto a 300-mm wafer 108 (FIGS. 21, 25; cf. FIGS. 4, 5). The illumination system supplies EUV illumination to eight such modules, and eight wafers are exposed simultaneously. The collection optics' axis 2102 (FIG. 21) is vertical, and the wafer planes are inclined at a 41.4° angle to horizontal. (The system could alternatively be designed so that the wafer planes are all horizontal, although such a design would incur practical and performance-related compromises.)

The fold mirror design illustrated above exemplifies a general design methodology that can be applied with different design assumptions and requirements. For example, the size and shape of the illumination fields, or the number of fields, may differ from the configuration illustrated in FIG. 26. The general design methodology comprises the following steps:

(1) The illumination aperture layout is defined, as in FIG. 26.

(2) The aperture shapes are translated along the direction parallel to the M4 incidence planes (the "k" direction in FIG.

26) so that the apertures in each row are consolidated into a single beam aperture, as illustrated in FIG. 24. (The translational position of each consolidated aperture provides a degree of freedom that is used to optimize optical efficiency.)

(3) The consolidated row apertures are then translated in the direction parallel to the M3 incidence planes (the "j" direction in FIG. 24), consolidating them into a single, contiguous beam aperture, as illustrated in FIG. 23.

(4) Multiple copies of the aperture shapes defined in step 3 are arranged to efficiently fill the M2 clear aperture space, as illustrated in FIG. 22. The translational positions of the consolidated apertures in step 2, the number of wafer print modules, and other design parameters are adjusted to fill the M2 aperture as efficiently as possible, and to also satisfy other design requirements such as clearance constraints.

Figure 27:
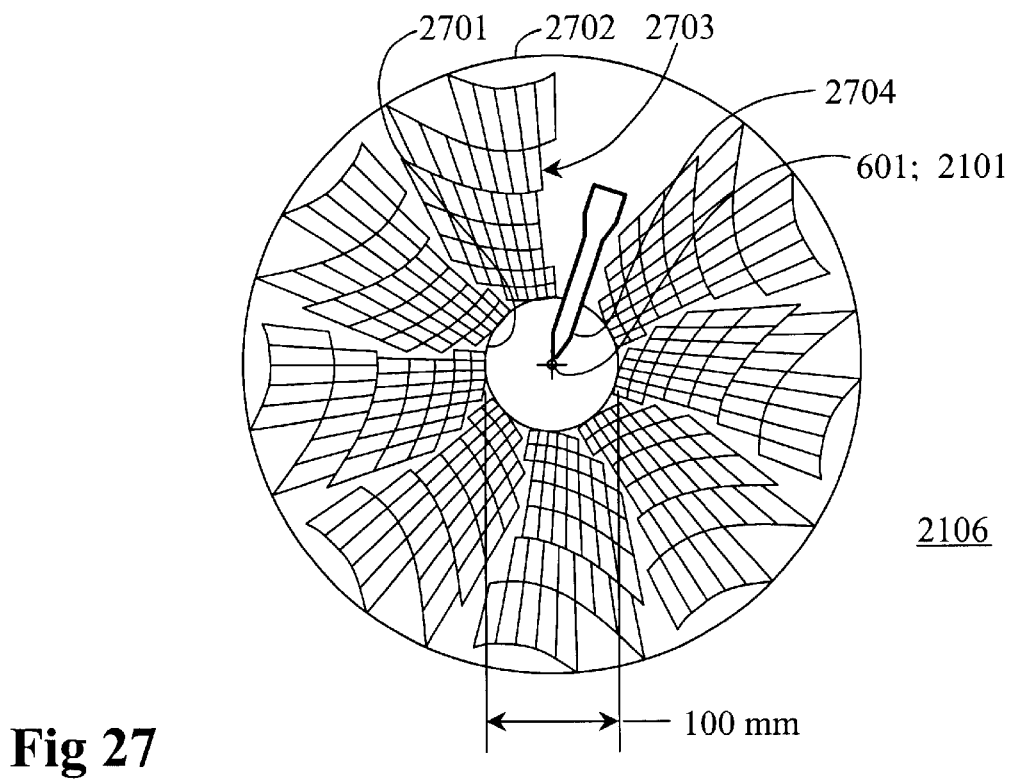
FIG. 27 illustrates the illumination system's optical clearances around the EUV plasma source.

The illumination optics must be designed to provide adequate clearance space around the plasma source. FIG. 27 illustrates a projection of the EUV illumination system's clear aperture limits onto mirror M1's focal plane 2106 (FIG. 21). The M2 mirror's inner and outer annular clear aperture limits are indicated as 2701 and 2702, respectively; and the square illumination fields' projections back onto plane 2106 are also illustrated (2703). The space between mirror groups M3.8 and M3.1 (cf. FIG. 22) provides accommodation for a xenon injection nozzle 2704, which feeds the plasma 601. The inner clearance circle 2701 defined by mirror M2's inner clear aperture limit has a diameter of 100 mm.

Although M1 and M2 are designed to produce a collimated beam of uniform irradiance, the beam's polarization state will not be uniform; hence any polarization sensitivity in M3 and M4 could significantly degrade the intensity uniformity. An advantage of the fold mirror design described above is that the combined polarization sensitivity of the M3 and M4 mirrors can be entirely neutralized by simply relying on symmetry. The incidence planes on corresponding M3 and M4 mirrors are orthogonal, so if M3 and M4 have identical incidence angles and identical optical coatings, their polarization effects will automatically be self-canceling.

In practice, it may actually be advantageous to specify slightly different reflective coatings for different fold mirrors in order to induce reflectivity differences between fold mirrors. This would be done to counterbalance the effect of absorption by ambient xenon gas. Assuming a xenon pressure of 1 mTorr (Ref. 8), the xenon absorption would be approximately 8% loss per meter of optical path length at the 11.3-nm operating wavelength. The source-to-wafer path length differs by up to 200 mm between different illumination fields, so the absorption would induce a 1.6% exposure variation across the wafer. However, this variation can be eliminated by designing compensating reflectivity losses into the M3 and M4 mirrors coatings. (This modification does not require graded-thickness coatings; it just requires separate coating specifications for different fold mirrors.)

The maximum source-to-wafer path length is approximately 1.6 meter. Again assuming 1 mTorr pressure, the xenon transmittance $\eta_{Xe}$ over this distance is $$\eta_{Xe}=0.875 \qquad \text{Eq. 6.1}$$

Figure 28:
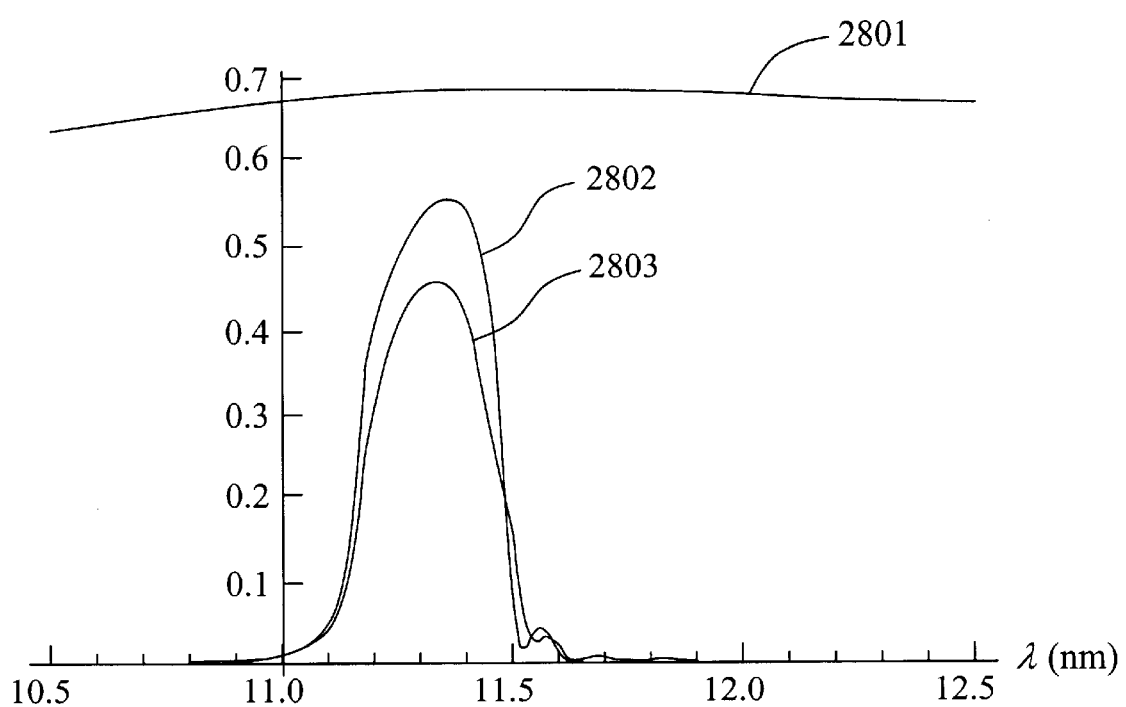
FIG. 28 illustrates the series reflectivity spectra for the two fold mirror sets (assuming bare ruthenium coatings), and also illustrates series reflectivity spectra of the condenser and collimator mirrors for two different incidence angles.

Since the fold mirrors operate at a high incidence angle (75°), they can use a very simple reflective coating. For example, a bare ruthenium coating has good EUV reflection efficiency at this incidence angle. FIG. 28 illustrates the series reflectivity of two bare ruthenium mirrors with crossed incidence planes and 75° incidence angles, as a function of wavelength λ (curve 2801). At the design wavelength of 11.3 nm the mirrors' combined reflection efficiency $\eta_{M3,M4}$ is $$\eta_{M3,M4}=0.684 \qquad \text{Eq. 6.2}$$

In practice, the M3 and M4 mirrors could comprise ruthenium films with a thin (e.g., several nanometer thick) overcoat similar to passivating coatings used for EUV mirrors (Ref. 26). The overcoat would provide improved corrosion resistance, and its thickness would provide a degree of freedom that could be used to adjust the mirror reflectivity to counterbalance other efficiency factors such as the ambient xenon absorption.

Multilayer Mo/Be reflective coatings are required for mirrors M1 and M2, which operate close to normal incidence. Moreover, graded-thickness coatings are required to accommodate the variation in incidence angle across the mirror apertures. At incidence angles exceeding 25° the maximum attainable reflection efficiency is seriously degraded, so the maximum incidence angles on M1 and M2 are constrained to 250. FIG. 28 illustrates the series reflectivity of two multilayer Mo/Be mirrors with parallel incidence planes (and unpolarized incident radiation), as a function of wavelength λ, for normal incidence (curve 2802), and for 25° incidence on both mirrors (curve 2803). Compared to normal incidence, the spectrally integrated series reflectivity at 25° incidence is reduced by a factor of 0.82.

The design of mirrors M1 and M2 is based on 70-bilayer Mo/Be coatings of the type described in Refs. 2 and 3. The molybdenum and beryllium film thicknesses $t_{Mo}$ and $t_{Be}$ are selected so that each Mo/Be bilayer has a half-wave optical thickness at the design wavelength and incidence angle, with the bilayer's optical thickness evenly divided between the Mo and Be films, $$t_{Mo} = (1-f_{Be}) \frac{\lambda_D}{2\mathrm{Re}\left[\sqrt{\tilde{n}_{Mo}^2 - \sin^2\theta}\right]} \qquad \text{Eq. 6.3}$$

$$t_{Be} = f_{Be} \frac{\lambda_D}{2\mathrm{Re}\left[\sqrt{\tilde{n}_{Be}^2 - \sin^2\theta}\right]} \qquad \text{Eq. 6.4}$$

wherein θ is the incidence angle (in vacuum), $\lambda_D$ is the design wavelength (11.3 nm), $\tilde{n}_{Mo}$ and $\tilde{n}_{Be}$ are the respective complex refractive indices for molybdenum and beryllium at wavelength $\lambda_D$, and $f_{Be}$ is the beryllium optical thickness fraction, $$f_{Be}=0.5 \qquad \text{Eq. 6.5}$$

$\tilde{n}_{Mo}$ has the value given in Eq. 2.11, and $\tilde{n}_{Be}$ is $$\tilde{n}_{Be}=n_{Be}-ik_{Be};$$

$$n_{Be}=1.00818,$$

$$k_{Be}=0.000966 \qquad \text{Eq. 6.6}$$

The reflectivity curves 2802 and 2803 in FIG. 28 are based on the above film specification. (In practice the reflectivity model should take into account factors such as film scattering, interlayer diffusion, and surface corrosion, but these factors are neglected here.)

The M1, M2 mirror design is also based on assumed emission characteristics of the LPP source, which will be defined in relation to the optical geometry illustrated in FIG.

29 (cf FIG. 21). For the purpose of mirror design the LPP is considered to be an infinitesimally small source at M1's focal point 2101. Rotational symmetry with respect to the optical axis 2102 is assumed, so a typical ray segment 2901a originating from point 2101 can be characterized by a spectral radiant intensity, $I_\lambda = dI/d\lambda$ (Ref. 43), which is a function only of wavelength $\lambda$ and the emission angle $\Theta_1$ relative to axis 2102, $$I_\lambda = I_\lambda[\lambda, \Theta_1] \qquad \text{Eq. 6.7}$$

(A comment on notation: Square braces "[ . . . ]" are used throughout this discussion to delimit function arguments; parentheses "( . . . )" are used for subexpression grouping; and curly braces "{ . . . }" are used to delimit lists or vectors.) $I_\lambda$ is assumed to be separable in $\lambda$ and $\Theta_1$, $$I_\lambda[\lambda, \Theta_1] = \eta_{src}[\Theta_1] I_{0\lambda}[\lambda] \qquad \text{Eq. 6.8}$$

wherein $\eta_{src}[\Theta_1]$ is a dimensionless factor representing the plasma emission's angular distribution, and $I_{0\lambda}[\lambda]$ is the source's spectral radiant intensity in the downward ($\Theta_1=0$) direction. ($I_{0\lambda}[\lambda]$ has units of watts per nanometer per steradian.) The functional form of $\eta_{src}[\Theta_1]$ is $$\eta_{src}[\Theta_1] = (0.88 + 0.13 \cos[\Theta_1])/1.01 \qquad \text{Eq. 6.9}$$

Figure 30:
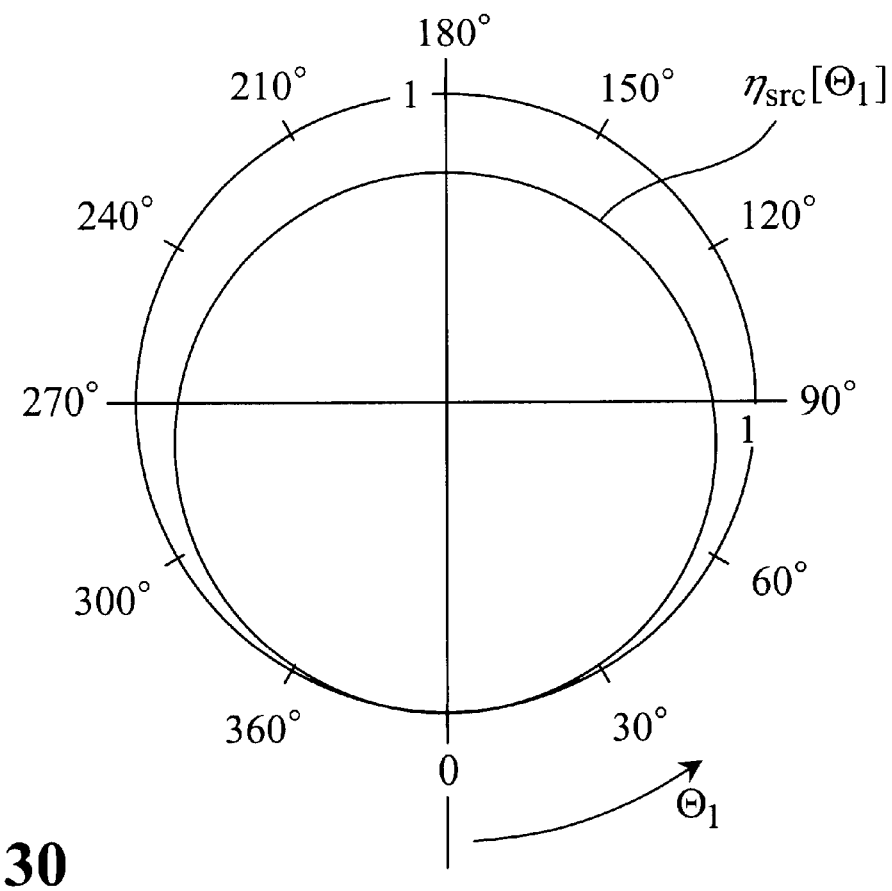
FIG. 30 illustrates the EUV plasma source's angular emission spectrum.
Figure 31:
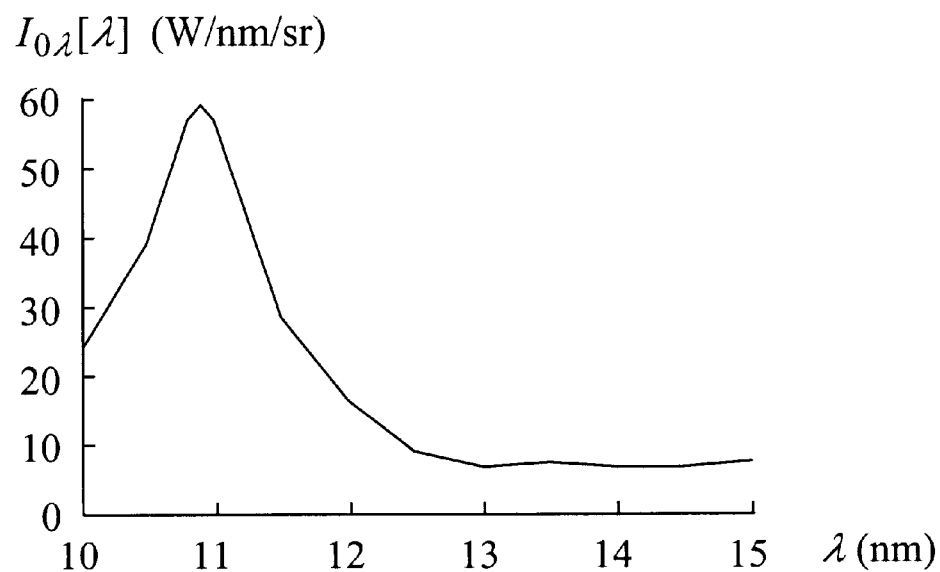
FIG. 31 illustrates the EUV plasma source's on-axis spectral radiant intensity.

A polar plot of this function is illustrated in FIG. 30, and the function $I_{0\lambda}[\lambda]$ is illustrated in FIG. 31. (Eq. 6.9 and FIGS. 30 and 31 are based on data in Refs. 7 and 8.)

Referring again to FIG. 29, the meridional optical geometry is defined relative to {y,z} Cartesian coordinates, wherein the z axis coincides with optical axis 2102 and the origin {y,z}={0,0} is at focal point 2101. Ray segment 2901 a originates from point {0,0}, intercepts M1 at a point {$y_1,z_1$}, and is reflected into a ray segment 2902a with an axial angle $\Theta_2$ relative to axis 2102. Segment 2902a intercepts M2 at a point {$y_2,z_2$} and is reflected into a ray 2903a, which is directed parallel to axis 2102. The incidence angle of segment 2901a on M1 is $\theta_1$, and the incidence angle of segment 2902a on M2 is $\theta_2$. Similarly, a ray segment 2901b proximate to 2901a is reflected into ray segment 2902b and ray 2903b proximate to 2902a and 2903a, respectively. The geometric parameters of this second ray sequence differ from those of the first by corresponding differential quantities; for example, the emission angle of ray segment 2901b is $\Theta_1 + d\Theta_1$, etc.

Figure 32:
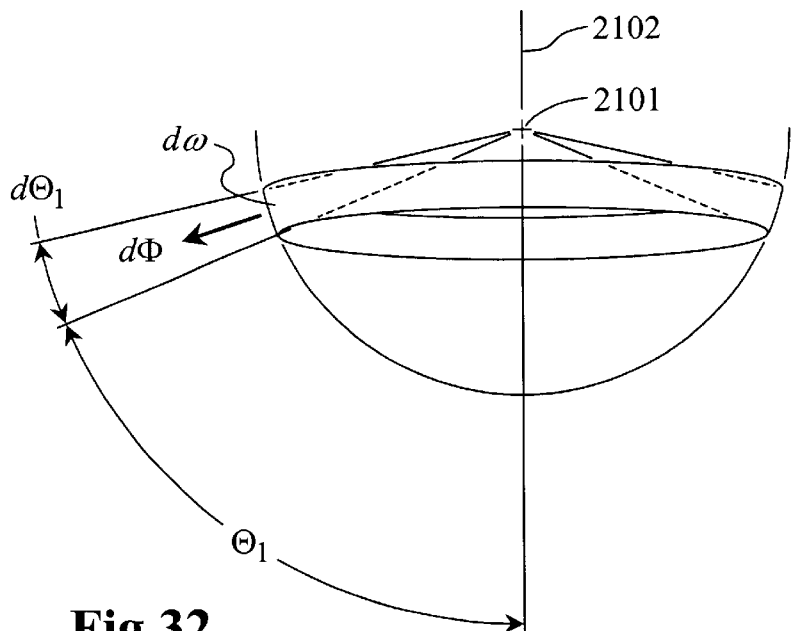
FIG. 32 illustrates an incremental solid angular range bounding a set of rays emitted from the plasma source.

The spectral radiant intensity of ray segment 2901a is defined (Ref. 43) as the radiant power per unit solid angle per unit wavelength interval, i.e.

$$I_\lambda = \frac{d\Phi}{d\omega d\lambda} \qquad \text{Eq. 6.10}$$

wherein $d\Phi$ is the differential radiant power transmitted within a differential solid angle $d\omega$ and differential wavelength interval $d\lambda$. FIG. 32 illustrates a solid angular range $d\omega$ defined by the set of all rays emitted from source point 2101 between the emission angle limits $\Theta_1$ and $\Theta_1 + d\Theta_1$). Proximate ray segments 2901a and 2901b in FIG. 29 define the limits of this angular range in the meridional plane of FIG. 29, and the differential solid angle covered by this range is $$d\omega = 2\pi \sin\Theta_1 \, d\Theta_1 \qquad \text{Eq. 6.11}$$

Figure 29:
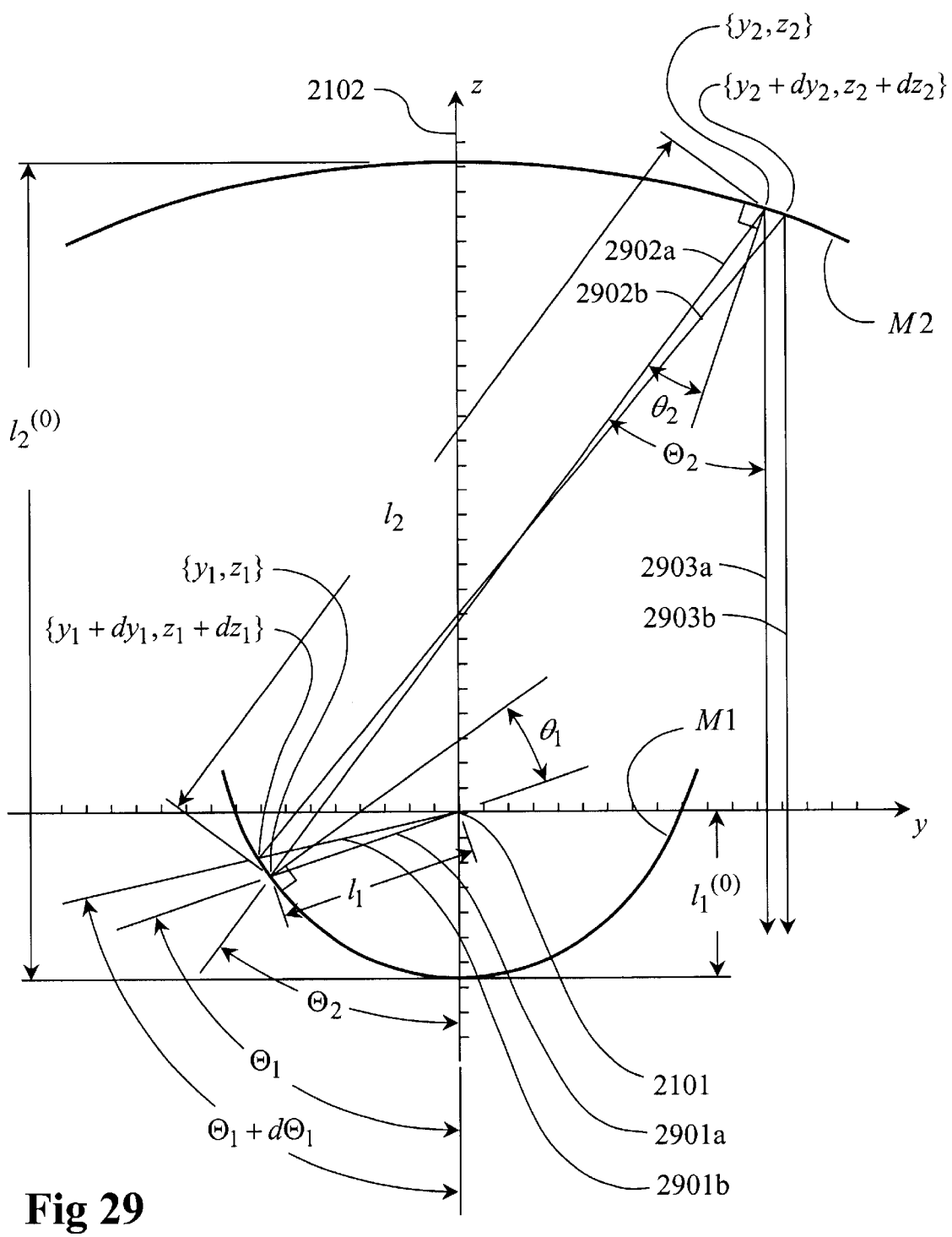
FIG. 29 illustrates design construction details for the condenser and collimator mirrors.
Figure 33:
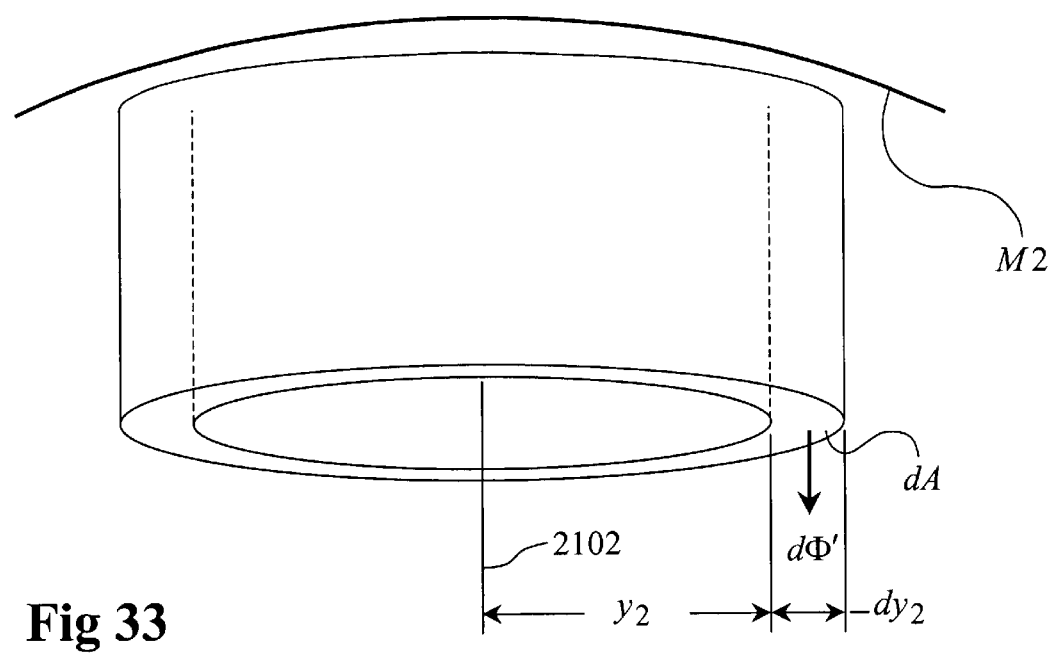
FIG. 33 illustrates an annular portion of the collimator's reflected beam corresponding to the solid angular range of FIG. 32.

The rays emitted from the source within this range define a source beam that is mapped by M1 and M2 onto an annular-aperture collimated beam with a differential cross-sectional area dA, as illustrated in FIG. 33. A meridional section of this beam in the plane of FIG. 29 is delimited by proximate rays 2903a and 2903b, and the differential beam area is $$dA = 2\pi y_2 \, dy_2 \qquad \text{Eq. 6.12}$$

The differential radiant power $d\Phi'$ transmitted in the collimated beam is equal to the 10 differential power $d\Phi$ in the source beam, attenuated by a mirror efficiency factor $\eta_{M1,M2}$, $$d\Phi' = \eta_{M1,M2} \, d\Phi \qquad \text{Eq. 6.13}$$

The spectral irradiance $E_\lambda$ in the collimated beam is the radiant power per unit area per unit wavelength interval, i.e., $$E_\lambda = \frac{d\Phi'}{d\lambda dA} = \left(\frac{d\Phi'}{d\Phi}\right)\left(\frac{d\omega}{dA}\right)\left(\frac{d\Phi}{d\lambda d\omega}\right) = \eta_{M1,M2} \frac{\sin\Theta_1 d\Theta_1}{y_2 dy_2} I_\lambda \qquad \text{Eq. 6.14}$$

Eqs. 6.10–13). The mirror efficiency factor $\eta_{M1,M2}$ is a function of wavelength $\lambda$ and of both incidence angles $\theta_1$ and $\theta_2$, $$\eta_{M1,M2} = \eta_{M1,M2}[\lambda, \theta_1, \theta_2] \qquad \text{Eq. 6.15}$$

Substituting Eqs. 6.8 and 6.15 in Eq. 6.14 and integrating over wavelength, an expression for the collimated beam's spectrally integrated irradiance E is obtained, $$E = \int E_\lambda d\lambda = \frac{\sin\Theta_1 d\Theta_1}{y_2 dy_2} \eta_{src}[\Theta_1] \int \eta_{M1,M2}[\lambda, \theta_1, \theta_2] I_{0\lambda}[\lambda] d\lambda \qquad \text{Eq. 6.16}$$

It is evident from the geometry of FIG. 29 that $$\Theta_2 = 2\theta_2 \qquad \text{Eq. 6.17}$$

$$\Theta_1 = \Theta_2 + 2\theta_1 = 2(\theta_1 + \theta_2) \qquad \text{Eq. 6.18}$$

thus the efficiency factors on the right side of Eq. 6.16 can be expressed as a function only of $\theta_1$ and $\theta_2$, $$\eta_{src}[\Theta_1] \int \eta_{M1,M2}[\lambda, \theta_1, \theta_2] I_{0\lambda}[\lambda] d\lambda = I_0 \eta[\theta_1, \theta_2] \qquad \text{Eq. 6.19}$$

wherein $$I_0 = \eta_{src}[0] \int \eta_{M1,M2}[\lambda, 0, 0] I_{0\lambda}[\lambda] d\lambda \qquad \text{Eq. 6.20}$$

$$\eta[\theta_1, \theta_2] = \frac{1}{I_0} \eta_{src}[2(\theta_1 + \theta_2)] \int \eta_{M1,M2}[\lambda, \theta_1, \theta_2] I_{0\lambda}[\lambda] d\lambda \qquad \text{Eq. 6.21}$$

Based on the assumed Mo/Be mirror coating design and source emission characteristics, Eqs. 6.20 and 6.21 can be numerically evaluated to obtain $$I_0 = 6.0 \text{ W/sr} \qquad \text{Eq. 6.22}$$

$$\eta[\theta_1, \theta_2] \approx 1 - 0.533(\theta_1^2 + \theta_2^2) - 0.804(\theta_1^4 + \theta_2^4) + 2.123\theta_1^2\theta_2^2 \qquad \text{Eq. 6.23}$$

($\theta_1$ and $\theta_2$ have units of radians in Eq. 6.23. This approximation has an accuracy of 0.003 for $\theta_1$ and $\theta_2$ in the range 0 to or $\pi/6$.) Substituting Eq. 6.19 in Eq. 6.16, the irradiance in the collimated beam is $$E = \frac{\sin\Theta_1 d\Theta_1}{y_2 dy_2} I_0 \eta[\theta_1, \theta_2]$$ Eq. 6.24

A highly desirable aspect of the mirror design is to make E constant over the beam aperture. Thus, E is assumed to be constant, and the two constants E and $I_0$ in Eq. 6.24 are combined into a single constant F representing the collection system's effective paraxial focal length, $$F = \sqrt{I_0/E}$$ Eq. 6.25

Eq. 6.24 is restated as $$dy_2 = F^2 \eta[\theta_1, \theta_2] \frac{\sin\Theta_1}{y_2} d\Theta_1$$ Eq. 6.26

The design geometry of mirrors M1 and M2 is determined by numerically solving two coupled differential equations for the mirror surface profiles. Eq. 6.26 represents one of these equations, and the other is obtained from the law of reflection, which can be expressed as a differential equation. Applying this law at point $\{y_1, z_1\}$ (FIG. 29) yields $$\left( \frac{\{y_1, z_1\}}{\sqrt{y_1^2 + z_1^2}} - \frac{\{y_2 - y_1, z_2 - z_1\}}{\sqrt{(y_2 - y_1)^2 + (z_2 - z_1)^2}} \right) \cdot \{dy_1, dz_1\} = 0$$ Eq. 6.27

Similarly, the reflection equation at point $\{y_2, z_2\}$ is $$\left( \frac{\{y_2 - y_1, z_2 - z_1\}}{\sqrt{(y_2 - y_1)^2 + (z_2 - z_1)^2}} + \{0, 1\} \right) \cdot \{dy_2, dz_2\} = 0$$ Eq. 6.28

The sum of Eqs. 6.27 and 6.28 yields an expression that can be directly integrated, $$d(\sqrt{y_1^2 + z_1^2} + \sqrt{(y_2 - y_1)^2 + (z_2 - z_1)^2} + z_2) = 0$$ Eq. 6.29

Using this equation in lieu of Eq. 6.27, there remain only two differential equations (Eqs. 6.26 and 6.28) that need to be solved numerically.

Before Eqs. 6.26, 6.28, and 6.29 can be applied, they must be augmented with a set of algebraic equations defining the relationships between the Cartesian coordinate parameters ($y_1$, $z_1$, $y_2$, and $z_2$) and the angle parameters ($\theta_1$, $\theta_2$, $\Theta_1$, and $\Theta_2$). These relationships also involve the respective lengths $l_1$ and $l_2$ of ray segments 2901a and 2902a (FIG. 29). All of these parameters will be defined as algebraic functions of three independent parameters, $\theta_1$, $\theta_2$, and $l_1$; and then the two differential equations, Eqs. 6.26 and 6.28, will be used to solve for $\theta_2$ and $l_1$ as functions of a single independent parameter, $\theta_1$.

Based on the FIG. 29 geometry, the Cartesian coordinate parameters can be represented as $$y_1 = l_1 \sin \Phi_1$$ Eq. 6.30

$$z_1 = -l_1 \cos \Phi_1$$ Eq. 6.31

$$y_2 = y_1 + l_2 \sin \Phi_2$$ Eq. 6.32

$$z_2 = z_1 + l_2 \cos \Phi_2$$ Eq. 6.33

Eqs. 6.17 and 6.18 define $\Theta_1$ and $\Theta_2$ as functions of $\theta_1$ and $\theta_2$, so the only remaining undefined parameters are $\theta_1$, $\theta_2$, $l_1$, and $l_2$. A defining relationship for $l_2$ can be obtained by integrating Eq. 6.29, $$l_1 + l_2 + z_2 = 2l_2^{(0)}$$ Eq. 6.34 wherein $l_2^{(0)}$ is an integration constant, the axial value of $l_2$ (FIG. 29). Eliminating $z_2$ between Eqs. 6.33 and 6.34, a defining equation for $l_2$ is obtained, $$l_2 = \frac{2l_2^{(0)} - l_1 - z_1}{1 + \cos\Phi_2}$$ Eq. 6.35

Eqs. 6.17, 18, 30, 31, 35, 32, and 33 are applied, in that order, to define the respective parameters $\Theta_2$, $\Theta_1$, $y_1$, $z_1$, $l_2$, $y_2$, and $z_2$ as functions of the three independent parameters $\theta_1$, $\theta_2$, and $l_1$. Then $\theta_2$ and $l_1$ are represented as undetermined functions of $\theta_1$, $$\theta_2 = \theta_2[\theta_1]$$ Eq. 6.36

$$l_1 = l_1[\theta]$$ Eq. 6.37 and Eqs. 6.26 and 6.28 define a pair of coupled differential equations that can be numerically solved for $\theta_2[\theta_1]$ and $l_1[\theta_1]$, $$\frac{dy_2}{d\theta_1} = F^2 \eta \frac{\sin\Theta_1}{y_2} \frac{d\Theta_1}{d\theta_1}$$ Eq. 6.38

$$(y_2 - y_1) \frac{dy_2}{d\theta_1} + (z_2 - z_1 + l_2) \frac{dz_2}{d\theta_1} = 0$$ Eq. 6.39

The boundary conditions on $\theta_2$ and $l_1$ are $$\theta_2[0] = 0$$ Eq. 6.40

$$l_1[0] = l_1^{(0)}$$ Eq. 6.41 wherein $l_1^{(0)}$ is the axial value of $l_1$ (FIG. 29).

The right side of Eq. 6.38 is indeterminate at $\theta_1 = 0$ because $\Theta_1$ and $y_2$ are both zero. However, the indeterminacy can be resolved by using the following limiting condition, $$\lim_{\theta_1 \to 0} \frac{\sin\Theta_1}{y_2} = \frac{1}{F}$$ Eq. 6.42

(In principle, the integration of Eqs. 6.38 and 6.39 need not start at $\theta_1 = 0$, because M1 and M2 have annular clear apertures and the axial portions of the mirrors are not optically functional. However, the advantage of integrating from $\theta_1 = 0$, and using Eq. 6.40 as a boundary condition, is that the resulting surface shape for M2 is nearly spherical, and a slight design modification described below can make it exactly spherical.)

The above design prescription for M1 and M2 has three undetermined design constants: F, $l_1^{(0)}$, and $l_2^{(0)}$. Also, the annular aperture radius limits of M2, $R_{2min}$ and $R_{2max}$ (FIG. 22) are undefined. These constants can be selected to satisfy a variety of practical constraints or performance objectives. The values used in the above design example are $R_{2min} = 154.0$ mm  Eq 6.43

$R_{2max} = 315.0$ mm  Eq 6.44

$F = 223.5$ mm  Eq 6.45

$l_1^{(0)} = 133.1$ mm  Eq 6.46

$l_1^{(0)} = 657.2$ mm  Eq 6.47

The $R_{2min}$ and $R_{2max}$ values are based on the M3 aperture layout illustrated in FIG. 23. The other three constants, F, $l_1^{(0)}$, and $l_2^{(0)}$, are determined to satisfy three design constraints: The maximum incident angle $\theta_1$ on M1 and the maximum incident angle $\theta_2$ on M2 are both set to 25°, and the optical clearance diameter around the plasma source 601 is set to 100 mm (FIG. 27).

Some practical improvements in the above design process can be made. First, although the design produces illumination of uniform irradiance across the wafer print modules, the angular divergence and polarization state of the illumination may not be uniform. These factors could have a slight effect on the microlens efficiencies, resulting in exposure nonuniformity over the wafers. However, the efficiency factor $\eta$ in Eq. 6.38 can be defined to include the microoptics' efficiency factors so that these are also compensated for in the design. Also, the efficiency factor can be defined to at least partially compensate for the ambient xenon absorption, to the extent possible with axially symmetric optics. (Any residual uncorrected errors in these factors can be compensated for in the M3, M4 coating design.)

The M1 and M2 surface shapes obtained by the above process are both aspheric. However, mirror M2 is nearly spherical (with less than 1-mm asphericity), and the optical design can be slightly modified to make it exactly spherical. The basic procedure is to first obtain a preliminary aspheric design by the above process and replace M2 with a closely fitting spherical surface. M1's surface shape is then reoptimized to satisfy the collimation condition, but ignoring the uniformity constraint. Eq. 6.39 represents the collimation constraint, but in lieu of Eq. 6.38 (the uniformity constraint) the following sphericity constraint is imposed on M2, $$y_2^2 + (z_2 - z_C)^2 = R^2 \quad \text{Eq. 6.48}$$

wherein R is the spherical radius of M2, and $z_C$ is the z coordinate of the sphere's center point. This results in a mirror design that satisfies the collimation condition, but which exhibits some nonuniformity in the illumination irradiance. The coating specification for M1 or M2 can then be adjusted to eliminate the nonuniformity (e.g., by varying the $f_{Be}$ factor in Eqs. 6.3 and 6.4 across the mirror apertures to fine-adjust the mirrors' reflectivity distribution).

§7 System Throughput

The system's throughput performance can be estimated from the design data provided in the preceding sections. The irradiance E in the collimated output from M2 is obtained from Eqs. 6.25, 6.22, and 6.45, $$E = I_0/F^2 = 0.120 \text{ mW/mm}^2 \quad \text{Eq. 7.1}$$

This value includes the reflectivity losses of M1 and M2, but not of M3 and M4; and it also neglects the ambient xenon absorption loss. Factoring in the combined reflectivity for M3 and M4 ($\eta_{M3,M4}=0.684$, Eq. 6.2) and the xenon loss ($\eta_{Xe}=0.875$, Eq. 6.1), the illumination irradiance on the printheads, $E_{illum}$, is $$E_{illum} = E \, \eta_{M3,M4} \, \eta_{Xe} = 0.0719 \text{ mW/mm}^2 \quad \text{Eq. 7.2}$$

The total illumination area $A_{illum}$ is the area per illumination field ($W'_x W'_y$; wherein $W'_x = W'_y = 22$ mm, Eqs. 1.8, 1.9), multiplied by the number of fields per wafer print module (45) and the number of modules (8), $$A_{illum} = W'_x W'_y \times 45 \times 8 = 174{,}240 \text{ mm}^2 \quad \text{Eq. 7.3}$$

The total radiant power $\Phi_{illum}$ delivered to the modules by the illumination system is $$\Phi_{illum} = E_{illum} \, A_{illum} = 12.5 \text{ W} \quad \text{Eq. 7.4}$$

The maximum power delivered to the eight wafer printing planes, $\Phi_{print}$, is obtained by multiplying the above value by the following efficiency factors: the printheads' aperture collection efficiency, $\eta_{head\,ap}=0.826$ (Eq. 1.10); the lens fill factor $\eta_{FF}=0.630$ (Eq. 1.3); the microlens transmittance $\eta_{lens}=0.169$ (Eq. 2.15); and the pellicle transmittance, $\eta_{pellicle}=0.95$ (Eq. 1.1).

$$\Phi_{print} = \Phi_{illum} \, \eta_{head\,ap} \, \eta_{FF} \, \eta_{lens} \, \eta_{pellicle} = 1.04 \text{ W} \quad \text{Eq. 7.5}$$

The resist exposure threshold is assumed to be 20 mJ/cm². To achieve good-contrast imaging for mixed positive- and negative-tone patterns this threshold level should be at approximately 25% of the maximum exposure level. Thus the maximum level, $Q_A$, is specified as $$Q_A = (20 \text{ mJ/cm}^2)/0.25 = 80 \text{ mJ/cm}^2 \quad \text{Eq. 7.6}$$

The exposure area coverage rate $A_t$ is $$A_t = \Phi_{print}/Q_A = 13.1 \text{ cm}^2/\text{sec} \quad \text{Eq. 7.7}$$

The total wafer-plane printing area $A_{print}$ scanned by the printer during a full wafer print cycle is equal to the area per scan per printhead (i.e., $W_x W_y$; wherein $W_x = W_y = 20$ mm, Eqs. 1.4, 1.5) multiplied by the number of scans per cycle (4), the number of printheads per wafer print module (45) and the number of modules (8), $$A_{print} = W_x W_y \times 4 \times 45 \times 8 \approx 5760 \text{ cm}^2 \quad \text{Eq. 7.8}$$

(Note: This area slightly overfills the wafer apertures—see FIG. 5—so the wafer-plane power $\Phi$ print does not actually all intercept the wafers. However, the printing throughput is determined by the wafer-plane power per unit area, which is independent of the actual wafer size and area coverage.) The print time per cycle, $t_{cycle}$, is $$t_{cycle} = A_{print}/A_t \approx 441 \text{ sec} \quad \text{Eq. 7.9}$$

Each cycle exposes 8 wafers, so the print time per wafer, $t_{wafer}$, is $$t_{wafer} = t_{cycle}/8 \approx 55.2 \text{ sec} \quad \text{Eq. 7.10}$$

This translates to 65 wafers per hour, not including the wafer load time and other throughput overhead factors. (A revised throughput estimate of 62 wafers per hour is obtained in the next section.)

§8 Scanning Methods

As each printhead scans the wafer, its pixels are modulated in synchronization with the LPP source to create a latent image in the resist in the form of a matrix dot pattern comprising overlapping image dots. (The "dots" could alternatively be termed "image pixels", but in the present discussion the term "pixel" is reserved for use in connection with printer pixels.) Each dot is exposed through a single printer pixel during an LPP pulse of duration <10 nsec (Ref 8). The LPP source's pulse repetition rate $\nu_{src}$ is $$\nu_{src} = 6000 \text{ Hz} \quad \text{Eq. 8.1}$$

and the exposure energy $Q_{dot}$ delivered to each dot (with the pixel in its ON state) is approximately $$Q_{dot} = \Phi_{print}/(\nu_{src} N_{pixel}) = 3.77 \times 10^{-14} \text{ J} \quad \text{Eq. 8.2}$$

which is approximately 2000 photon units (from Eqs. 1.7, 7.5, 8.1). (The exposure energy in the OFF state is assumed to be zero.) The dots are centered at the points of a rectangular printing grid on the wafer. Assuming that the grid comprises square unit cells with a step dimension G between grid points, the maximum area-averaged exposure level $Q_A$ (i.e., energy per unit area) on the wafer is $$Q_A = Q_{dot}/G^2 \qquad \text{Eq. 8.3}$$

Hence the grid step is $$G = \sqrt{Q_{dot}/Q_A} = 6.86 \text{ nm} \qquad \text{Eq 8.4}$$

(from Eqs. 7.6, 8.2).

Each dot's radial exposure profile has the form illustrated by the intensity profile $I[r_3]$ in FIG. 12. The profile's FWHM is 58 nm, an order of magnitude larger than the grid step G. Thus, a typical exposure point will receive energy from multiple overlapping dots and will hence not be strongly influenced by statistical variations in the exposure level. Also, random or isolated defects in the printer pixels will not have too significant an effect on the exposure pattern, provided that the dots exposed by any particular pixel are sparsely distributed so that there is not much overlap between them. The intensity profile $I[r_3]$ is at the 1% level at 75-nm radius (FIG. 12; Eq. 2.12), so there will be no significant overlap if the dots exposed by each pixel are separated by a minimum "proximity clearance" distance $d_{clear}$ of 150 nm, $$d_{clear} = 150 \text{ nm} \qquad \text{Eq 8.5}$$

The 6.86-nm grid step can be achieved, while maintaining the 150-nm dot separation for each pixel, by using an interleaved raster scan technique in which individual pixels print coarsely-spaced rectangular arrays of dots which are spatially interleaved to form much more finely-spaced dot patterns. Two versions of this method are described below. In one method, termed "lens-scan", each printhead and its attached microlenses scan across a stationary wafer during wafer exposure. Four scans are performed, each covering approximately 25% of the wafer area, and the wafer is stepped between scans to provide nearly full wafer coverage. (FIG. 5 illustrates the wafer's four scan positions as 501a, 501b, 501c, and 501d.) In the alternative method, termed "wafer-scan", the wafer moves in relation to substantially stationary printheads. (The printheads would actually have to be positionally actuated with either method to maintain accurate alignment and focus, but the required positional range would be at least an order of magnitude less with the wafer-scan method. In a variant of this approach the printheads could be actuated to only control focus, while the second-stage microlenses are individually actuated to maintain lateral alignment.)

The basic design principles underlying the scan methods can be conceptually illustrated by first considering several one-dimensional scan methods in which a single row of pixels exposes a single row of image dots. For simplicity, it is assumed here that the pixels are all kept in their ON states during exposure, so the resulting exposure pattern will comprise a row of exposed dots at the specified center spacing G (the printing grid step) without any gaps or duplicate exposures. Considering a particular dot row, its dots are grouped into a multilevel subset hierarchy as follows. The top level of the hierarchy comprises subgroups Dots[i]; wherein i is an integer index that labels the printheads, and Dots[i] is the set of dots that are exposed by printhead i. (This printhead is designated as Head[i].) At the next level, each subgroup Dots[i] itself comprises subgroups Dots[i,j]; wherein j is an integer index that labels separate scans, and Dots[i,j] is the set of dots in Dots[i] that are exposed during scan j. (This scan is designated as Scan[j]. The minimal rectangular area covering Dots[i,j] is termed a "scan field", which is designated as Field[i,j].) Dots[i,j] further comprises subgroups Dots[i,j,k]; wherein k is an integer index that labels the specific pixels in Head[i] that cover the dot row, and Dots[i,j,k] is the set of dots in Dots[i,j] that are exposed during Scan[j] through pixel k in Head[i]. (This pixel is designated as Pixel[i,k].) Finally, Dots[i,j,k] comprises individual dots Dot[i,j,k,l]; wherein l is an integer index that identifies the exposure pulses during Scan[j], and Dot[i,j,k,l] is the specific dot in Dots[i,j,k] that is exposed by pulse l in Scan[j]. (This pulse is designated as Pulse[j,l].)

FIGS. 34A and 34B illustrate a simple sequential dot row exposure pattern in which each pixel exposes a contiguous sequence of dots. In this example, all the dots are exposed with a single printhead, in a single scan. For notational consistency, the printhead and scan will be identified respectively as Head[0] and Scan[0] (i.e., i=0 and j=0 in the above notation). The pixels are designated as Pixel[0,k] (k=..., –1, 0, 1, ...), and the dots printed by pixel Pixel[0,k] are designated as Dot[0,0,k,l] (l=0, 1, 2, ...). The large circles in FIGS. 34A and 34B and subsequent figures represent the pixels' first-stage lens apertures; the small circles indicate center points of image dots that have been exposed; and the "+" marks indicate center points of unexposed dots. One particular pixel (Pixel[0,0]) is highlighted, and the dots printed by this pixel (Dot[0,0,0,0], Dot[0,0,0,1], etc.) are represented by filled-in circles. FIG. 34A illustrates the dot exposure pattern when the scan is halfway to completion, and FIG. 34B illustrates the pattern after completion. The scan direction is indicated as X, and the dot center spacing in the X direction (i.e., the scan distance per exposure pulse) is $G_x$. ($G_x$ is nominally equal to the printing grid step G defined in Eq. 8.4. For two-dimensional printing, the grid cells may not necessarily be perfectly square, so the cell dimensions will be denoted as $G_x$ and $G_y$.) The pixel center spacing is $\Delta X_{pixel} G_x$, wherein $\Delta X_{pixel}$ is an integer (e.g., $\Delta X_{pixel} = 16$ in FIGS. 34A and 34B), and the number of exposure pulses per scan line, $N_{pulse/line}$, is equal to $\Delta X_{pixel}$, $$N_{pulse/line} = \Delta X_{pixel} \qquad \text{Eq. 8.6}$$

Thus, after the scan is completed, (FIG. 34B) the contiguous dot groups Dots[0,0,k] (k=..., –1, 0, 1, ...) form an uninterrupted, uniformly spaced row of dots without any gaps, duplicate exposures, or spacing discontinuities between groups.

With the above scan method the dots printed by each pixel are closely clustered in a small region, so pixel defects or non-functional pixels could result in unacceptable printing errors. This limitation is overcome by using the interleaved exposure pattern illustrated in FIGS. 35A and 35B. (FIG. 35A shows the scan halfway to completion, and FIG. 35B shows the completed scan.) With this method, the scan distance per exposure pulse is $\Delta X_{pulse} G_x$, wherein $\Delta X_{pulse}$ is an integer; and each pixel prints a regularly-spaced dot sequence with a dot centering interval of $\Delta X_{pulse} G_x$. The pixel center spacing is $\Delta X_{pixel} G_x$, as in FIGS. 34A and 34B. $\Delta X_{pixel}$ and $\Delta X_{pulse}$ are relatively prime integers (e.g., $\Delta X_{pixel} = 16$ and $\Delta X_{pulse} = 3$ in FIGS. 35A and 35B), $$\text{GCD}[\Delta X_{pixel}, \Delta X_{pulse}] = 1 \qquad \text{Eq. 8.7}$$

wherein "GCD" denotes the greatest common divisor. The relative primality condition implies that an infinite row of pixels would fully expose an infinite, uniformly spaced row of dots at the grid step interval $G_x$, without gaps or duplicate exposures, if the number of exposure pulses $N_{pulse/line}$ is equal to $\Delta X_{pixel}$ (Eq. 8.6). Also, if $\Delta X_{pulse}$ is sufficiently large the dots printed by a particular pixel will not overlap significantly, although there will be significant overlap between dots printed by different pixels. Hence, printing errors due to isolated pixel defects or non-functional pixels will be significantly mitigated.

Figure 36A:
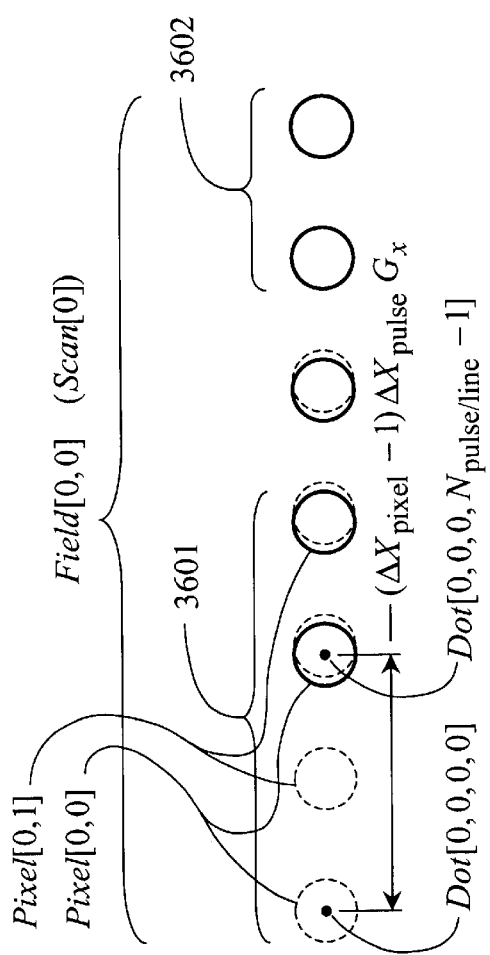
FIGS. 36A and 36B illustrate a variant of the interleaved scan technique in which a printhead comprising a pixel row with a finite number of pixels is iteratively stepped and scanned to cover a dot row of indefinite extent.
Figure 36B:
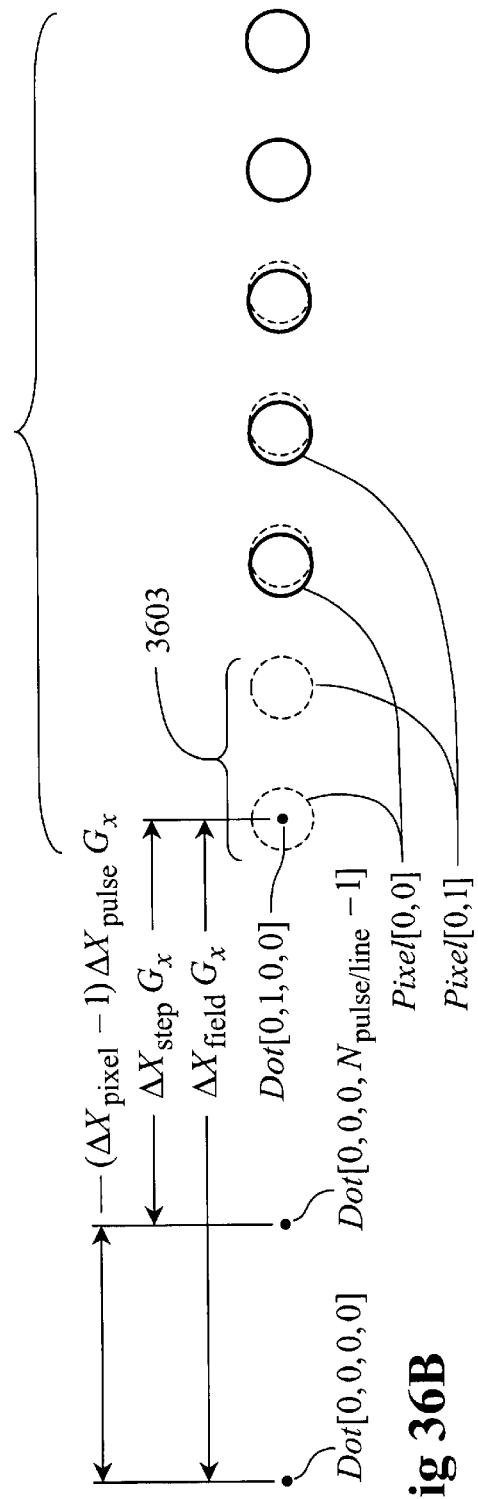

FIGS. 36A and 36B illustrate a variant of the interleaved scan technique in which a printhead comprising a pixel row with a finite number of pixels is iteratively stepped and scanned to cover a dot row of indefinite extent, with each scan comprising $N_{pulse/line}$ exposure pulses on the dot row. As in FIGS. 35A and 35B, the scan distance per pulse is $\Delta X_{pulse}\ G_x$, the pixel center spacing is $\Delta X_{pixel}\ G_x$, and $N_{pulse/line}$ is equal to $\Delta X_{pixel}$. (The restriction on the number of pulses per scan line can be effectively removed by using a "transitionless scan" method, which is discussed below.) The number of pixels per printhead pixel row is denoted as $N_{pixel/row}$ (e.g., $N_{pixel/row}=5$ in FIGS. 36A and 36B). FIG. 36A illustrates a pixel row comprising pixels Pixel[0,0], Pixel[0,1], . . . , Pixel[0, $N_{pixel/row}$ −1] at two positions: at the start of Scan[0] (dashed circles), and at the end of Scan[0] (solid circles); and FIG. 36B similarly illustrates the pixels at the start and end of Scan[1]. The printhead (Head[0]) covers a scan field indicated as Field[0,0] during Scan[0], and covers Field[0,1] during Scan[1]. The wafer is stepped between successive scans, and the distance between the start positions of consecutive scans (e.g., the center distance between Dot[0,0,0,0] and Dot[0,1,0,0]) is $\Delta X_{field}\ G_x$, wherein $$\Delta X_{field} = N_{pixel/row}\ \Delta X_{pixel} \qquad \text{Eq. 8.8}$$

This distance is selected so that the position occupied by each pixel, Pixel[0,k] (k=0 . . . $N_{pixel/row}$ −1) during Scan[j] (j=1, 2, . . . ) coincides with the position that would be occupied by Pixel[0, j $N_{pixel/row}$+k] during Scan[0] if the pixel row were extended to include more than $N_{pixel/row}$ pixels. In other words, the multi-scan exposure pattern is identical to the pattern that would be produced with a single scan, using an extended pixel row.

Figure 37:
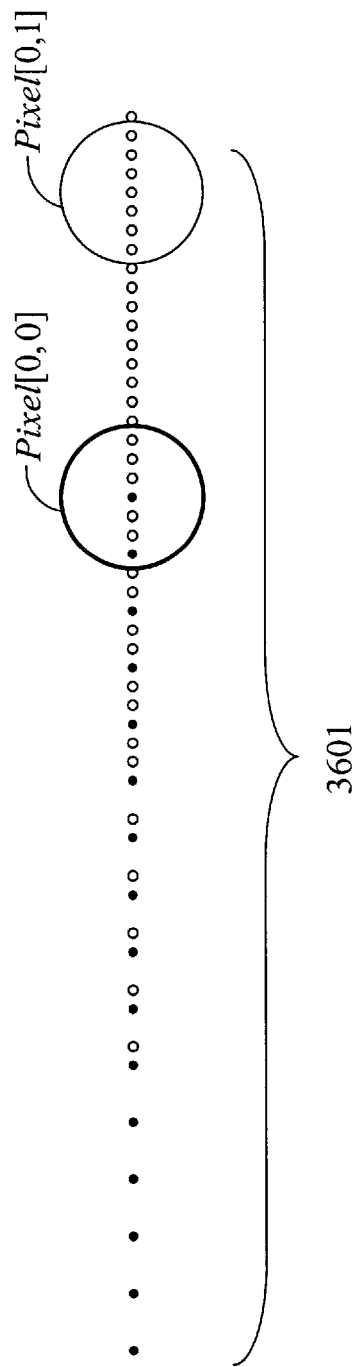
FIG. 37 illustrates exposure gaps in the "stitch zone" at the boundary of a scan field.

The dot pattern generated by an individual scan and printhead, such as Dots[0,0] or Dots[0,1], will have gaps in the exposure pattern near the ends of the corresponding scan field. For example, the end region 3601 of Field[0,0] in FIG. 36A is illustrated at a larger scale in FIG. 37, showing details of the completed exposure pattern with gaps. (FIG. 37 is the same as FIG. 35B, except that there are no negative-numbered pixels Pixel[0,−1], Pixel[0,−2], etc., and no negative-numbered scans.) The incompletely exposed regions bordering each scan field are termed "stitch zones". The stitch zones of adjacent scan fields (e.g., zones 3602 in FIG. 36A and 3603 in FIG. 36B) are overlapped (i.e., "stitched"), with each seamlessly filling in the exposure gaps in the other.

Figure 38:
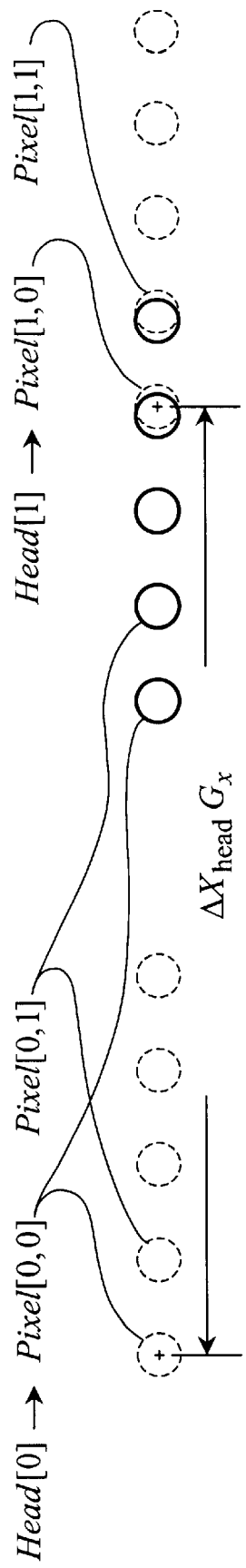
FIG. 38 illustrates the positional relationship between two adjacent printheads.

When multiple printheads are employed, their scan patterns can be designed so adjacent scan fields printed by different printheads are similarly stitched. The design approach is illustrated as follows. Each dot row is exposed through multiple printheads (Head[0], Head[1], etc.) and multiple scans, Scan[0], Scan[1], . . . , Scan[$N_{x\ scan}$−1]; wherein $N_{x\ scan}$ is the number of scans and Scan[j] comprises pulse exposures Pulse[j,0], Pulse[j,1], . . . , Pulse[j, $N_{pulse/line}$ −1]. For example, FIG. 38 illustrates pixel rows on two printheads, Head[0] comprising Pixel[0,0], Pixel[0,1], etc., and Head[1] comprising Pixel[1,0], Pixel[1,1], etc. The pixels are illustrated at two positions: at Pulse[0,0] (i.e., the first pulse of Scan[0], indicated by dashed circles), and at Pulse[$N_{x\ scan}$−1, $N_{pulse/line}$ −1] (the last pulse of Scan[$N_{x\ scan}$−1], solid circles). The positional displacement between adjacent printheads is $\Delta X_{head}\cdot G_x$, wherein $$\Delta X_{head} = N_{x\ scan}\ \Delta X_{field} \qquad \text{Eq. 8.9}$$

This value is chosen so that if the exposure sequence were to be continued past the last scan, the position of Head[0] at Pulse[$N_{x\ scan}$, 0] would coincide with the position of Head [1] on Pulse[0,0]. For example, in FIG. 38 Pixel[0,0] (solid circle) would step to the first position occupied by Pixel[1,0] (dashed circle). Hence the exposure pattern obtained with multiple printheads is equivalent to the pattern that would be obtained with a single printhead by extending its printing range (i.e., increasing the number of scans). Consequently, adjacent printheads' stitch zones are exactly complementary, with each seamlessly filling in the other's exposure gaps.

It is presumed above that the number of scans $N_{x\ scan}$ is integer-valued, but in some circumstances it need not be. The last scan could be terminated prior to completion, and $\Delta X_{head}$ could be selected so that, for example, the exposure pattern printed by Head[0] is continued from its termination point by Head[1]. In this case, $N_{x\ scan}$ could have a fractional value. A fundamental problem with this "fractional scan" printing method is that if, for example, Head[0] completely scans all but the last of its scan fields, with the remaining portion of the last field being covered by Head[1] on its first scan, then Head[1] will complete its first (fractional) scan before Head[0] completes its first (full) scan. Thus the field stepping between scans would not be synchronized between printheads. Of course, this limitation would not be relevant if only one printhead is employed (or if the system is not intended to provide seamless image stitching between printheads). Furthermore, there is one particular circumstance, described below, in which asynchronous stepping would be practical and the fractional scan method could be used to advantage.

Scan[j] comprises pulse exposures Pulse[j,0], Pulse[j,1], . . . , Pulse[j, $N_{pulse/line}$ −1], wherein the number of pulses ($N_{pulse/line}$) is equal to $\Delta X_{pixel}$ (Eq. 8.6). The scanning element (i.e., the printhead or the wafer) moves a distance of $\Delta X_{pulse}\ G_x$ between pulses, so the scan distance traversed between the start and end positions of each scan is ($\Delta X_{pixel}$−1) $\Delta X_{pulse}\ G_x$ (FIG. 36A). Also, the distance between the start positions of consecutive scans is $\Delta X_{field}\ G_x = N_{pixel/row}\ \Delta X_{pixel}\ G_x$ (FIG. 36B, Eq. 8.8); thus the stepping distance from a scan's end position to the next scan's start position is $\Delta X_{step}\ G_x$, wherein $$\Delta X_{step} = N_{pixel/row}\ \Delta X_{pixel} - (\Delta X_{pixel}-1)\Delta X_{pulse} \qquad \text{Eq. 8.10}$$

For some scan strategies (in particular, the wafer-scan method), it may be convenient to set $N_{pixel/row} = \Delta X_{pulse}$ so that $\Delta X_{step} = \Delta X_{pulse}$ and the stepping distance ($\Delta X_{step}\ G_x$) is equal to the scan distance per pulse ($\Delta X_{pulse}\ G_x$). In this case, the process of "stepping" between two consecutive scans is indistinguishable from simply continuing the first scan without interruption. Since there are no stepping transitions between scans, the printheads can step asynchronously and the fractional scan method can be employed. The separate "scans" (as defined above) can be considered to constitute portions of a single, extended scan, which will be termed a "transitionless scan", and this scanning mode will be termed "transitionless scanning".

The defining condition for transitionless scanning is $$N_{pixel/row} = \Delta X_{pulse} \text{ (transitionless scan)} \qquad \text{Eq. 8.11}$$

Under this condition the $N_{x\ scan}$ factor in Eq. 8.9 need not be integer-valued, and the only fundamental restriction on $\Delta X_{head}$ is that it must be an integer multiple of $\Delta X_{pulse}$ in order to maintain pulse synchronization between printheads;

$$\Delta X_{head} = N_{x\ pulse} \Delta X_{pulse} \qquad \text{Eq. 8.12}$$

wherein $N_{x\ pulse}$ is the total number of exposure pulses on the dot row. (As a practical consideration, $N_{x\ pulse}$ must be sufficiently large to ensure mechanical clearance between adjacent printheads.) The scan-related parameters defined above ($N_{pulse/line}$, $\Delta X_{field}$, $N_{x\ scan}$) and related equations (Eqs. 8.6, 8.8, 8.9) are not very relevant to a transitionless scan. Instead, transitionless scanning can be characterized by corresponding primed quantities ($N'_{pulse/line}$, $\Delta X'_{field}$, $N'_{x\ scan}$), which are defined as follows:

$$N'_{pulse/line} = N_{x\ pulse} \qquad \text{Eq. 8.13}$$

$$\Delta X'_{field} = \Delta X_{head} \qquad \text{Eq. 8.14}$$

$$N'_{x\ scan} = 1 \qquad \text{Eq. 8.15}$$

(i.e., each printhead's scan fields are effectively merged into a single transitionless scan field). If there is only one printhead, Eqs. 8.14 and 8.15 are not relevant and the printhead could simply traverse a scan field of unlimited extent without stepping.

The design principles outlined above can be readily generalized from one-dimensional to two-dimensional scanning. In the same way that image dots are combined in line scan patterns to form image lines, the image lines can be combined in raster scan patterns to form two-dimensional images; and techniques such as scan interleaving and field stitching can be similarly applied in the second dimension. The notational designations used above for one-dimensional printing (e.g., Head[i], Scan[j], Pixel[i,k], Pulse[j,l], Dot[i,j,k,l], etc.) can be adapted to two-dimensional printing. But in this context the printheads, scan fields, pixels, and exposure positions within each scan all generalize to two-dimensional arrays, so the indexing labels i,j,k, and l are reinterpreted as two-component indices, as outlined below:

$i = \{i_x, i_y\}$: printhead indices $j = \{j_x, j_y\}$: scan indices $k = \{k_x, k_y\}$: pixel indices $l = \{l_x, l_y\}$: exposure pulse indices  Eq. 8.16

For brevity, the following notation will be used for zero indices, $$\vec{0} = \{0, 0\} \qquad \text{Eq. 8.17}$$

Figure 39:
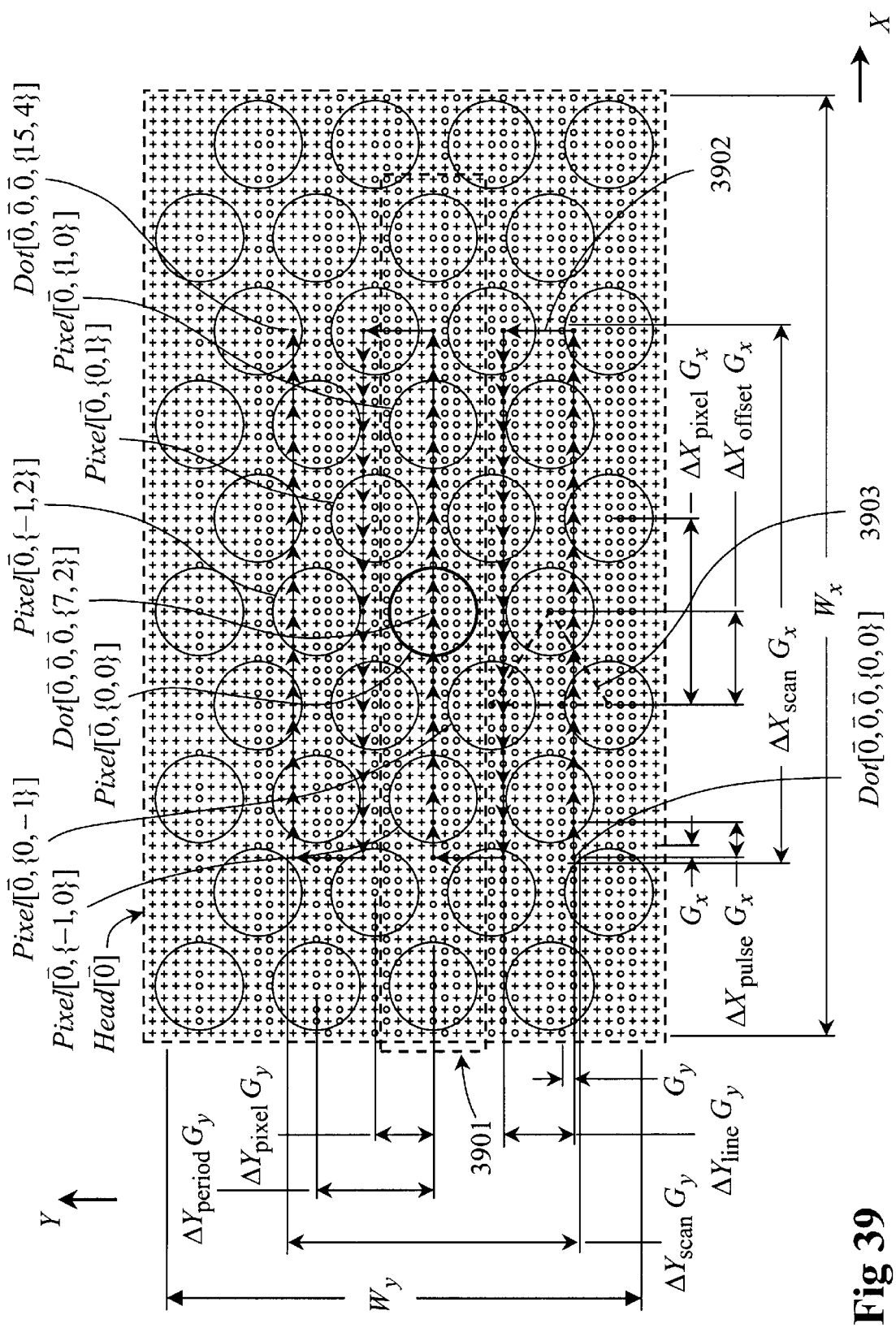
FIG. 39 illustrates a printhead and scan path for the "lens-scan" scanning method.

FIG. 39 illustrates a printhead (Head[$\vec{0}$]) comprising pixels designated as Pixel[$\vec{0}$, $\{k_x, k_y\}$]; wherein $k_x$ and $k_y$ are integers. The $k_y$ index labels the printer rows (i.e., all the pixels in any particular row, such as row 3901, have the same $k_y$ index), and $k_x$ identifies the pixels in each row. The figure also illustrates a portion of an exposure pattern generated by Head[$\vec{0}$] and Scan[$\vec{0}$]. The pattern comprises image dots designated as Dot[$\vec{0}, \vec{0}, \{k_x, k_y\}, \{l_x, l_y\}$], each of which is printed by a corresponding pixel, Pixel[$\vec{0}$, $\{k_x, k_y\}$]; wherein $l_x$ and $l_y$ are integers associated with Pulse[$\vec{0}$, $\{l_x, l_y\}$]. The dots exposed by any particular pixel are centered at the points of a two-dimensional rectangular grid, and the $l_x$ and $l_y$ indices label the dot column and row positions within this grid. (The "x" subscripts in the indices are associated with the scan direction, which is indicated as X in FIG. 39; and the "y" subscripts are associated with the cross-scan direction, indicated as Y. The pulse indices $l_x$ and $l_y$ are not necessarily related to the time-sequential order of the exposure pulses.)

Following is a reference list of terms, notation, and parameters that relate to two-dimensional scanning. (Some notational modifications would need to be made for transitionless scanning.)

Head[i] printhead

Scan[j] raster scan

Field [i,j] scan field corresponding to Head[i], Scan[j]

Pixel[i,k] individual pixel in Head[i]

Pulse[j,l] individual exposure pulse in Scan[j]

Dot[i,j,k,l] image dot printed by Pixel[i,k], Pulse[j,l]

Dots[i,j,k] union over l of Dot[i,j,k]

Dots[i,j] union over k of Dots[i,j,k]

Dots[i] union over j of Dots[i,j]

$W_x$, $W_y$ nominal printhead aperture dimensions $G_x$, $G_y$ printing grid cell dimensions $N_{pulse/line}$ number of exposure pulses per scan line $N_{line/scan}$ number of scan lines per raster scan $N_{pulse/scan}$ number of exposure pulses per raster scan $N_{pixel/row}$ number of pixels per printhead pixel row $N_{row/head}$ number of pixel rows per printhead $N_{pixel/head}$ number of pixels per printhead $N_{row/period}$ number of pixel rows per period in the Y direction $N_{period/head}$ number of Y periods per printhead $N_{x\ scan}$ number of scans in the X direction $N_{y\ scan}$ number of scans in the Y direction $N_{scan}$ number of scans, total $\Delta X_{pulse}$ $G_x$ scan distance per pulse $\Delta Y_{line}$ $G_y$ scan line spacing $\Delta X_{scan}$ $G_x$ raster scan X range $\Delta Y_{scan}$ $G_y$ raster scan Y range $\Delta X_{pixel}$ $G_x$ pixel center spacing in the X direction $\Delta X_{offset}$ $G_x$ X offset between pixel rows $\Delta Y_{pixel}$ $G_y$ pixel row spacing in the Y direction $\Delta Y_{period}$ $G_y$ pixel periodicity dimension in the Y dimension $\Delta X_{field}$ $G_x$ X displacement between scan fields ($= W_x$)

$\Delta Y_{field}$ $G_y$ Y displacement between scan fields ($= W_y$)

$\Delta X_{stitch}$ $G_x$ stitch zone X width $\Delta Y_{stitch}$ $G_y$ stitch zone Y width $\Delta X_{head}$ $G_x$ X displacement between printheads $\Delta Y_{head}$ $G_y$ Y displacement between printheads $X_{dot}[i,j,k,l]$ $G_x$ X coordinate of Dot[i,j,k,l]

$Y_{dot}[i,j,k,l]$ $G_y$ Y coordinate of Dot[i,j,k,l]

$X_{pixel}[i,j,k]$ $G_x$ X coordinate of Pixel[i,k] at Pulse[j,$\vec{0}$]

$Y_{pixel}[i,j,k]$ $G_y$ Y coordinate of Pixel[i,k] at Pulse[j,$\vec{0}$]

FIG. 39 is a two-dimensional generalization of FIG. 35A, showing a typical raster scan halfway to completion. Each pixel traverses a serpentine, raster-scan path over the wafer, exposing a rectangular array of image dots in synchronization with the pulsed LPP source. For example, the highlighted pixel (Pixel[$\vec{0}, \vec{0}$]) follows the scan path 3902 (with the time sequence indicated by the arrows), exposing dots designated as $\text{Dot}[\vec{0},\vec{0},\vec{0},\{l_x,l_y\}]$; $l_x=0, 1, \ldots 15$, $l_y=0, 1, \ldots, 4$. (The dots that have been exposed by this pixel at the scan halfway point are indicated as filled-in circles.)

The dot center spacing in the X direction is $G_x$, and the spacing in the Y direction is $G_y$. The scan distance covered between exposure pulses is $\Delta X_{pulse}\, G_x$, and the scan line spacing is $\Delta Y_{line}\, G_y$; wherein $\Delta X_{pulse}$ and $\Delta Y_{line}$ are integers (e.g., $\Delta X_{pulse}=3$ and $\Delta Y_{line}=6$ in FIG. 39). The number of exposure pulses per scan line is designated as $N_{pulse/line}$, the number of scan lines per raster scan is designated as $N_{line/scan}$, and the total number of pulses per raster scan, $N_{pulse/scan}$, is $$N_{pulse/scan}=N_{pulse/line}\, N_{line/scan} \qquad \text{Eq. 8.18}$$

The region scanned by each pixel has nominal X and Y dimensions of $\Delta X_{scan}\, G_x$ and $\Delta Y_{scan}\, G_y$, wherein $$\Delta X_{scan}=N_{pulse/line}\, \Delta X_{pulse} \qquad \text{Eq. 8.19}$$

$$\Delta Y_{scan}=N_{line/scan}\, \Delta Y_{line} \qquad \text{Eq. 8.20}$$

The pixel center spacing in the X direction is $\Delta X_{pixel}\, G_x$, the spacing between pixel rows in the Y direction is $\Delta Y_{pixel}\, G_y$, and there is an X offset of $\Delta X_{offset}\, G_x$ between adjacent pixel rows; wherein $\Delta X_{pixel}$, $\Delta Y_{pixel}$, and $\Delta X_{offset}$ are integers (e.g., $\Delta X_{pixel}=16$, $\Delta Y_{pixel}=5$, and $\Delta X_{offset}=8$ in FIG. 39). Neglecting the printhead size limits, the pixel array is periodic in the X direction with a spatial period of $\Delta X_{pixel}\, G_x$, and is periodic in the Y direction with a period of $\Delta Y_{period}\, G_y$, wherein $$\Delta Y_{period}=N_{row/period}\, \Delta Y_{pixel} \qquad \text{Eq. 8.21}$$

$N_{row/period}$ is the number of pixel rows per period, $$N_{row/period}=\begin{cases} 1 & \text{if } \Delta X_{offset}=0 \\ \Delta X_{pixel}/GCD[\Delta X_{pixel}, \Delta X_{offset}] & \text{if } \Delta X_{offset}>0 \end{cases} \qquad \text{Eq. 8.22}$$

(e.g., $N_{row/period}=2$ and $\Delta Y_{period}=10$ in FIG. 39).

$N_{pulse/line}$ is equal to $\Delta X_{pixel}$, and $N_{line/scan}$ is equal to $\Delta Y_{pixel}$, $$N_{pulse/line}=\Delta X_{pixel} \qquad \text{Eq. 8.23}$$

$$N_{line/scan}=\Delta Y_{pixel} \qquad \text{Eq. 8.24}$$

$\Delta X_{pixel}$ and $\Delta X_{pulse}$ are relatively prime, and $\Delta Y_{pixel}$ and $\Delta Y_{line}$ are relatively prime, $$GCD[\Delta X_{pixel},\Delta X_{pulse}]=1 \qquad \text{Eq. 8.25}$$

$$GCD[\Delta Y_{pixel},\Delta Y_{line}]=1 \qquad \text{Eq. 8.26}$$

It follows from Eqs. 8.23–26 that an infinite array of pixels would fully expose an infinite dot array at the specified grid cell dimensions $G_x$ and $G_y$, without gaps or duplicate exposures, in a single raster scan consisting of $N_{line/scan}$ line scans and $N_{pulse/line}$ exposure pulses per line.

The positional coordinates of a particular dot, $\text{Dot}[i,j,k,l]$, relative to an $\{X, Y\}$ coordinate system with the origin at $\text{Dot}[\vec{0},\vec{0},\vec{0},\vec{0}]$, are denoted as $\{X_{dot}[i,j,k,l]G_x, Y_{dot}[i,j,k,l]G_y\}$ (FIG. 40); wherein $X_{dot}$ and $Y_{dot}$ are integer-valued functions. These functions have the form $$X_{dot}[i,j,k,l]=X_{pixel}[i,j,k]+l_x\, \Delta X_{pulse} \qquad \text{Eq. 8.27}$$

$$Y_{dot}[i,j,k,l]=Y_{pixel}[i,j,k]+l_y\, \Delta Y_{line} \qquad \text{Eq. 8.28}$$

wherein the $X_{pixel}$ and $Y_{pixel}$ functions are related to the pixels' positional distribution. The range limits on the pulse indices $l_x$ and $l_y$ in Eqs. 8.27, 28 are $$0<l_x<N_{pulse/line} \qquad \text{Eq. 8.29}$$

$$0<l_y<N_{line/scan} \qquad \text{Eq. 8.30}$$

The positional coordinate offset from $\text{Pixel}[\vec{0},\vec{0}]$ at the time of $\text{Pulse}[\vec{0},\vec{0}]$ to $\text{Pixel}[i,k]$ at $\text{Pulse}[j,\vec{0}]$ is $\{X_{pixel}[i,j,k]G_x, Y_{pixel}[i,j,k]G_y\}$ (FIG. 41). For the configuration shown in FIG. 39 ($i=j=\vec{0}$), the $X_{pixel}$ and $Y_{pixel}$ functions are specified as $$X_{pixel}[\vec{0},\vec{0},k]=k_x\, \Delta X_{pixel}+k_y\, \Delta X_{offset} \qquad \text{Eq. 8.31}$$

$$Y_{pixel}[\vec{0},\vec{0},k]=k_y\, \Delta Y_{pixel} \qquad \text{Eq. 8.32}$$

A printhead's pixels are labeled by $\{k_x,k_y\}$ indices that are within the following range limits, $$0\leq k_y < N_{row/head} \qquad \text{Eq. 8.33}$$

$$0\leq k_x\, \Delta X_{pixel}+k_y\, \Delta X_{offset} < N_{pixel/row}\, \Delta X_{pixel} \qquad \text{Eq. 8.34}$$

wherein $N_{pixel/row}$ is the number of pixels per printhead pixel row and $N_{row/head}$ is the number of pixel rows per printhead (e.g., $N_{pixel/row}=5$ and $N_{row/head}=8$ in FIG. 39). The total number of pixels per printhead, $N_{pixel/head}$, is $$N_{pixel/head}=N_{pixel/row}\, N_{row/head} \qquad \text{Eq. 8.35}$$

It may be convenient, from the perspective of design simplicity, to choose the number of pixel rows to be a whole number of periods, i.e., $N_{row/head}$ is defined as $$N_{row/head}=N_{period/head}\, N_{row/period} \qquad \text{Eq. 8.36}$$

wherein $N_{period/head}$ is an integer (the number of Y periods per printhead; e.g., $N_{period/head}=4$ in FIG. 39). However, this is not a necessary design requirement, and $N_{period/head}$ can optionally be fractional.

The nominal printhead aperture dimensions $W_x$ and $W_y$ (FIGS. 3, 39) are $$W_x=\Delta X_{field}\, G_x \qquad \text{Eq. 8.37}$$

$$W_y=\Delta Y_{field}\, G_y \qquad \text{Eq. 8.38}$$

wherein $$\Delta X_{field}=N_{pixel/row}\, \Delta X_{pixel} \qquad \text{Eq. 8.39}$$

$$\Delta Y_{field}=N_{row/head}\, \Delta Y_{pixel} \qquad \text{Eq. 8.40}$$

Each printhead exposes a scan field that is slightly larger than the printhead aperture. For example, FIG. 42 illustrates a particular printhead ($\text{Head}[\vec{0}]$, represented by its aperture boundary 4201), which scans a particular field ($\text{Field}[\vec{0},\vec{0}]$). As the printhead raster-scans the field, its boundary 4201 sweeps across a "stitch zone" (indicated by the hatched area 4202) which borders the field. The stitch zone's width dimensions in the X and Y directions are $\Delta X_{stitch}\, G_x$ and $\Delta Y_{stitch}\, G_y$ wherein $$\Delta X_{stitch}=\Delta X_{scan} \qquad \text{Eq. 8.41}$$

$$\Delta Y_{stitch}=\Delta Y_{scan} \qquad \text{Eq. 8.42}$$

The scan field's respective X and Y dimensions (including the stitch zone) are $W_x+\Delta X_{stitch}\, G_x$ and $W_y+\Delta Y_{stitch}\, G_y$.

In a multi-scan printing process, $W_x$ and $W_y$ are also the X and Y displacements, respectively, between scan fields.

Figure 43:
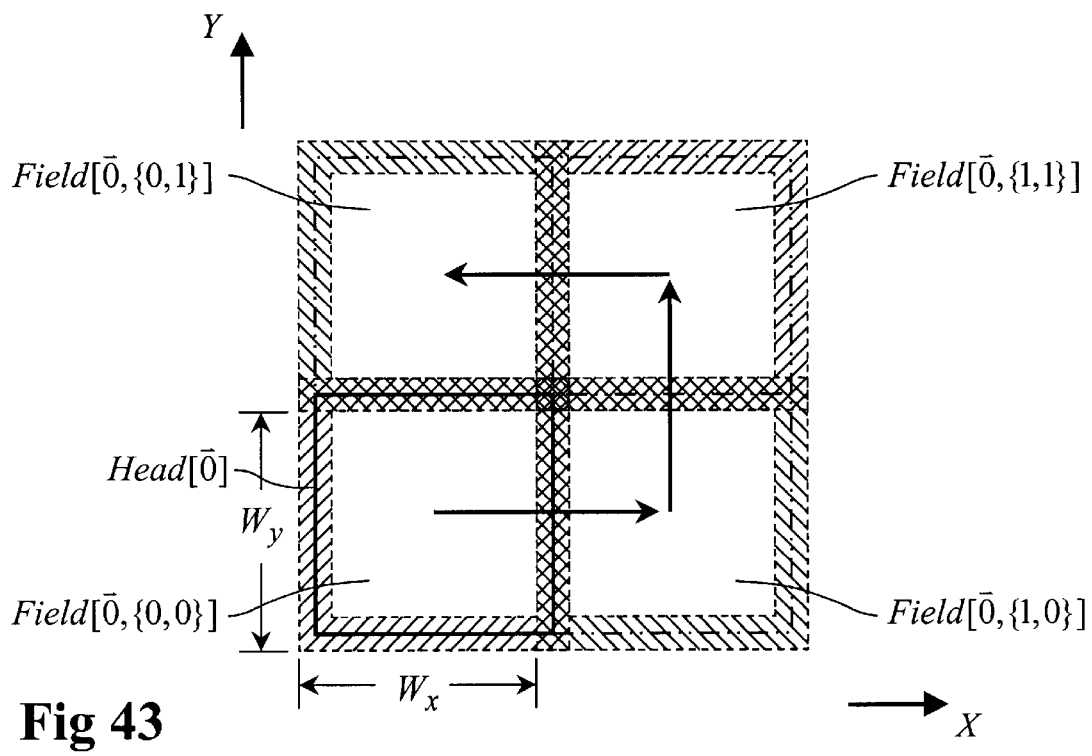
FIG. 43 illustrates four juxtaposed scan fields covered by a single printhead in separate scans.

For example, FIG. 43 illustrates a printhead (Head[$\vec{0}$]), which prints four scan fields. It first raster-scans Field[$\vec{0}$,{0,0}], steps and scans Field[$\vec{0}$,{1,0}], steps and scans Field[$\vec{0}$,{1,1}], and then steps and scans Field[$\vec{0}$,{0,1}]. Each particular scan provides only partial exposure coverage over the corresponding field's stitch zone, cf. FIG. 37. (The stitch zones are indicated as hatched areas in FIG. 43.) But over the areas where adjacent scan fields overlap (indicated by intersecting hatched areas) the separate scans seamlessly fill in each other's gaps.

The positional coordinates of Pixel[$\vec{0}$,k] in Head[$\vec{0}$] at the time of Pulse[j,$\vec{0}$] (i.e., at the start of Scan[j]) are $\{X_{pixel}[\vec{0},j,k]G_x, Y_{pixel}[\vec{0},j,k]G_y\}$, wherein $$X_{pixel}[\vec{0},j,k]=X_{pixel}[\vec{0},\vec{0},k]+j_x \Delta X_{field} \quad \text{Eq. 8.43}$$

$$Y_{pixel}[\vec{0},j,k]=Y_{pixel}[\vec{0},\vec{0},k]+j_y \Delta Y_{field} \quad \text{Eq. 8.44}$$

In Eqs. 8.43, 44 the range limits on the scan indices $j_x$ and $j_y$ are $$0 \leq j_x < N_{x\,scan} \quad \text{Eq. 8.45}$$

$$0 \leq j_y < N_{y\,scan} \quad \text{Eq. 8.46}$$

wherein $N_{x\,scan}$ and $N_{y\,scan}$ are the number of scans in the X and Y directions, respectively. The total number of scans, $N_{scan}$, is $$N_{scan}=N_{x\,scan} N_{y\,scan} \quad \text{Eq. 8.47}$$

Figure 44:
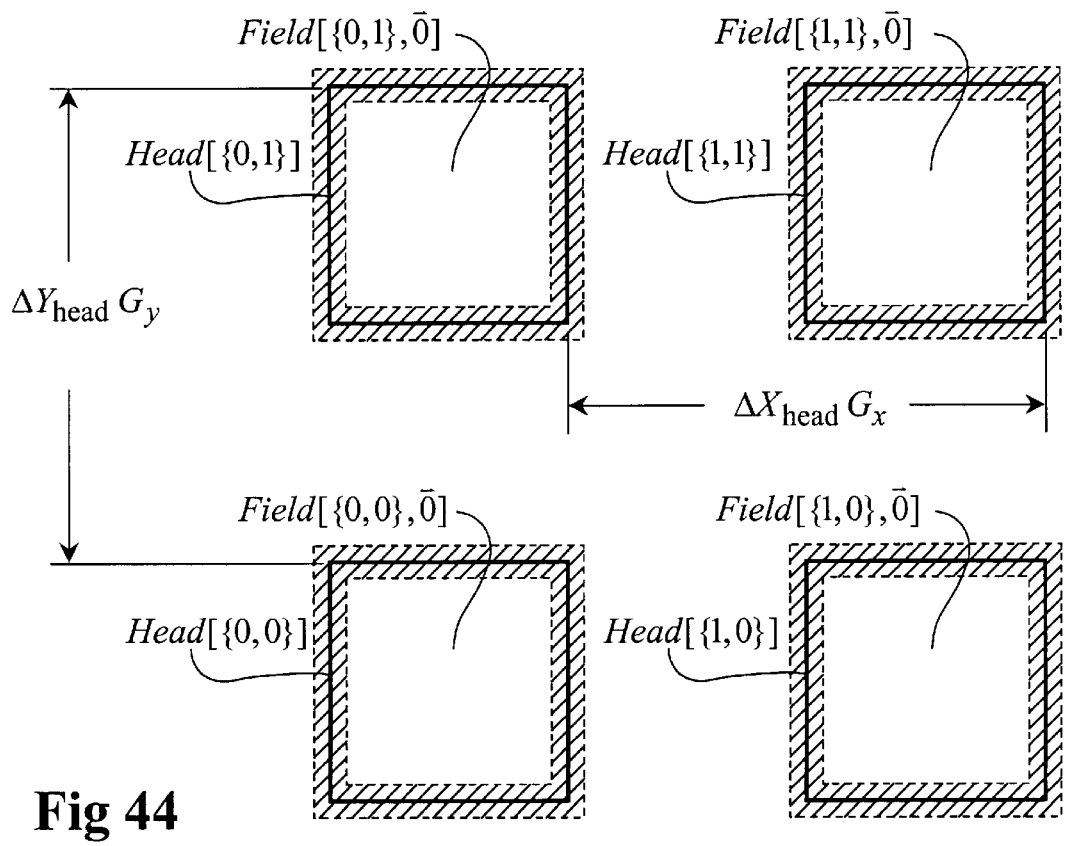
FIG. 44 illustrates four proximate scan fields covered by separate printheads in a single scan.

FIG. 44 illustrates a multi-printhead printing process. The figure shows four printheads, Head[{0,0}], Head[{1,0}], Head[{0,1}], and Head[1,1}], at a particular time during Scan[$\vec{0}$]. During this scan the printheads raster-scan respective scan fields, Field[{0,0},$\vec{0}$], Field[{1,0},$\vec{0}$], Field[{0,1},$\vec{0}$], and Field[{1,1},$\vec{o}$]. Subsequent scans would seamlessly fill in the spaces between these fields (cf. FIG. 43). The positional displacements between printheads in the X and Y directions, respectively, are $\Delta X_{head} G_x$ and $\Delta Y_{head} G_y$, wherein $$\Delta X_{head}=N_{x\,scan} \Delta X_{field} \quad \text{Eq. 8.48}$$

$$\Delta Y_{head}=N_{y\,scan} \Delta Y_{field} \quad \text{Eq. 8.49}$$

The positional coordinates of Pixel[i,k] in Head [i] at the time of Pulse[j,$\vec{0}$] are $\{X_{pixel}[i,j,k]G_x, Y_{pixel}[i,j,k]G_y\}$, wherein $$X_{pixel}[i,j,k]=X_{pixel}[\vec{0},j,k]+i_x \Delta X_{head} \quad \text{Eq. 8.50}$$

$$Y_{pixel}[i,j,k]=Y_{pixel}[\vec{0},j,k]+i_y \Delta Y_{head} \quad \text{Eq. 8.51}$$

Substituting from Eqs. 8.48, 49, 43, 44, 39, 40, 31, 32; Eqs. 8.50, 51 translate to $$X_{pixel}[i,j,k]=(k_x+N_{pixel/row}(j_x+N_{x\,scan}\,i_x))\Delta X_{pixel}+k_y \Delta X_{offset} \quad \text{Eq. 8.52}$$

$$Y_{pixel}[i,j,k]=(k_y+N_{row/head}(j_y+N_{y\,scan}\,i_y))\Delta Y_{pixel} \quad \text{Eq. 8.53}$$

These equations define the pixels', printheads', and scan fields' positional geometry; and with these substitutions Eqs. 8.27 and 8.28 define the complete printed exposure pattern.

A procedure for determining scan parameters from the above relationships is illustrated by the following example. (System design parameters from the preceding sections are assumed in this example, but the procedure can be applied equally well with different design assumptions.)

The printing grid step dimensions, $G_x$ and $G_y$, should be approximately equal to the value G from Eq. 8.4, $$G_x \cong G_y \cong \sqrt{Q_{dot}/Q_A}=6.86 \text{ nm} \quad \text{Eq. 8.54}$$

$\Delta X_{pulse}$ and $\Delta Y_{line}$ are selected to approximately satisfy the 150-nm proximity clearance specification (Eq. 8.5), $$\Delta X_{pulse} \cong d_{clear}/G_x \cong 21.9 \quad \text{Eq. 8.55}$$

$$\Delta Y_{line} \cong d_{clear}/G_y \cong 21.9 \quad \text{Eq. 8.56}$$

(The proximity clearance requirement actually only determines lower limits on $\Delta X_{pulse}$ and $\Delta Y_{line}$, but these parameters should preferably be close to the lower limits in order to minimize the scan velocity and the stitch zone area.) The following design condition is stipulated so that the pixel distribution forms a triangular centering pattern, as illustrated in FIGS. 3 and 39, $$\Delta X_{pixel}=2 \Delta X_{offset} \quad \text{Eq. 8.57}$$

It follows from Eqs. 8.57, 22, and 21 that $$N_{row/period}=2 \quad \text{Eq. 8.58}$$

$$\Delta Y_{period}=2 \Delta Y_{pixel} \quad \text{Eq. 8.59}$$

The centering triangles, such as triangle 3903 in FIG. 39, are preferably approximately equilateral and oriented with one side of each triangle parallel to the Y axis, implying the condition $$\Delta X_{pixel} G_x \cong \sqrt{3}\Delta Y_{period} G_y \quad \text{Eq. 8.60}$$

(The triangles could alternatively be oriented so that each has a side parallel to the X axis, but this would result in a design in which the number of lines per raster scan, $N_{line/scan}$, is much greater, and the frequency of scan reversals would consequently be much higher.) $\Delta Y_{period}$ is selected to approximately match the 6-$\mu$m lens centering dimension (Eq. 1.2), $$\Delta Y_{period} \cong d_{lens}/G_y \cong 874.6 \quad \text{Eq. 8.61}$$

and this estimate, in combination with Eqs. 8.60, 54, 59, yields $$\Delta X_{pixel} \cong \sqrt{3}\Delta Y_{period} \cong 1514.9 \quad \text{Eq. 8.62}$$

$$\Delta Y_{pixel}=\Delta Y_{period}/2 \cong 437.3 \quad \text{Eq. 8.63}$$

Eqs. 1.4, 1.5, 8.54, 8.37–40, 8.62, and 8.63 yield $$N_{pixel/row}=\frac{W_x}{G_x \Delta X_{pixel}} \cong 1924.5 \quad \text{Eq. 8.64}$$

$$N_{row/head}=\frac{W_y}{G_y \Delta Y_{pixel}} \cong 6666.7 \quad \text{Eq. 8.65}$$

The above integer parameter estimates (Eqs. 8.55, 56, 61–65) need to be adjusted to make them exact integers. Also, the relative primality conditions, Eqs. 8.25, 26, need to be satisfied. These conditions hold if (and only if) there exist integers $U_x$, $V_x$, $U_y$, and $V_y$ for which $$U_x \Delta X_{pixel}+V_x \Delta X_{pulse}=1 \quad \text{Eq. 8.66}$$

$U_y \Delta Y_{pixel} + V_y \Delta Y_{line} = 1$                                     Eq. 8.67

Since most of the design conditions need only be satisfied approximately, there is a multiplicity of acceptable parameter choices, and additional design conditions can be imposed to narrow the choices. The printed image's sensitivity to pixel defects can be further mitigated by constraining $U_x$, $V_x$, $U_y$, and $V_y$ to have the form $U_x = -1$                                                                          Eq. 8.68

$V_x = 2P_x + 1$                                                                    Eq. 8.69

$U_y = -4$                                                                          Eq. 8.70

$V_y = 2P_y + 1$                                                                    Eq. 8.71 wherein $P_x$ and $P_y$ are integers. Since the terms on the left sides of Eqs. 8.66, 67 would typically be much greater than 1, it follows from Eqs. 8.57, 59, 66–71 that $$\frac{\Delta X_{offset}}{\Delta X_{pulse}} = \frac{\Delta X_{pixel}}{2 \Delta X_{pulse}} \cong -\frac{V_x}{2 U_x} = P_x + \frac{1}{2}$$     Eq. 8.72

$$\frac{\Delta Y_{period}}{\Delta Y_{line}} = \frac{2 \Delta Y_{pixel}}{\Delta Y_{line}} \cong -\frac{2 V_y}{U_y} = P_y + \frac{1}{2}$$     Eq. 8.73

The above conditions are stipulated to avoid printing proximate image dots with adjacent pixels, in order to minimize the effect of pixel defects that straddle adjacent pixels. Eq. 8.72 implies that the X displacement ($\Delta X_{offset} G_x$) between diagonally adjacent pixels, such as Pixel[$\vec{0}$,{0,0}] and Pixel[$\vec{0}$,{0,1}] in FIG. 39, is approximately equal to the scan distance per pulse ($\Delta X_{pulse} G_x$) times an odd multiple of ½. Thus the dot arrays printed by these pixels are approximately symmetrically interleaved in the X direction, and the minimum separation distance between the image dots in these two dot arrays is approximately ½$\Delta X_{pulse} G_x$ (i.e., 75 nm; Eqs. 8.54, 55). Similarly, it follows from Eq. 8.73 that pixels such as Pixel[$\vec{0}$,{0,0}] and Pixel[$\vec{0}$,{-1,2}], which are adjacent along the Y direction (FIG. 39), have a separation distance ($\Delta Y_{period} G_y$) that is approximately equal to the scan line spacing ($\Delta Y_{line} G_y$) times an odd multiple of ½. Thus the dot arrays printed by these pixels are approximately symmetrically interleaved in the Y direction, and hence the dots in these arrays have a minimum separation distance of approximately ½$\Delta Y_{line} G_y$ (i.e., also 75 nm; Eqs. 8.54, 56).

Given any selected values for $\Delta X_{pulse}$ and $P_x$, Eqs. 8.68, 69, and 66 yield a solution for $\Delta X_{pixel}$ that is integer-valued; however it will not necessarily be even (as required by Eq. 8.57). $\Delta X_{pulse}$ must be odd to ensure that $\Delta X_{pixel}$ is even, i.e., $\Delta X_{pulse} = 2Q_x + 1$                                                       Eq. 8.74 for some integer $Q_x$. The $\Delta Y_{pixel}$ solution obtained from Eqs. 8.70, 71, and 67 will not be integer-valued unless $\Delta Y_{line}$ is odd; and furthermore, the quantity ½($\Delta Y_{line}-1$)+$P_y$ must be even. Thus, $\Delta Y_{line}$ must be of the form $\Delta Y_{line} = 2(2Q_y - P_y) + 1$                                               Eq. 8.75 for some integer $Q_y$.

Substituting Eqs. 8.68–71 into Eqs. 8.66, 67, the relative primality conditions become $-\Delta X_{pixel} + (2P_x + 1)\Delta X_{pulse} = 1$                                Eq. 8.76

$-4\Delta Y_{pixel} + (2P_y + 1)\Delta Y_{line} = 1$                                Eq. 8.77

Estimated values for $P_x$, $P_y$, $Q_x$, and $Q_y$ are obtained from Eqs. 8.74–77, 55, 56, 62, and 63, $$P_x = \frac{1}{2}\left(\frac{1 + \Delta X_{pixel}}{\Delta X_{pulse}} - 1\right) \cong 34.2$$     Eq. 8.78

$$Q_x = \frac{1}{2}(\Delta X_{pulse} - 1) \cong 10.4$$                               Eq. 8.79

$$P_y = \frac{1}{2}\left(\frac{1 + 4\Delta Y_{pixel}}{\Delta Y_{line}} - 1\right) \cong 39.5$$     Eq. 8.80

$$Q_y = \frac{1}{2}\left(\frac{1}{2}(\Delta Y_{line} - 1) + P_y\right) \cong 25.0$$   Eq. 8.81

Based on the above estimates, the following design choices are made, $P_x = 34$                                                                          Eq. 8.82

$Q_x = 11$                                                                          Eq. 8.83

$P_y = 40$                                                                          Eq. 8.84

$Q_y = 25$                                                                          Eq. 8.85 and from these the following parameter values are obtained, $\Delta X_{pulse} = 2Q_x + 1 = 23$                                                  Eq. 8.86

$\Delta Y_{line} = 2(2Q_y - P_y) + 1 = 21$                                          Eq. 8.87

$\Delta X_{pixel} = (2P_x + 1)\Delta X_{pulse} - 1 = 1586$                          Eq. 8.88

$\Delta Y_{pixel} = ((2P_y + 1)\Delta Y_{line} - 1)/4 = 425$                        Eq. 8.89

The estimated value of $N_{pixel/row}$ (Eq. 8.64) is refined using Eqs. 8.88, 8.54, and 1.4, $$N_{pixel/row} = \frac{W_x}{G_x \Delta X_{pixel}} \cong 1838.2$$                   Eq. 8.90

Based on this estimate, the following design choice is made, $N_{pixel/row} = 1838$                                                              Eq. 8.91 and the following exact value for $G_x$ is obtained (Eqs. 8.64, 1.4, 8.88, 8.91), $$G_x = \frac{W_x}{N_{pixel/row} \Delta X_{pixel}} = 6.861 \text{ nm}$$             Eq. 8.92

The wafer-plane exposure dose is proportional to the product $G_x G_y$; i.e., if the printing grid cells are not square Eq. 8.3 generalizes to $$Q_A = \frac{Q_{dot}}{G_x G_y}$$                                                   Eq. 8.93

Thus, to maintain the design exposure dose the following revised estimate of $G_y$ is obtained, using the exact $G_x$ value from Eq. 8.92, $$G_y \cong \frac{Q_{dot}}{G_x Q_A} = (6.86 \text{ nm})^2 / G_x = 6.859 \text{ nm}$$  Eq. 8.94

The estimated value of $N_{row/head}$ (Eq. 8.65) is revised using Eqs. 8.94, 8.89, and 1.5, $$N_{row/head} = \frac{W_y}{G_y \Delta Y_{pixel}} \cong 6860.8 \qquad \text{Eq. 8.95}$$

Based on this estimate, the following design choice is made, $$N_{row/head} = 6860 \qquad \text{Eq. 8.96}$$

(By choosing $N_{row/head}$ to be an even integer, $N_{period/head}$ is integer-valued, Eqs. 8.36, 8.58.) The following exact value for $G_y$ is obtained (Eqs. 8.65, 1.5, 8.89, 8.96), $$G_y = \frac{W_y}{N_{row/head} \Delta Y_{pixel}} = 6.860 \text{ nm} \qquad \text{Eq. 8.97}$$

In the scan sequence illustrated in FIG. 5 (i.e., scan positions 501a, 501b, 501c, and 501d), the number of scans in the X direction and the number in the Y direction are both 2, $$N_{x\,scan} = 2 \qquad \text{Eq. 8.98}$$

$$N_{y\,scan} = 2 \qquad \text{Eq. 8.99}$$

Combining these values and the preceding results, the lens-scan design parameters are summarized in FIG. 45.

The 65 wafer per hour throughput estimate in §7 can be refined, based on the above design parameters. The lens center spacing with these parameters does not exactly match the 6-$\mu$m nominal design value (Eq. 1.2), reducing the lens fill factor $\eta_{FF}$ from 0.630 (Eq. 1.3) to 0.619. This efficiency loss results in a 1.8-% throughput reduction; also the throughput estimate should take into account the throughput overhead associated with scan reversal and wafer loading.

The scan time $t_{line}$ for each raster line is $$t_{line} = N_{pulse/line} / v_{src} = 264. \text{ msec} \qquad \text{Eq. 8.100}$$

and the scan time for a complete raster scan, $t_{scan}$, is $$t_{scan} = N_{line/scan} t_{line} = 112.3 \text{ sec} \qquad \text{Eq. 8.101}$$

This estimate does not include the time associated with scan reversal between raster lines. The scan velocity $v_{scan}$ is $$v_{scan} = \Delta X_{pulse} G_x v_{src} = 0.95 \text{ mm/sec} \qquad \text{Eq 8.102}$$

Assuming a 1-g reversal acceleration (i.e., 10 m/sec$^2$), the velocity reversal time would be 0.19 msec. Also, the printhead must step in the Y direction by a distance of $\Delta Y_{line}$ $G_y$=144 nm between line scans. Again assuming 1-g acceleration, the step time would be approximately 0.24 msec. Thus, the expected reversal time overhead would be of order 1 msec or less per scan line. This would only add approximately 0.4 sec to the raster scan time, $t_{scan}$.

The wafer stepping time between scans should also be accounted for in the throughput calculation, but at 1-g acceleration the wafer could be stepped by 20 mm in less than 100 msec, so this is not a significant throughput factor. Thus the wafer cycle time (at 4 scans per cycle) can be approximately estimated at 452 sec (i.e., 113 sec per scan, times 4 scans), not including the wafer load time. Allowing 10 sec for swapping in each new wafer, the total wafer cycle time is estimated at 462 sec. With 8 wafers being printed per cycle, this translates to 62 wafers per hour.

The scanning system design illustrated above exemplifies a general design methodology that can be applied with different design assumptions and requirements. For example, the number of pixel rows per printhead ($N_{row/head}$) and the number of pixels per row ($N_{pixel/row}$) could be constrained to be integer powers of 2, in order to simplify the digital electronics design. This could be accomplished by increasing the printhead size in the above design to accommodate 8192 pixel rows with 2048 pixels per row. This would increase the printhead aperture dimensions to $W_x$=22.3 mm and $W_y$=23.9 mm. However, the first-stage lens diameter ($D_1$) and lens center spacing ($d_{lens}$) could be then adjusted, with $N_{row/head}$ and $N_{pixel/row}$ held constant, to scale either $W_x$ or $W_y$ to a desired design value. Also, although the pixel centering pattern is preferably based on approximately equilateral triangles, this is not an absolute design requirement and the pixel centering grid could be modified to control the printhead aperture aspect ratio ($W_y$/$W_x$) without changing $N_{row/head}$ or $N_{pixel/row}$.

The above design outline applies to the lens-scan method in which the wafer remains stationary while the printheads raster scan over the scan fields. In the alternative wafer-scan method, the wafer moves while the printheads remain substantially stationary (except for slight focus and alignment adjustments). Due to the high inertia of the wafer and scanning mechanism, the wafer-scan method would preferably comprise a transitionless scan that does not require frequent scan reversals.

The transitionless scan method, which was described previously in the context of one-dimensional scanning, is also applicable in two dimensions. In this context, the method can be applied in either of two modes termed "transitionless X scanning" or "transitionless Y scanning". (Both modes can be used in combination.) The defining conditions for these scanning modes are $$N_{pixel/row} = \Delta X_{pulse} \text{ (transitionless X scan)} \qquad \text{Eq. 8.103}$$

$$N_{row/head} = \Delta Y_{line} \text{ (transitionless Y scan)} \qquad \text{Eq. 8.104}$$

(cf. Eq. 8.11).

For the transitionless X scanning mode, $N_{x\,scan}$ can be fractional, and $\Delta X_{head}$ is defined by $$\Delta X_{head} = N_{x\,pulse} \Delta X_{pulse} \qquad \text{Eq. 8.105}$$

wherein $N_{x\,pulse}$ is the total number of exposure pulses per dot row. The individual scans, Scan[{1,j$_y$}], Scan[{1,j$_y$}], etc. can (for each particular index j$_y$) be considered to constitute portions of a single "transitionless X scan", which is designated as Scan'[{0,j$_y$}] and is characterized by scan parameters N'$_{pulse/line}$, N'$_{pulse/scan}$, $\Delta X'_{scan}$, $\Delta X'_{field}$, and N'$_{x\,scan}$ defined by $$N'_{pulse/line} = N_{x\,pulse} \qquad \text{Eq. 8.106}$$

$$N'_{pulse/scan} = N'_{pulse/line} N_{line/scan} \qquad \text{Eq. 8.107}$$

$$\Delta X'_{scan} = \Delta X'_{field} = \Delta X_{head} \qquad \text{Eq. 8.108}$$

$$N_{x\,scan} = 1 \qquad \text{Eq. 8.109}$$

(Other entities that are associated with a transitionless X scan can also be distinguished by using primed symbols. For example, Dots'[i,j,k] represents the set of image dots printed by Pixel[i,k] during Scan'[j].)

Similarly, for transitionless Y scanning, $N_{y\,scan}$ can be fractional, and $\Delta Y_{head}$ is defined by $$\Delta Y_{head} = N_{y\,line} \Delta Y_{line} \qquad \text{Eq. 8.110}$$

wherein $N_{y\,line}$ is the total number of scan lines covered by all the scans, Scan[{j$_x$,0}], Scan[{j$_x$,1}], etc. (for any particular index $j_x$). These scans constitute a "transitionless Y scan", Scan'[$\{j_x,0\}$] which is characterized by scan parameters $N'_{line/scan}$, $N'_{pulse/scan}$, $\Delta Y'_{scan}$, $\Delta Y'_{field}$, and $N'_{y\ scan}$ defined by $$N'_{line/scan} = N_{y\ line} \qquad \text{Eq. 8.111}$$

$$N'_{pulse/scan} = N_{pulse/line}\ N'_{line/scan} \qquad \text{Eq. 8.112}$$

$$\Delta Y'_{scan} = \Delta Y'_{field} = \Delta Y_{head} \qquad \text{Eq. 8.113}$$

$$N'_{y\ scan} = 1 \qquad \text{Eq. 8.114}$$

If Eqs. 8.103 and 8.104 both hold, all of the scans can be merged into a single transitionless scan, Scan'[$\{0,0\}$], and Eqs. 8.105, 106, 108–111, 113, 114 all apply. For this case, the total number of pulses per scan, $N'_{pulse/scan}$, is $$N'_{pulse/scan} = N_{pulse/line}\ N_{line/scan} \qquad \text{Eq. 8.115}$$

Figure 46A:
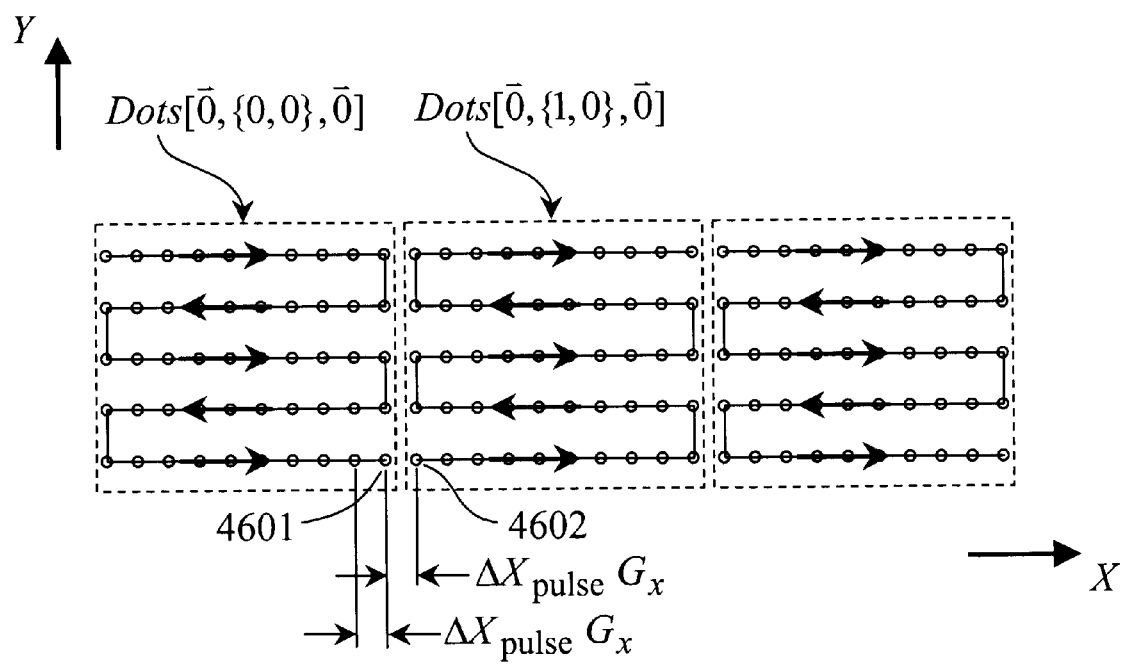
FIGS. 46A and 46B illustrate a transitionless scan method.
Figure 46B:
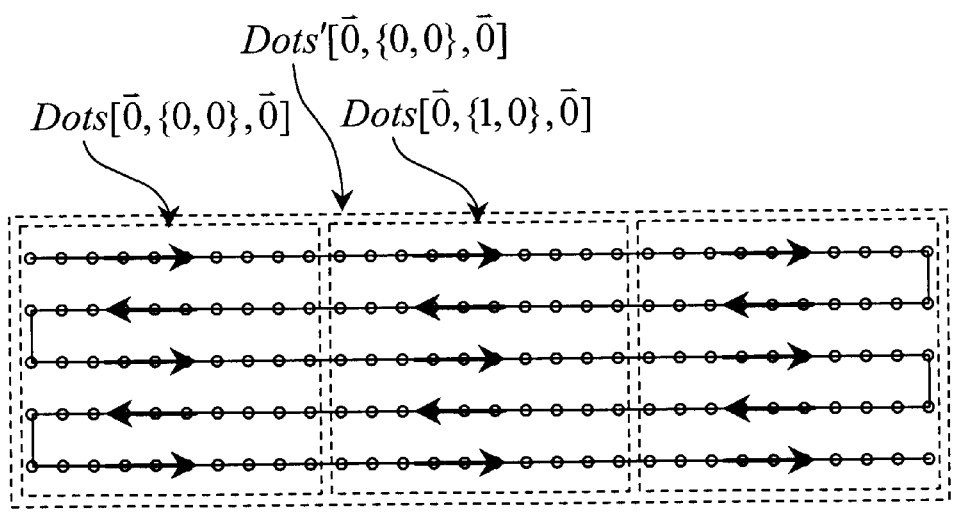

The distinction between a transitionless X scan, Scan'$_X$ [$\{0,j_y\}$], and its constituent scans Scan[$\{0,j_y\}$], Scan[$\{1,j_y\}$], . . . is not merely one of definitions and notation. The constituent scans' raster lines are merged in the composite, transitionless scan, thus reducing the number of scan reversals and associated throughput overhead. This is illustrated in FIGS. 46A and 46B. FIG. 46A shows several sets of image dots, Dots[$\vec{0},\{0,0\},\vec{0}$], Dots[$\vec{0},\{1,0\},\vec{0}$], etc., that are printed by Pixel[$\vec{0},\vec{0}$] during respective scans, Scan[$\{0,0\}$], Scan[$\{1,0\}$], etc. Each set is raster-scanned, and the arrows indicate the exposure time sequence in each scan. Assuming that Eq. 8.103 holds, the X-displacement between the each scan's end point (e.g., point 4601) and the succeeding scan's start point (e.g., point 4602) is equal to $\Delta X_{pulse}\ G_x$, the scan distance per pulse. Hence, the multiple raster scans can be merged into a single, transitionless scan in which Pixel[$\vec{0},\vec{0}$] traverses all the sets, as illustrated in FIG. 46B. (The union of Dots[$\vec{0},\{0,0\},\vec{0}$], Dots[$\vec{0},\{1,0\},\vec{0}$], etc. is indicated as Dots'[$\vec{0},\{0,0\},\vec{0}$] in FIG. 46B, in conformance with the notational conventions outlined above.)

A fundamental limitation of the transitionless scan method is that the scan fields' stitch zones are very large—in fact, they are as large as the printhead apertures themselves. For a transitionless X scan $$\Delta X_{stitch} = \Delta X_{pixel}\ \Delta X_{pulse}\ W_x \times G_x \qquad \text{Eq. 8.116}$$

and for a transitionless Y scan $$\Delta Y_{stitch} = \Delta Y_{pixel}\ \Delta Y_{line} = W_y/G_y \qquad \text{Eq. 8.117}$$

(from Eqs. 8.41, 42, 19, 20, 23, 24, 103, 104, 39, 40, 37, 38). This results in a significant efficiency loss, either in terms of throughput or wafer coverage, due to incompletely exposed stitch zones bordering the wafer print module. The efficiency loss can be mitigated by minimizing the printhead aperture dimension in the direction of the transitionless scan. For example, in the following design illustration a transitionless X scan is used and the printhead aperture dimensions are specified as $$W_x = 10\ \text{mm} \qquad \text{Eq. 8.118}$$

$$W_y = 20\ \text{mm} \qquad \text{Eq. 8.119}$$

wherein the smaller X dimension ($W_x$) is chosen to limit the efficiency loss.

Figure 47:
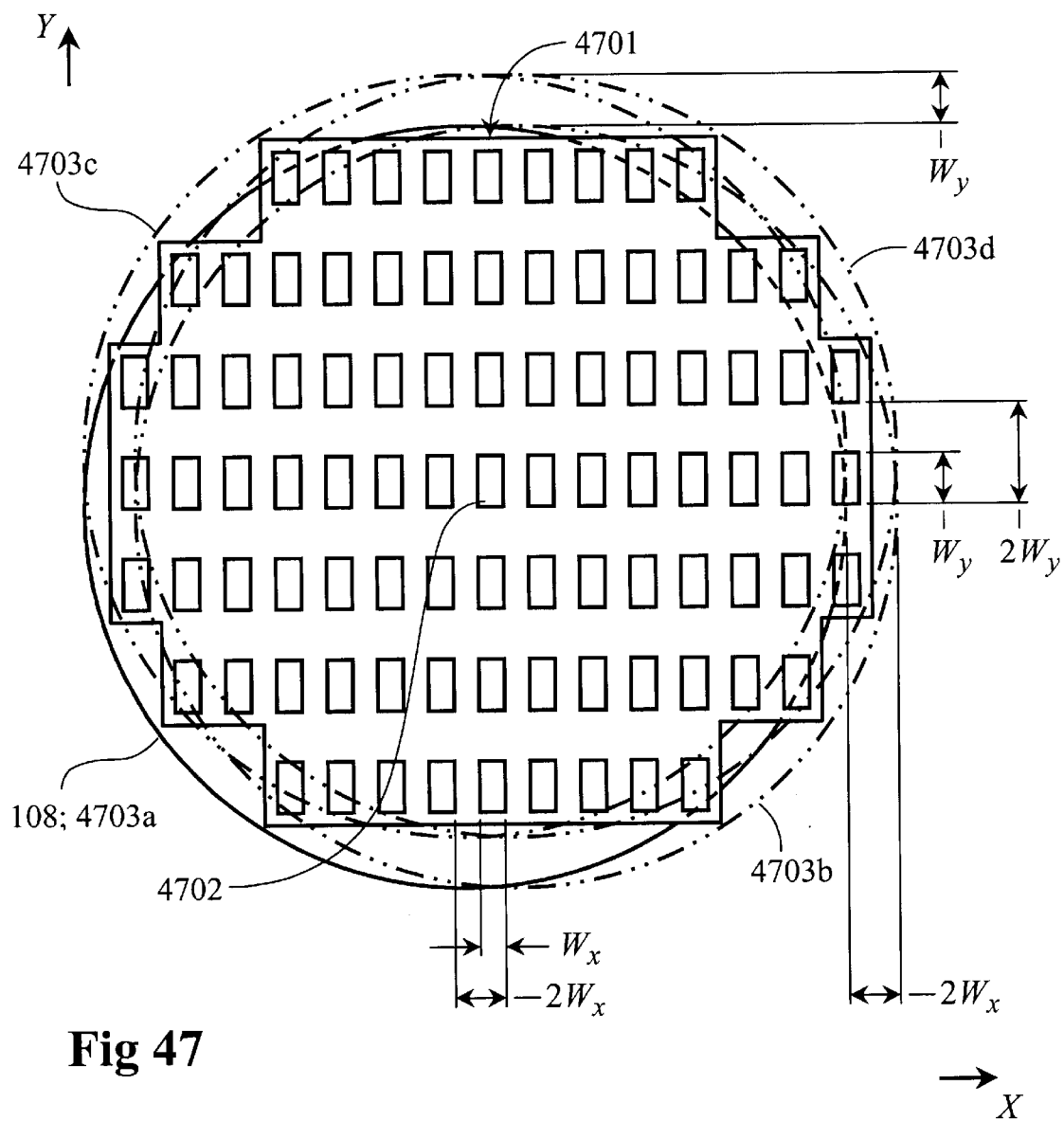
FIG. 47 illustrates a "wafer-scan" scanning method comprising a transitionless scan.

FIG. 47 illustrates the wafer-scan method, which is based on the transitionless X scan described above. (For comparison, the lens-scan method is illustrated in FIG. 5.) A wafer print module 4701 comprises a set of printhead apertures such as aperture 4702 whose dimensions in the respective X and Y directions are $W_x$ and $W_y$. In this example, the apertures are arranged in a rectangular array with X and Y periodicities of $2W_x$ and $2W_y$, respectively. (In general, the X periodicity could be any integer multiple of $\Delta X_{pulse}\ G_x$, and the Y periodicity could be any integer multiple of $W_y$. The illumination system would be designed to accommodate the aperture geometry, based on the design methods described in §6.) The wafer 108 is exposed in two scans. It is first exposed as it raster-scans between positions 4703a and 4703b, covering an X travel range of $2W_x$. (The Y travel range is very small, e.g., 1.5 μm in this example.) It then steps by a distance of $W_y$ in the Y direction and is exposed while raster-scanning between positions 4703c and 4703d. (This contrasts with the lens-scan method in which the wafer remains stationary during exposure.)

Figure 48:
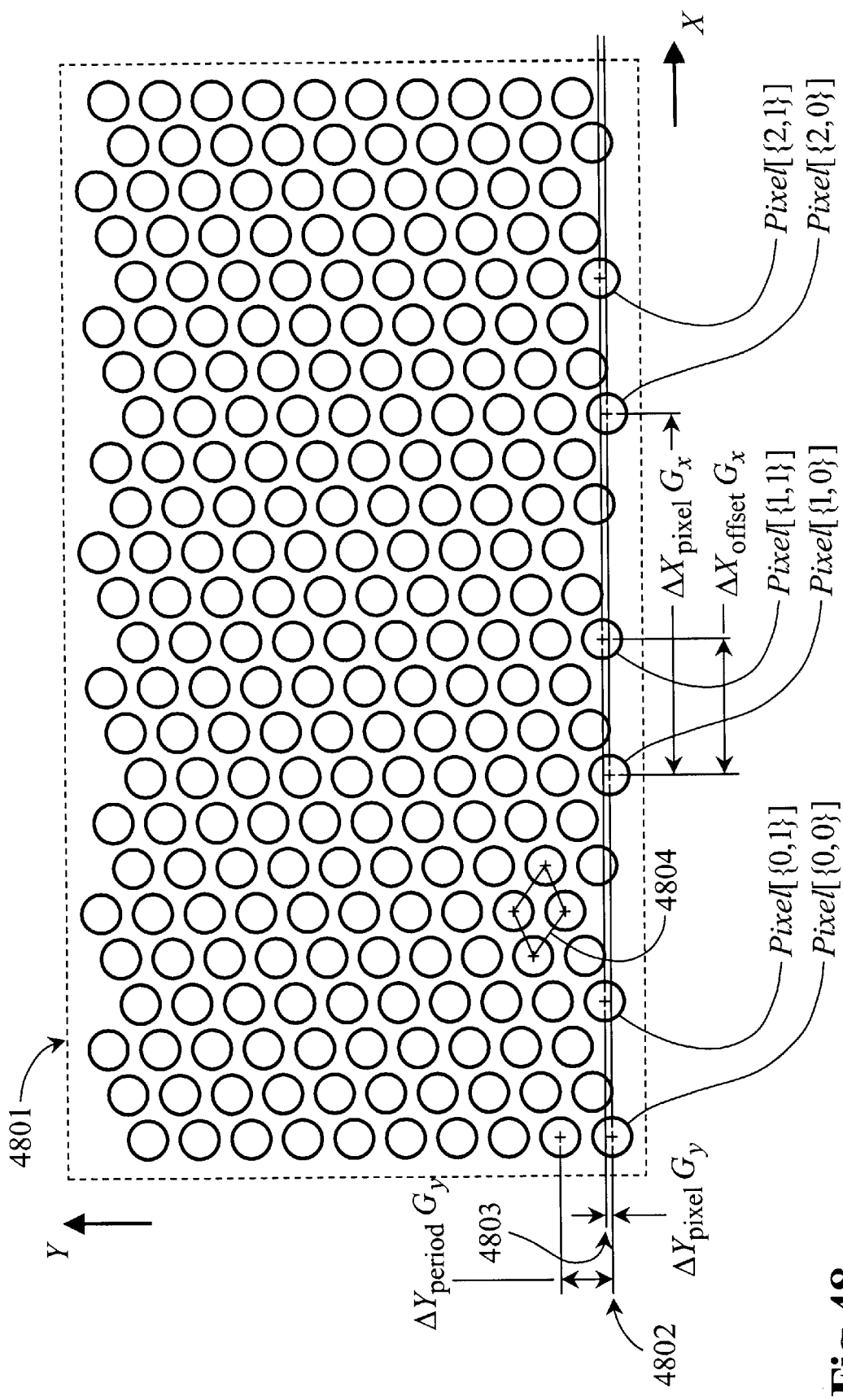
FIG. 48 illustrates the pixel layout design used in the wafer-scan method.

The pixel layout design used in the wafer-scan method is similar to a design configuration described in Ref. 44, except that the present method uses scan interleaving to minimize the effect of pixel defects, and it also better optimizes the pixel fill factor (Eq. 1.3). FIG. 48 conceptually illustrates the pixel distribution over a printhead aperture 4801. (The dimensions and proportions shown in the figure do not correspond to the actual design values derived below.) The pixel array comprises a set of closely spaced pixel rows, such as row 4802 comprising Pixel[$\{0,0\}$], Pixel[$\{1,0\}$], Pixel[$\{2,0\}$] and row 4803 comprising Pixel[$\{0,1\}$], Pixel[$\{1,1\}$], Pixel[$\{2,1\}$]. The pixels in each row are very sparsely spaced, with a pixel centering separation of $\Delta X_{pixel}\ G_x$. The spacing is necessarily sparse because the number of pixels per row, $N_{pixel/row}$, is equal to $\Delta X_{pulse}$ (Eq. 8.103), which must have a small value because the scan velocity is proportional to $\Delta X_{pulse}$ (Eq. 8.102). Adjacent pixel rows are separated by a Y displacement distance of $\Delta Y_{pixel}\ G_y$ and an X offset distance of $\Delta X_{offset}\ G_x$. The pixel array is periodic in the Y direction with a periodicity dimension of $\Delta Y_{period}\ G_y$. (The above parameter definitions are consistent with the corresponding lens-scan parameter definitions, as illustrated in FIG. 39.)

The printing grid dimensions $G_x$ and $G_y$, and the scan parameters $\Delta X_{pulse}$ and $\Delta Y_{line}$, are defined by the same conditions as in the lens-scan design (Eqs. 8.54–56; cf. FIG. 39), and they have the approximate values $$G_x \cong G_y \cong -6.86\ \text{nm} \qquad \text{Eq. 8.120}$$

$$\Delta X_{pulse} \cong \Delta Y_{line} \cong -21.9 \qquad \text{Eq. 8.121}$$

$\Delta X_{pixel}$ can be estimated from Eqs. 8.103, 39, 37, 118, and 120, $$\Delta X_{pixel} = W_x/(G_x\ \Delta X_{pulse}) \cong 66666.7 \qquad \text{Eq. 8.122}$$

Figure 49:
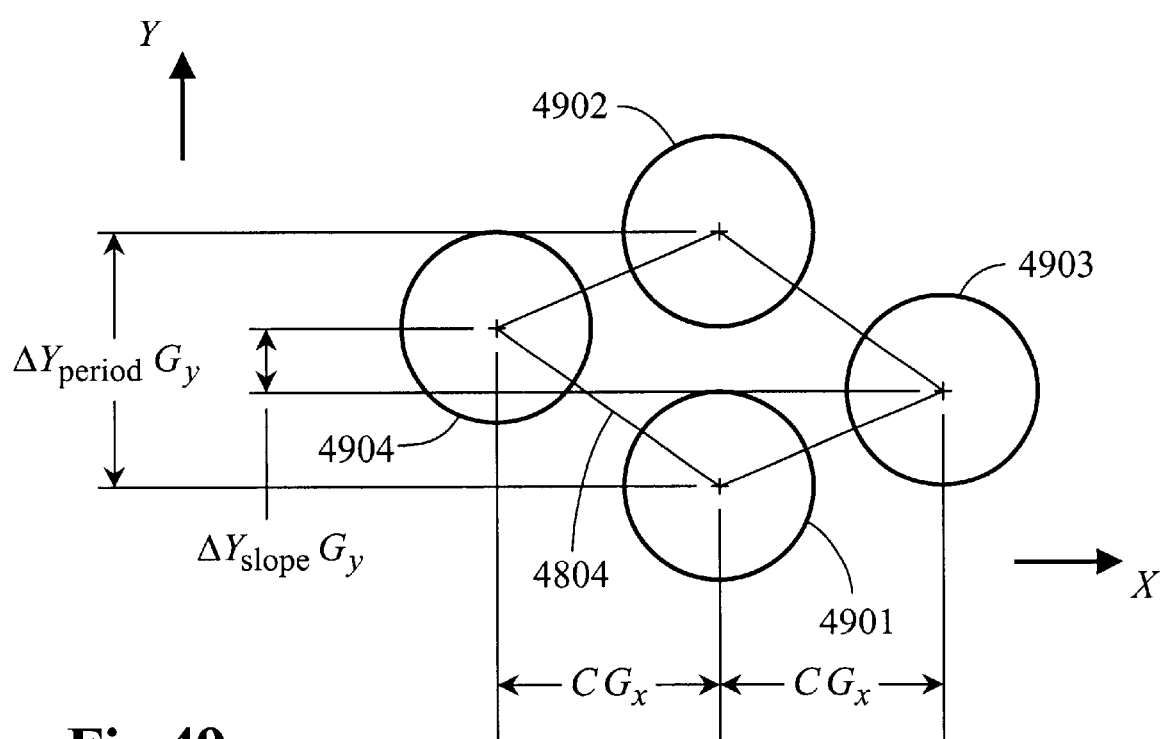
FIG. 49 shows a magnified portion of FIG. 48, illustrating the wafer-scan design parameters.

The array's X periodicity dimension ($\Delta X_{pixel}\ G_x$) is two orders of magnitude larger than the pixel dimensions. However, the pixels are centered at the points of a periodic tiling pattern comprising unit cells, such as cell 4804 in FIG. 48, which have dimensions comparable to the pixel size. FIG. 49 shows a magnified view of four pixels 4901, 4902, 4903, and 4904, which are centered at the points of unit cell 4804. Pixels 4901 and 4902 have the same X coordinate, and their centering distance in the Y direction is $\Delta Y_{period}\ G_y$. $\Delta Y_{period}$ has the same estimated value as in the lens-scan design (Eq. 8.61), $$\Delta Y_{period} \cong d_{lens}/G_y \cong 874.6 \qquad \text{Eq. 8.123}$$

The X displacement distance from pixels 4901 and 4902 to both pixel 4903 and pixel 4904 is C $G_x$, wherein $$C = GCD[\Delta X_{pixel}, \Delta X_{offset}] \qquad \text{Eq. 8.124}$$

(It follows from Eq. 8.31 that all pixels' X coordinates, $X_{pixel}[\vec{0}, \vec{0}, k]$ are integer multiples of C $G_x$. Pixels 4903 and 4904 are the specific pixels that have Y coordinates between the Y coordinates of pixels 4901 and 4902, and that are closest in X to pixels 4901 and 4902.) The unit cell 4804 forms a parallelogram whose sides are preferably approximately equal to the centering distance between pixels 4901 and 4902 (i.e., cell 4804 comprises two approximately equilateral triangles). Thus C has the approximate value $$C \cong \frac{\sqrt{3}}{2} \Delta Y_{period} G_y / G_x \cong 757.5 \qquad \text{Eq. 8.125}$$

The number of pixel rows per period in the Y direction, $N_{row/period}$, is $$N_{row/period} = \Delta X_{pixel}/C \qquad \text{Eq. 8.126}$$

(cf Eq. 8.22). A related parameter, M, is defined by $$M = \Delta X_{offset}/C \qquad \text{Eq. 8.127}$$

It follows from Eqs. 8.124, 126, 127 that $N_{row/period}$ and M are relatively prime, $$GCD[N_{row/period}, M] = 1 \qquad \text{Eq. 8.128}$$

Hence there exist unique integers $K_x$ and $K_y$ satisfying the conditions $$K_x N_{row/period} + K_y M = 1; \ 0 < K_y < N_{row/period} \qquad \text{Eq. 8.129}$$

The Y offset between pixels 4903 and pixel 4904 is $\Delta Y_{slope}$ $G_y$ (FIG. 49), wherein $$\Delta Y_{slope} = (N_{row/period} - 2K_y)\Delta Y_{pixel} \qquad \text{Eq. 8.130}$$

(This follows from Eq. 8.32. For example, if pixel 4901 is designated as Pixel[$\vec{0}, \vec{0}$], then pixel 4903 has position indices $\{k_x, k_y\} = \{K_x, K_y\}$ in Eqs. 8.31, 32, and pixel 4904 has position indices $\{k_x, k_y\} = \{-M - K_x, N_{row/period} - K_y\}$, from which Eq. 8.130 follows.) The scanning system design should preferably minimize $\Delta Y_{slope}$ so that the sides of unit cell 4804 are approximately equal.

$N_{row/period}$ is estimated from Eqs. 8.126, 122, and 125, $$N_{row/period} = \Delta X_{pixel}/C \cong 88.0 \qquad \text{Eq. 8.131}$$

Based on this estimate and Eqs. 8.21 and 8.123, $\Delta Y_{pixel}$ is estimated as $$\Delta Y_{pixel} = \Delta Y_{period}/N_{row/period} \cong 9.9 \qquad \text{Eq. 8.132}$$

The following design values are selected for $\Delta Y_{pixel}$ and $\Delta Y_{line}$ to fit Eqs. 8.132 and 8.121 and satisfy the relative primality condition (Eq. 8.26), $$\Delta Y_{pixel} = 10 \qquad \text{Eq. 8.133}$$

$$\Delta Y_{line} = 23 \qquad \text{Eq. 8.134}$$

Working backward through the above estimates (Eqs. 8.132, 126, and 122), the selected $\Delta Y_{pixel}$ value results in a revised estimate for $\Delta X_{pulse}$ that is almost exactly integer-valued, $$N_{row/period} = \Delta Y_{period}/\Delta Y_{pixel} \cong 87.5 \qquad \text{Eq. 8.135}$$

$$\Delta X_{pixel} = N_{row/period} C \cong 66249.9 \qquad \text{Eq. 8.136}$$

$$\Delta X_{pulse} = W_x/(G_x \Delta X_{pixel}) = 22.0 \qquad \text{Eq. 8.137}$$

Thus, the following design choice is made, $$\Delta X_{pulse} = 22 \qquad \text{Eq. 8.138}$$

With $\Delta X_{pulse}$ determined, the $\Delta X_{pixel}$ and $N_{row/period}$ estimates (Eqs. 8.122, 126) are again revised (although in this example the selected value for $\Delta X_{pulse}$ is so close to Eq. 8.137 that the revised values are practically unchanged), $$\Delta X_{pixel} = W_x/(G_x \Delta X_{pulse}) = 66260.3 \qquad \text{Eq. 8.139}$$

$$N_{row/period} = \Delta X_{pixel}/C \cong 87.5 \qquad \text{Eq. 8.140}$$

Based on Eq. 8.140 the following design choice is made, $$N_{row/period} = 87 \qquad \text{Eq. 8.141}$$

and $\Delta Y_{period}$ is obtained from Eq. 8.21, 133, and 141

$$\Delta Y_{period} = N_{row/period} \Delta Y_{pixel} = 870 \qquad \text{Eq. 8.142}$$

The estimated value of C (Eq. 8.125) is adjusted to fit Eq. 8.126, using the above selection for $N_{row/period}$ and the revised estimate for $\Delta X_{pixel}$ from Eq. 8.139

$$C = \Delta X_{pixel}/N_{row/period} \cong 761.6 \qquad \text{Eq. 8.143}$$

Thus the following design selection is made $$C = 761 \qquad \text{Eq. 8.144}$$

and an exact value for $\Delta X_{pixel}$ is obtained from Eq. 8.126

$$\Delta X_{pixel} = N_{row/period} C = 66207 \qquad \text{Eq. 8.145}$$

The selected values for $N_{row/period}$ and C (Eqs. 8.141, 144) are both relatively prime with $\Delta X_{pulse}$ (Eq. 8.138); hence so is $\Delta X_{pixel}$, as required by Eq. 8.25.

$\Delta X_{offset}$ is in the range $$0 < \Delta X_{offset} < \Delta X_{pixel} \qquad \text{Eq. 8.146}$$

Hence the M parameter (Eq. 8.127) is in the range $$0 < M < \Delta X_{pixel}/C = 87 \qquad \text{Eq. 8.147}$$

The selection criteria for choosing M are that it should be within the above range; it must be relatively prime with $N_{row/period}$ (Eq. 8.128); and subject to these constraints M is selected to minimize $|\Delta Y_{slope}|$ (Eq. 8.130). The purpose of the minimization condition is to minimize the Y offset between pixels 4903 and 4904 in FIG. 49, so that the sides of parallelogram 4804 are as nearly equal as possible. Based on the above selection criteria, the following value for M is chosen $$M = 2 \qquad \text{Eq. 8.148}$$

and $\Delta X_{offset}$ is determined by Eqs. 8.127, 144, and 148

$$\Delta X_{offset} = M C = 1522 \qquad \text{Eq. 8.149}$$

The $K_x$ and $K_y$ values determined from Eq. 8.129 are $$K_x = 1 \qquad \text{Eq. 8.150}$$

$$K_y = 44 \qquad \text{Eq. 8.151}$$

and $\Delta Y_{slope}$ is obtained from Eqs. 8.130, 133, 141, and 150, $$\Delta Y_{slope} = (N_{row/period} - 2K_y) \Delta Y_{pixel} = -10 \quad \text{Eq. 8.152}$$

(Actually, if $\Delta X_{pulse}$ is even the selection M=2 will always minimize $|\Delta Y_{slope}|$, and $\Delta Y_{slope}$ will be equal to $-\Delta Y_{pixel}$.)

$N_{pixel/row}$ is obtained from Eqs. 8.103, 138; and an estimate for $N_{row/head}$ is obtained from Eqs. 8.40, 38, 119, 120, and 133, $$N_{pixel/row} = \Delta X_{pulse} = 22 \quad \text{Eq. 8.153}$$

$$N_{row/head} = \frac{W_y}{G_y \Delta Y_{pixel}} \cong 291545.2 \quad \text{Eq. 8.154}$$

Thus $N_{row/head}$ is defined as $$N_{row/head} = 291545 \quad \text{Eq. 8.155}$$

and exact design values for $G_x$ and $G_y$ are obtained (from Eqs. 8.37–40), $$G_x = \frac{W_x}{N_{pixel/row} \Delta X_{pixel}} = 6.866 \text{ nm} \quad \text{Eq. 8.156}$$

$$G_y = \frac{W_y}{N_{row/head} \Delta Y_{pixel}} = 6.860 \text{ nm} \quad \text{Eq. 8.157}$$

For this design example the $N_{x\,pulse}$ factor in Eqs. 8.105, 106 (the total number of pulses per scan line) is defined as $$N_{x\,pulse} = N_{pulse/line} = 2 \Delta X_{pixel} = 132414 \quad \text{Eq. 8.158}$$

(In practice $N_{x\,pulse}$ could have any integer value that is sufficiently large to satisfy mechanical clearance constraints between printheads.) From Eqs. 8.105 and 8.108, $$\Delta X'_{scan} = \Delta X'_{field} = \Delta X_{head} = N_{x\,pulse} \Delta X_{pulse} = 2913108 \quad \text{Eq. 8.159}$$

The number of scans in the X direction is 1 (Eq. 8.109), and the number of scans in the Y direction is $$N_{y\,scan} = 2 \quad \text{Eq. 8.160}$$

FIG. 50 summarizes the design parameters for the wafer-scan method.

The wafer-scan method is inherently insensitive to pixel defects that straddle adjacent pixels. For example, the dot rows printed by pixel 4901 in FIG. 49 are not proximate to dot rows printed by any adjacent pixels such as pixels 4902, 4903, or 4904 because the Y displacement between adjacent pixels is much larger than the entire Y scan range ($\Delta Y_{scan}$ $G_y$). Thus, defects that straddle adjacent pixels will not significantly affect the image. The scan pattern could also be designed to minimize sensitivity to defects that straddle pixels such as pixels 4903 and 4904 that are not directly adjacent, but which print proximate dot rows. For example, if the selected C value (Eq. 8.144) were increased slightly from 761 to 765, the dot columns printed by pixels 4903 and 4904 would be approximately symmetrically interleaved in the X direction with a minimum separation distance of approximately 75 nm, thereby minimizing the effect of defects that straddle these pixels.

Several improvements and variations of the above-outlined scanning methods are possible. For example, the system would not necessarily need to use the same raster scan pattern for all printing processes. Scan parameters such as $N_{pulse/line}$, $\Delta X_{pulse}$, $N_{line/scan}$, $\Delta Y_{line}$, $G_x$, and $G_y$ could be adjusted for a particular process to optimize print resolution, exposure level, and throughput. The relative primality conditions (Eqs. 8.25, 26) could perhaps be relaxed somewhat, although the scan parameters should, at a minimum, be defined so that the exposure pattern produced with all the pixels ON does not have any structure within the system's optical resolution limit. This criterion implies the following conditions, $$GCD[\Delta X_{pixel}, \Delta X_{pulse}] \leq \lambda/(2NA_{geo}\, G_x) \quad \text{Eq. 8.161}$$

$$GCD[\Delta Y_{pixel}, \Delta Y_{line}] \leq \lambda/(2NA_{geo}\, G_y) \quad \text{Eq. 8.162}$$

wherein $\lambda$ is the exposure wavelength (11.3 nm) and $NA_{geo}$ is the geometric numerical aperture defined in §2 ($NA_{geo}$ = 0.156). (The optical resolution limit is discussed in §10.)

Although the above methods are based on a pulsed EUV source such as a xenon LPP source, the methods can also be adapted with very little change for use with a continuous source such as a synchrotron. (In this case, the pixels would expose continuous scan lines rather than discrete image dots, and proximate pixels' scan lines would be overlapped rather than interleaved in the X direction.) The raster scanning technique is suitable for general-purpose digital printing applications, but for some specialized applications the system could use an alternative vector-scanning method in which the scan path follows the lines and contours of the printed image. Vector scanning could be used, for example, when the print image is a periodic pattern matching the pixel layout. (Such applications would not typically require individual pixel modulators. Instead the system could simply use a single modulator at the EUV source, as outlined at the end of §4.)

§9 Data Compression

A maskless EUV lithography system would have enormous data storage and data flow requirements. For example, a fully buffered bit map image at a 6.86-nm sampling resolution (i.e., the grid step dimension G, Eq. 8.4) would require $2 \times 10^{12}$ data bits per $cm^2$ of wafer area. $2 \times 10^{12}$ bits corresponds to approximately $1 million of DRAM storage at current prices; thus the data would have to be converted to a compressed format that can be efficiently decompressed at high data rates. The system's total data rate for pattern generation is $2.8 \times 10^{13}$ bits per sec (i.e., $N_{pixel}\, v_{src}$; Eqs. 1.7, 8.1). However, if all eight wafer print modules are supplied data from a common data stream the data rate would be (only) $3.5 \times 10^{12}$ bits per sec.

Perhaps the most practical and straightforward approach to data compression would be to convert the image data into a sequence of machine instructions that can be processed by digital hardware to regenerate the image bit stream at a high data rate. Typical lithography design patterns comprise simple rectangular shapes and periodic structures that can be very compactly represented in terms of repeat loops and subroutines, so high compression rates could be achievable with this approach. Assuming, for example, that the system uses multiple processing units, each of which generates a 32-bit data stream at a 100 MHz data rate, the total output from each unit would be $3.2 \times 10^9$ bits per sec. (The instruction feed rate could be orders of magnitude lower, depending on the level of data compression that is achieved.) Approximately 1000 processors could satisfy the system's data flow requirement. This assumes data sharing between modules; otherwise the required number of processors would be of order 10,000.

Although the modules may receive data from a common data stream, the system could nevertheless provide a limited degree of module-specific customization of the print image. Each module could have an associated database of "patch"

image patterns that are spliced into the bit stream as it is received. This facility would be used, for example, to compensate for defective pixels or to insert wafer die serialization characters into the image.

With the lens-scan technique described in §8, each printhead pixel row could be provided a dedicated line buffer that is filled prior to each line scan. Each raster scan comprises 425 line scans (i.e., $N_{line/scan}$=425, FIG. 45); thus less than 0.3% (i.e., $\frac{1}{425}$) of the entire wafer bit image would be buffered. With the wafer-scan technique the line buffering approach is not very practical because $N_{line/scan}$ is much lower (10) and the number of pixel rows per printhead ($N_{row/head}$) is much higher (291545 for the wafer scan, compared to 6860 for the lens scan; FIGS. 45, 50). But the number of pixels per row ($N_{pixel/row}$) is much lower (22, versus 1838 for the lens scan), so it could be feasible to provide each pixel a small data buffer and an associated instruction pointer and return stack for instruction processing. Each processing unit would be time-shared between multiple pixels, keeping their data buffers filled as the scan progresses. Since the number of grid steps per pulse ($\Delta X_{pulse}$) is 22, the processors need only transmit every 22nd image bit to the bit stream; however the instruction feed rate and processing rate would be 22 times higher than with the lens-scan method. Also, the processor instruction set should preferably be designed so that it can be processed in either forward or reverse sequential order to accommodate bi-directional raster scanning. For example, rather than terminating subroutines with return instructions, branch instructions could include both the starting and ending addresses of subroutine instruction blocks, which may be processed in either forward or reverse order. (An advantage of this branching method is that subroutine blocks could be overlapped, further improving data compression efficiency.)

§10 Printing Performance

FIG. 51 illustrates a radial point exposure intensity profile 5101 for a single, isolated image dot, based on the imaging performance of the lens design outlined in FIG. 13 (with focus optimized as indicated by the footnote in FIG. 13). This "point exposure profile" is identical to the intensity profile $I[r_3]$ illustrated in FIG. 12, except that the vertical scale is normalized to units of the maximum attainable exposure level, $Q_A$=80 mJ/cm$^2$ (Eq. 7.6). On this scale, the profile peaks at 0.0134 (corresponding to 1.075 mJ/cm$_2$ in absolute units). Also, FIG. 51 illustrates a cross-sectional "line exposure profile" 5102 of an isolated dot row comprising dot exposures distributed along a line at the grid step interval of G=6.86 nm (Eq. 8.4). This profile peaks at 0.116 in $Q_A$-relative units (or 9.32 mJ/cm$^2$ in absolute units).

Figure 56:
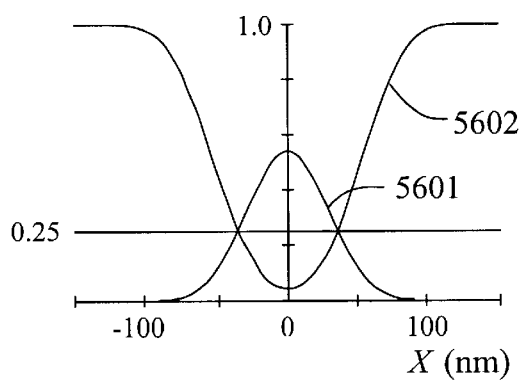
FIG. 56 shows cross-sectional exposure intensity profiles for the disk images of FIGS. 52 and 53.
Figure 57:
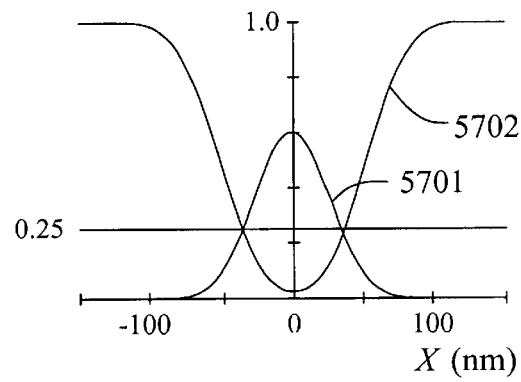
FIG. 57 shows cross-sectional exposure intensity profiles for the line images of FIGS. 54 and 55.

On the scale of FIG. 51 the assumed resist exposure threshold (20 mJ/cm$^2$) is at the 0.25 level. The point and line exposure profiles 5101 and 5102 are both well below this level, so the requisite exposure level can only be attained by combining multiple overlapping dot exposures. FIGS. 52–55 illustrate several such dot patterns that could be used to form basic semiconductor elements such as conductor lines and contact holes, and corresponding exposure profiles are shown in FIGS. 56 and 57. The resolution parameter $k_1$ for all of these images is 0.6, based on an operating wavelength $\lambda$=11.3 nm, an effective numerical aperture $NA_{eff}$=0.1, and imaging resolution RES=70 nm (Eq 2.14).

FIG. 52 illustrates a dot pattern exposing a positive-tone disk image, which would develop into an isolated hole in a positive resist. The illustrated dots such as dot 5201 in FIG. 52 (and FIGS. 53–55) represent the center points of image dots that are exposed with pixels in their ON state, while the "+" marks such as mark 5202 represent unexposed image dots. The dots are exposed on a square grid with unit cell dimension G=6.86 nm (Eq. 8.4). The 25% threshold contour (representing the exposure distribution's aerial image) is illustrated as curve 5203, which has a diameter of 70.9 nm.

FIG. 53 illustrates a complementary pattern comprising a negative-tone disk image, which would develop into an isolated mesa or post in a positive resist. The 25% contour 5301a has a diameter of 69.5 mn.

Figure 54:
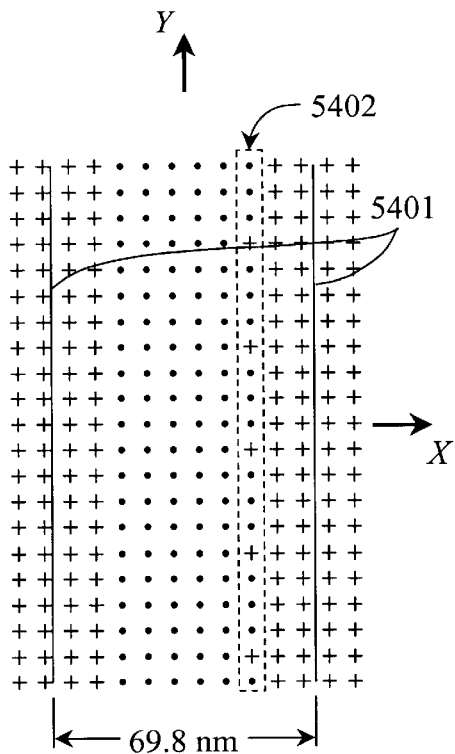
FIG. 54 illustrates a positive-tone line image.
Figure 55:
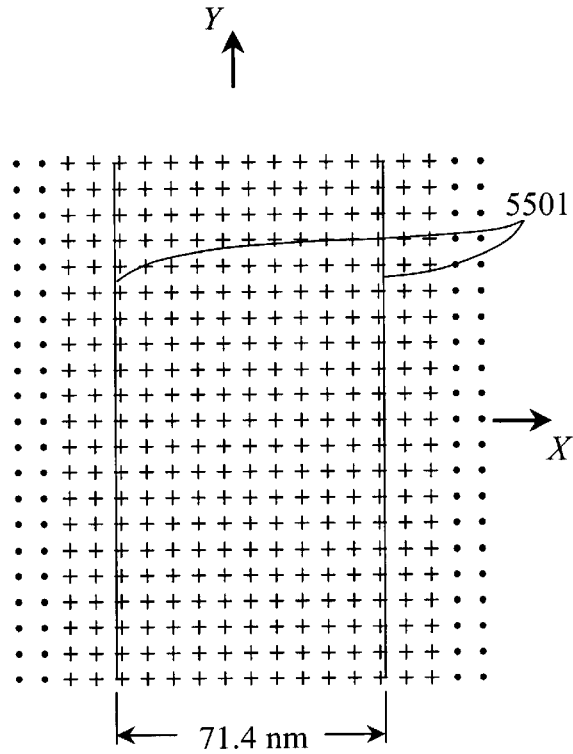
FIG. 55 illustrates a negative-tone line image.

FIG. 54 illustrates a positive-tone line image that would develop to an isolated space (i.e., trough) with a positive resist. The space dimension between the 25% contours 5401 is 69.8 nm. A complementary negative-tone line pattern shown in FIG. 55 has a line dimension of 71.4 nm between the 25% contours 5501. This pattern would develop to an isolated raised line (or ridge) in a positive resist. (Features of these dimensions would exhibit minimal proximity effects. For example, a simulated dense line/space pattern comprising features of the type illustrated in FIGS. 54 and 55, with a 137-nm pitch, exhibits an uncompensated iso-dense bias of less than 3 nm.)

FIGS. 56 and 57 are exposure profiles (in $Q_A$-relative units) through the X axes of FIGS. 52–55, showing the high contrast in the exposure distributions. Profiles 5601 and 5602 correspond to the FIG. 52 and FIG. 53 exposure patterns, respectively; and profiles 5701 and 5702 correspond respectively to FIG. 54 and FIG. 55.

The microlenses exhibit a useful frequency-filtering function that mitigates the effects of digitization and aliasing in the printed image. Each diffraction-limited image dot comprises spatial frequencies within a maximum frequency limit corresponding to a spatial period of $\lambda/(2NA_{geo})$=36.3 nm (wherein $\lambda$=11.3 nm and $NA_{geo}$ is the geometric numerical aperture defined in §2, $NA_{geo}$=0.156), and a composite exposure comprising a linear superposition of dot exposures will similarly be frequency-limited. This dimension defines the imaging system's optical resolution limit (which is significantly lower than the practical printing resolution). The printed image cannot contain any frequency components comprising spatial periods below the 36.3-nm limit. For example, one edge of the dot exposure patterns in FIG. 54 has a dithering pattern 5402 with a periodicity of 4 G=27.4 nm, but the exposure contours 5401 are nevertheless (theoretically) perfectly straight because the 27.4-nm dimension is below the 36.3-nm resolution limit. Generally, any one-dimensionally-periodic exposure pattern with a periodicity below 36.3 nm would print with perfectly straight exposure contours; and a two-dimensionally periodic pattern (such as a checkerboard pattern) within this periodicity limit would produce a perfectly uniform exposure distribution. (In reality, there may be some line edge roughness and exposure nonuniformity due to shot noise, Ref. 20. But at the assumed 20-mJ/cm$^2$ exposure threshold the shot noise effect would probably not be too significant.)

A variety of periodic dot patterns can be formed with periodicities below the optical resolution limit, and such patterns can be used to effectively provide grayscale control, to form straight-edged diagonal features, and to provide very precise control over dimensions and placement of print features. "Digital dithering" techniques based on sub-resolution patterning can give the lithography designer a great deal of flexibility in controlling image feature size, shape, orientation, and placement.

§11 Tolerance Factors

The print quality is affected by a variety of tolerance factors, including defective or non-functional pixels, statistical fluctuations in the LPP pulses, thermally-induced image magnification errors, focus errors, and lens surface form errors. The cumulative effect of such factors on the positions and dimensions of print features must generally be an order of magnitude smaller than the printing resolution, and the effect of individual tolerance factors must typically be two orders of magnitude smaller. Thus, for a system with 70-nm print resolution capability, the allowable printing errors from individual factors would be of order 1 nm. However, the tolerance requirements can be relaxed somewhat by employing tolerance compensation mechanisms such as micromechanical centration actuators on the second-stage microlenses (FIG. 1).

Figure 58A:
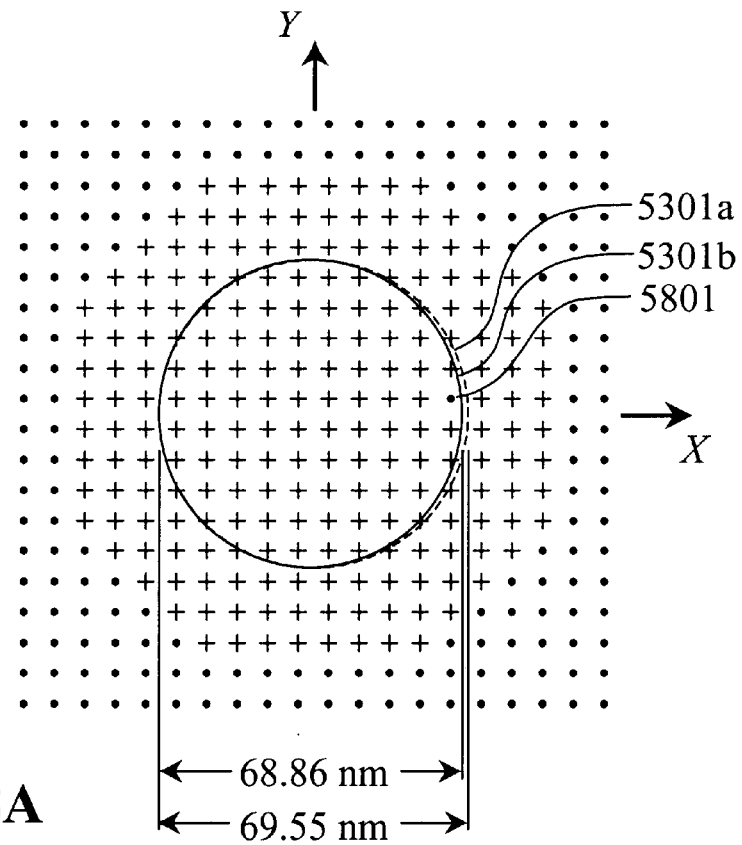
FIGS. 58A and 58B illustrate the printing effect of a defective pixel.
Figure 58B:
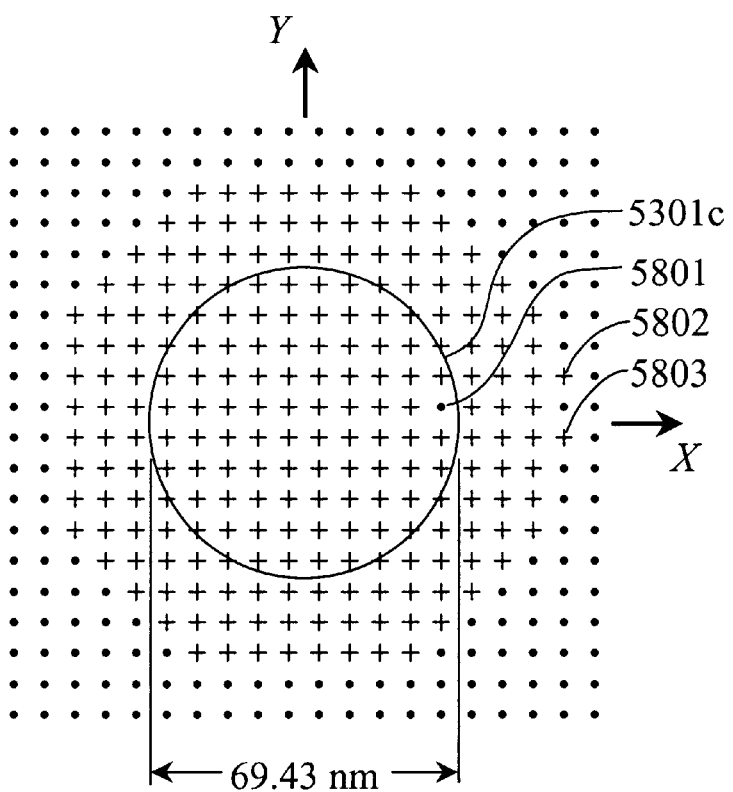

The printing system is very tolerant of isolated pixel defects. For example, FIG. 58A illustrates how a printer pixel stuck in its ON state would affect the negative-tone disk image of FIG. 53. FIG. 58A is identical to FIG. 53, except that an extra image dot 5801 proximate to the 25% threshold contour 5301a has been exposed by the defective pixel. This distorts the contour (as illustrated by the distorted contour 5301b), reducing its X dimension from a calculated value of 69.55 nm to 68.86 nm. This is only a 1% dimensional change. Moreover, if certain pixels are known to be defective, the dot pattern can be modified to compensate for the defects. For example, FIG. 58B illustrates the same dot pattern as FIG. 58A, except that two dots 5802 and 5803 are left unexposed to compensate for the extra dot 5801. The resulting threshold contour 5301c has an X dimension of 69.43 nm, and the dimensional error is an insignificant 0.11 nm.

Of course, if the defective pixel printed multiple dots clustered in a very small area its effect would be much greater. But the interleaved raster scan methods described in §8 ensure that the image dots that significantly overlap any particular wafer point will have all been exposed through different pixels, thereby avoiding any such clustering effect.

The image dots overlapping any particular wafer point will have also all been exposed by different LPP pulses. (Dots exposed during a single pulse are separated by at least 6 $\mu$m, the pixel center spacing; and hence they cannot overlap.) Thus the effect of statistical variations in pulse intensity will tend to cancel out in the printed image. For example, if the pulse variations are uncorrelated and normally distributed with a 5% standard deviation, the diameter of the 25% threshold contour 5203 (FIG. 52) would have an estimated corresponding standard deviation of 0.38 nm (or 0.54%). In contrast, a constant (time-independent) pulse intensity error of 5% would induce a threshold diameter error of 2.3 nm (3.2%). The negative-tone image in FIG. 53 would exhibit a corresponding 0.24-nm (0.34%) standard deviation for uncorrelated pulse variations and 2.0-nm (2.9%) for constant errors.

The dot centering accuracy and effective image magnification would be affected by thermal expansion in the printheads. Assuming that the printheads comprise silicon plates, a 0.1° C. temperature change would cause the plates to expand by a factor of 1+5×10$^{-7}$, resulting in a 5-nm positional shift at the periphery of a 20-mm printhead aperture. The second-stage microlenses' centration controls can be used to counterbalance this shift.

Figure 59:
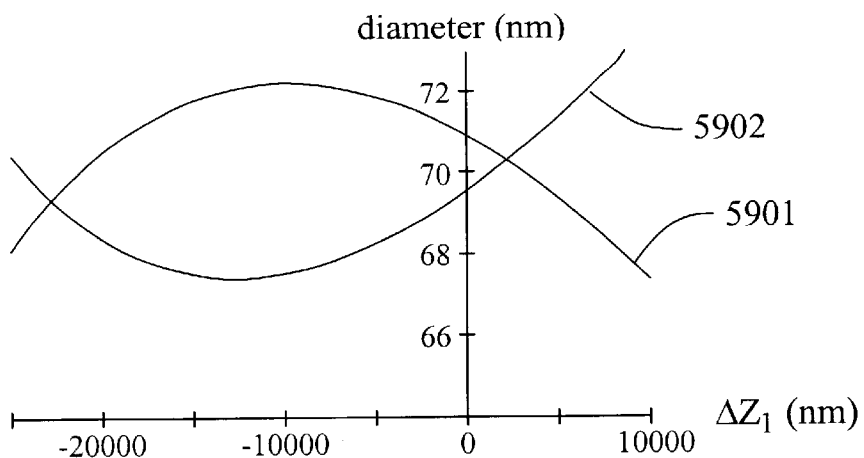
FIG. 59 illustrates the sensitivity of the image size to defocus of the first-stage microlens, for the positive- and negative-tone disk images of FIGS. 52, 53.
Figure 60:
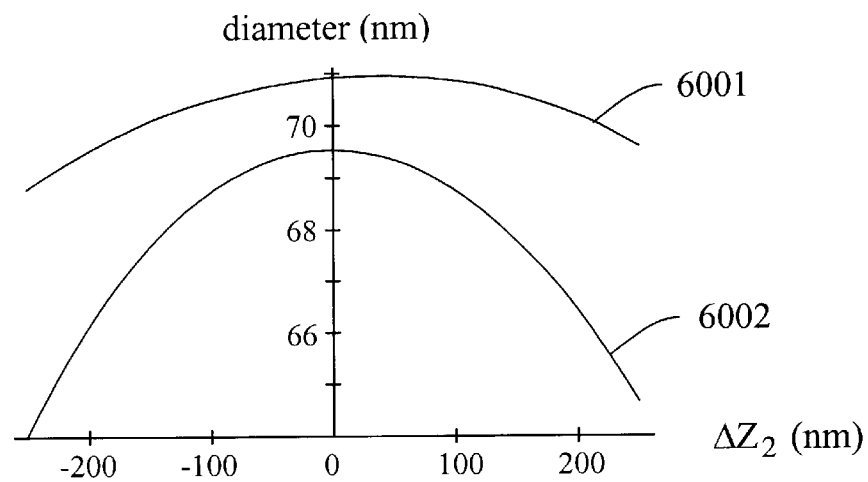
FIG. 60 illustrates the sensitivity of the image size to defocus of the second-stage microlens, for the positive- and negative-tone disk images of FIGS. 52, 53.

The image sensitivity to focus error is illustrated in FIGS. 59 and 60. FIG. 59 shows plots of the disk image diameter (i.e., the diameter of the 20 mJ/cm$^2$ exposure contour, such as contour 5203 or 5301a in FIGS. 52, 53) as a function of lens $L_1$'s defocus $\Delta Z_1$. Curve 5901 is for the positive-tone disk image of FIG. 52, and curve 5902 is for the negative-tone disk image of FIG. 53. Similarly, FIG. 60 plots the image diameter versus lens $L_2$'s defocus $\Delta Z_2$ for the positive- and negative-tone disk images (curves 6001 and 6002, respectively). The optical design has a slight focus correction (footnote in FIG. 13) to minimize the negative-tone image's sensitivity to $L_2$ defocus (curve 6002). (All of the image and tolerance simulations in this section and in §10 assume this same focus correction.) However, a similar correction is not made for $L_1$ because this would (according to optical simulations) make the image overly sensitive to lens aberrations. The focus tolerance range corresponding to a ±1-nm diameter shift of the negative-tone image (FIG. 53) is ±2.9/–3.6 $\mu$m for $L_1$ and ±1 nm for $L_2$. For the positive-tone image (FIG. 52) the corresponding ranges are ±3.4/–5.2 $\mu$m for $L_1$ and +222/–164 nm for $L_2$.

The lens surface form tolerance is the most critical tolerance factor. The system would be most sensitive to errors that are correlated between proximate pixels (and therefore have a cumulative effect on print quality), but which are uncorrelated on the scale of a printhead or wafer print module (and thus cannot be compensated for by adjusting focus, alignment, illumination level, or wafer processing conditions). Considering the disk images in FIGS. 52 and 53, the primary effect of pixel-correlated, uncompensated surface errors would be to change the size and centering position of the threshold contours 5203 and 5301a. (The contour shape distortion would typically be insignificant.) Image centering errors result from tilt and coma aberrations in $L_2$; whereas size errors are most strongly affected by lens thickness errors (which affect pixel transmittance) and $L_2$ aberrations of low azimuthal order, such as spherical aberration.

The negative-tone disk image of FIG. 53 is especially sensitive to lens aberrations in $L_2$. The image center coordinates have an approximately linear dependence on tilt and coma in $L_2$, and an RMS surface deviation of approximately 0.75 nm can result in a positional shift of up to 1 nm. The disk diameter has an approximate linear dependence on lens thickness, with a uniform surface deviation of 3 nm corresponding to a 1-nm diameter shift. The diameter sensitivity to spherical aberration is approximately quadratic, with an RMS surface deviation of 2 nm corresponding to approximately a 1-nm diameter error. (These estimates are based on simulated surface deviations having the form of Zernike polynomials up to 36th order.)

The image is much less sensitive to $L_1$ surface errors. The image centering is essentially unaffected by $L_1$ (unless the image is significantly out of focus). The image size has an approximately linear dependence on $L_1$ thickness, with a 4-nm thickness error corresponding to a 1-nm diameter shift. With the exception of the thickness factor, the diameter sensitivity to all $L_1$ aberrations is approximately quadratic, with an RMS surface error of approximately 4 nm corresponding to a 1-nm diameter error.

Lens surface tolerance requirements can be estimated from the above sensitivity factors. The estimation criterion is that the image diameter and centration errors associated with each surface should not exceed 1 nm. Based on this criterion, the total RMS surface deviation for each surface (including the lens thickness error) should be within 2 nm for $L_2$ and within 4 nm for $L_1$. Furthermore, the tilt and coma-related component of the $L_2$ surface deviation should be held to 0.75 nm RMS; although this latter requirement can be eliminated if a calibrated centration offset is applied to each $L_2$ lens. (These surface form tolerances could be relaxed somewhat by designing the system to optimize a design performance metric that includes tolerance sensitivity factors.)

Figure 61:
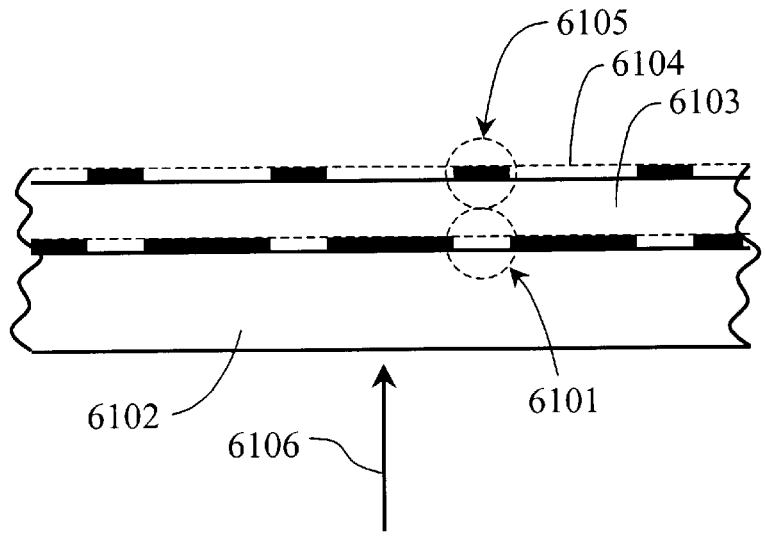
FIG. 61 is a cross-sectional view of an exposure test pattern that would be used to characterize second-stage lens centration errors, pixel defects, and alignment and stitching errors.

Centration controls can only be effective if the lens centration errors can be accurately characterized. One possible characterization method is the following (see FIG. 61). First, a periodic test pattern of submicron holes (such as hole 6101, shown cross-sectionally in FIG. 61) is patterned in a mask material on a UV-transparent substrate 6102 such as fused silica. The test pattern is formed using interference lithography to ensure accurate placement and size of the holes. A UV-transparent layer 6103 is deposited over the hole array, and then a second mask layer 6104 is deposited and a complementary array of isolated mesa patterns (such as mesa 6105) is lithographically patterned, using the EUV printing system. The pattern is back-illuminated with a beam of UV radiation 6106, and the transmitted radiation is analyzed with a UV micro-imaging and metrology system (not shown) which measures the energy transmitted through the area around each mesa. The transmitted energy distribution over the test pattern is measured as a function of illumination direction and is analyzed to determine the mesa size and position errors.

Variations of the test method outlined above can also be used to evaluate system performance factors other than lens aberrations. For example, the method can identify defective pixels. Also, printhead alignment errors and stitching alignment errors between printheads can be characterized. (For alignment testing, the same interference lithography system that is used to form the test pattern could also be used to form the alignment tracking patterns, such as patterns 305a and 305b in FIG. 2.)

§12 Control System Architecture

Figure 62:
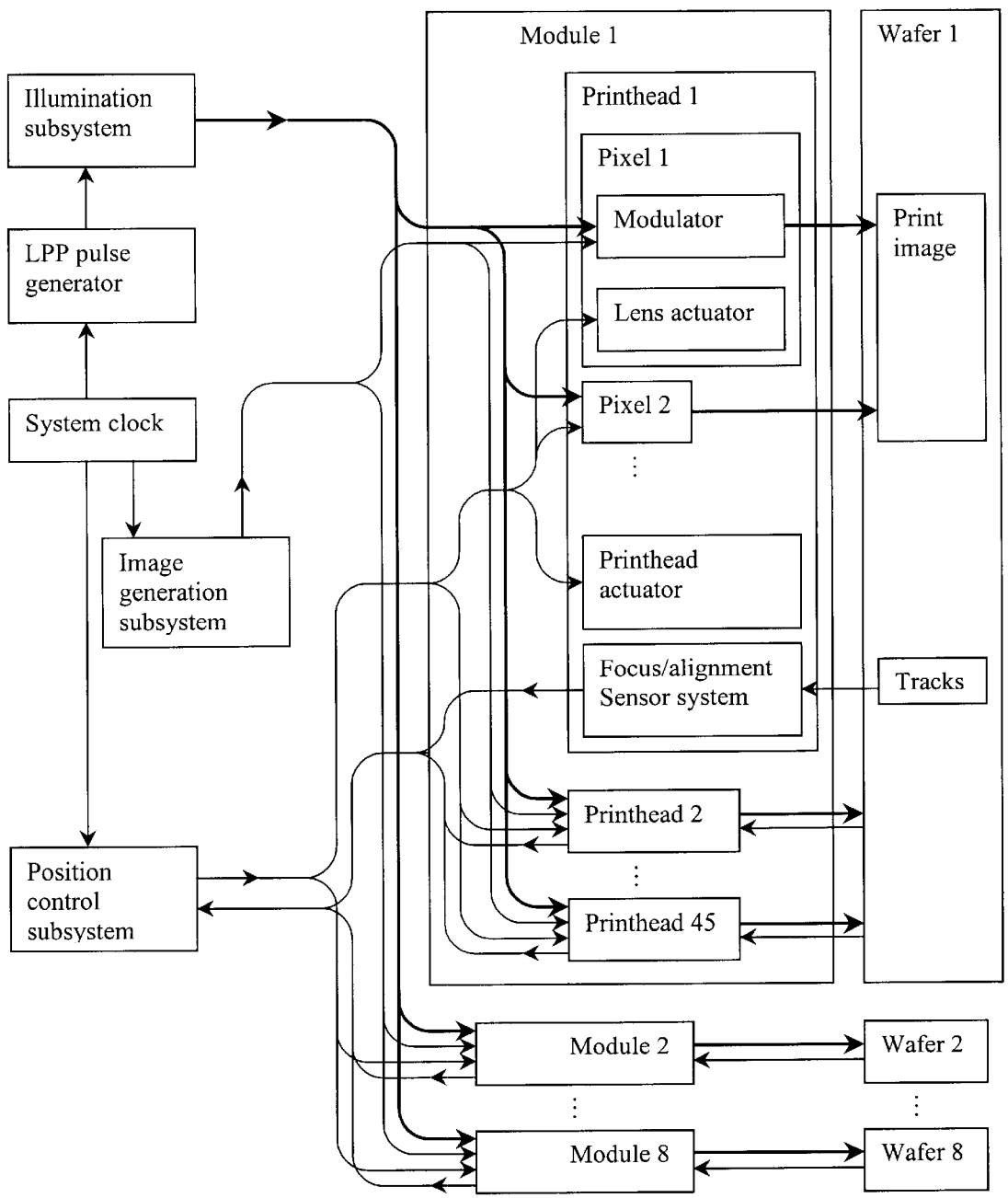
FIG. 62 is a block diagram illustrating the control system's main architectural components and interactions.

FIG. 62 is a block diagram illustrating the control system's main architectural components and interactions, in a preferred embodiment. The various elements were described in detail above, and will only be summarized here.

The printer comprises major subsystems for EUV illumination, position control, and image generation, which are synchronized to a common system clock. The illumination system includes the LPP pulse generator, the EUV source, and the EUV illumination mirrors. Illumination is supplied to eight wafer print modules ("Module 1" . . . "Module 8"), each of which prints onto a separate corresponding wafer. (Bold lines in FIG. 62 represent EUV radiation paths, whereas light lines represent data or informational paths.) Each module comprises 45 printheads, and each printhead comprises an array of printer pixels, a printhead actuator, and a focus/alignment system. The control elements within each pixel include a modulator and a lens actuator (on the second-stage lens).

The modulators are controlled by the image generation subsystem, which typically includes real-time image decompression hardware, high speed data lines (e.g., fiber optics) feeding the printheads, and integrated data demultiplexers and line buffers on the printheads. The system would typically supply a common data stream to all eight modules in order to minimize the cost and complexity of the image generation hardware.

The position control subsystem receives positional information from focus/alignment sensors (such as confocal-imaging microlens arrays) formed integrally on the printheads, which sense each printhead's position relative to wafer tracking patterns (the "Tracks" in FIG. 62). This information is processed by the position control system and is used to control the printhead actuators; also the lens actuators are controlled to compensate for thermal expansion and possibly other tolerance factors.

§13 References

1. D. W. Sweeney et al., "EUV Optical Design for a 100 nm CD Imaging System", SPIE Proc., Vol. 3331 (1998), pp. 2–10.

2. C. Montcalm et al., "Multilayer reflective coatings for extreme-ultraviolet lithography", SPIE Proc., Vol. 3331 (1998), pp. 42–51.

3. J. A. Folta et al., "Advances in multilayer reflective coatings for extreme-ultraviolet lithography", SPIE Proc., Vol. 3676 (1999), pp. 702–709.

4. Ruth DeJule, Ed., "Masks: What's Behind Rising Costs?", Semiconductor International, September, 1999, pp. 58–64.

5. Yashesh Shroff and William G. Oldham, U. C. Berkeley Microfabrication Laboratory, "EUV Nanomirror Light Modulator Array for Maskless Lithography", http://ilpsoft.eecs.berkeley.edu:9636/~ilpsoft/99abstracts/yashesh.2.html (DARPA) MDA972-97-1-0010 and (SRC) 96-LC460.

6. Neha Choksi, Mark McCord, David Markle and R. F. W. Pease, Solid State and Photonics Laboratory, Stanford University, "Maskless EUV Lithography Based on Elastic Micromirrors", http://chomsky.stanford.edu/~kevbert/neha poster/sld001.htm.

7. G. D. Kubiak et al., "High-power extreme ultraviolet source based on gas jets", SPIE Proc., Vol. 3331 (1998), pp. 81–89.

8. G. D. Kubiak et al., "Scale-up of a cluster jet laser plasma source for Extreme Ultraviolet Lithography", SPIE Proc., Vol. 3676 (1999), pp. 669–678.

9. J. A. Folta et al, "High Density Arrays of Micromirrors (Final Report)", California Univ., Livermore. Livermore Radiation Lab. Report Number: UCRL-ID-133164, February 1999.

10. William C. Sweatt and Richard H. Stulen, "Maskless Lithography", U.S. Pat. No. 5,870,176, issued Feb. 9, 1999.

11. Gregory D. Cooper and Richard M. Mohring, "Transferring a programmable pattern by photon lithography", pending patent application, publication WO9900706, filed Jun. 25, 1998.

12. Natale M. Ceglio and David A. Markle, "Maskless, Reticle-Free Lithography", U.S. Pat. No. 5,691,541, issued Nov. 25, 1997.

13. Kenneth C. Johnson, "Microlens Scanner for Microlithography and Wide-Field Confocal Microscopy", pending patent application, publication WO9734171, filed Feb. 20, 1997.

14. G. R. Padmanabhan, "Lithography Systems Employing Programmable Reticles", pending patent application, publication WO9705526, filed Jul. 25, 1996.

15. Kanti Jain and Jeffrey M. Hoffman, "Seamless, Maskless Lithography System Using Spatial Light Modulator", pending patent application, publication WO9804950, filed Jul. 25, 1996.

16. Henry I. Smith, "A proposal for maskless, zone-plate-array nanolithography," J. Vac Sci. Technol. B 14(6), November/December 1996, pp. 4318–4322.

17. Henry I. Smith, "Maskless lithography using a multiplexed array of Fresnel zone plates", U.S. Pat. No. 5,900,637, issued May 4, 1999.

18. D. J. D. Carter et al., "Zone-Plate Array Lithography (ZPAL): A new maskless approach", SPIE Proc., Vol. 3676 (1999), pp. 324–332.

19. J. R. Sheats and B. W. Smith (Ed.), "Microlithography Science and Technology", Marcel Dekker, Inc. (1998).

20. John M. Hutchinson, "The Shot Noise Impact on Resist Roughness in EUV Lithography", SPIE Proc., Vol. 3331 (1998), pp. 531–536.

21. S. Malzer et al, "Properties and applications of the 'epitaxial shadow mask molecular beam epitaxy technique'", J. Vac. Sci. Technol. B, Vol. 14(3) (1996), pp. 2175–2179.

22. M. Kim et al., "The growth of nanometer Si/SiGe/Si quantum well wires with local molecular beam epitaxy in dependence on the shadow mask geometry", Journal of Crystal Growth, Vol. 167 (1996), pp. 508–515.

23. J. Köhler et al, "Direct growth of nanostructures by deposition through an $Si_3N_4$ shadow mask", Physica E, Vol. 4 (1999), pp. 196–200.

24. Roli Lüithi et al, "Parallel nanodevice fabrication using a combination of shadow mask and scanning probe methods", Appl. Phys. Lett., Vol. 75(9) (1999), pp. 1314–1316.

25. M. P. Kanauff et al., "A Gas Curtain for Mitigating Hydrocarbon Contamination of EUV Lithographic Optical Components", SPIE Proc., Vol. 3676 (1999), pp. 735–742.

26. Claude Montcalm et al, "Passivating Overcoat Bilayer for Multilayer Reflective Coatings for Extreme Ultraviolet Lithography", U.S. Pat. No. 5,958,605, issued Sep. 28, 1999.

27. K. Miyamoto, "The Phase Fresnel Lens", J. Opt. Soc. Am., Vol. 51, No. 1 (1961), pp. 17–20.

28. B. W. Smith et al., "Materials for reflective multilayer coatings for EUV wavelengths", SPIE Proc., Vol. 3331 (1998), pp. 544–554.

29. C. Montcalm et al., "Multilayer coatings of 10× projection optics for extreme-ultraviolet lithography", SPIE Proc., Vol. 3676 (1999), pp. 710–716.

30. R. Grunwald et al., "Microlens formation by thin-film deposition with mesh-shaped masks", Applied Optics, Vol. 38(19) (1999), pp. 4117–4124.

31. J. G. Crockett et al., "Thickness Control of Semiconductor Device Layers in Reactive Ion Etch Processes", U.S. Pat. No. 5,882,468, issued Mar. 16, 1999.

32. M. L. Schattenburg et al., "Reactive-ion etching of 0.2 μm period gratings in tungsten and molybdenum using $CBrF_3$", J. Vac. Sci. Technol. B 3(1) (1985), pp. 272–275.

33. C. K. Malek et al., "Fabrication of high-resolution multilayer reflection zone plate microlenses for the soft x-ray range", Optical Engineering Vol. 30(8) (1991), pp. 1081–1085.

34. M. C. Hutley, "Optical techniques for the generation of microlens arrays", Journal of Modern Optics, Vol. 37(2) (1990), pp. 253–265.

35. A. Fernandez et al, "Methods for fabricating arrays of holes using interference lithography", USDOE, Washington, D.C. Report Number: UCRL-JC-125997; CONF-9705218 (1997).

36. H. P. Herzig (Ed.), "Micro-optics: Elements, systems and applications", Taylor & Francis (1997).

37. S. Sinzinger and J. Jahns, "Microoptics", WILEY-VCH (1999).

38. J. J. McClelland et al., "Nanofabrication via Atom Optics with Chromium", SPEE Proc., Vol. 2995 (1997), pp. 90–96.

39. John R. Karpinsky et al, "MEMS Micro-Shutter SLM for Intensity Modulation", SPIE Proc., Vol. 3633 (1999), pp. 254–259.

40. Carl O. Bozler and Steven Rabe, "Spatial Light Modulator", U.S. Pat. No. 5,959,763, issued Sept. 28, 1999.

41. D. M. Bloom, "Variable Attenuator for Laser Radiation", U.S. Pat. No. 4,327,966, issued May 4, 1982.

42. Zhenhai Chen and Ren C. Luo, "Design and Implementation of Capacitive Proximity Sensor Using Microelectromechanical Systems Technology", IEEE Transactions on Industrial Electronics, Vol. 45(6) (1998), pp. 886–894.

43. "Nomenclature and Definitions for Illuminating Engineering", ANSI/IESNA RP-16-96, Illuminating Engineering Society of North America (1996).

44. M. Feldman, "Use of Zone Plate Arrays in Projection X-Ray Lithography", OSA Proceedings on Soft-X-Ray Projection Lithography, Vol. 18 (1993), pp. 207–209.

§14 Conclusion

The EUV printer system design concept described in the preceding specification illustrates the potential benefits and performance characteristics of maskless EUV lithography. The system's most important benefits would be eliminating the need for EUV masks, and eliminating the requirement for optical elements meeting Angstrom-level figure tolerances over large apertures. The design presented herein may not be directly applicable in its specifics to practical applications since it is based on particular assumptions about the illumination source characteristics, manufacturing and material constraints, design objectives and optimization criteria, etc., which may not accurately represent practical design conditions. Nevertheless, the specification provides, by way of example, a general design concept and methodology that can be applied to a diversity of micro-printing applications ranging, for example, from high-speed, digital document printers to x-ray lithography systems employing synchrotron radiation.

While the above is a complete description of specific embodiments of the invention, various modifications, alternative constructions, and equivalents may be used. Therefore, the above description should not be taken as limiting the scope of the invention as defined by the claims.

What is claimed is:

1. A printing exposure apparatus comprising a radiation source, an illumination system, a modulator mechanism, a printhead, and a scanning mechanism, wherein the printhead comprises a printhead aperture and an array of printer pixels distributed across the printhead aperture, each pixel comprises a sequence of corresponding microlenses, which are symbolically designated as $L_1$, $L_2, \ldots, L_N$, wherein N is an integer greater than 1, the illumination system conveys radiation from the radiation source to the printhead, whereupon the first microlens $L_1$ in each sequence receives illuminating radiation, each microlens $L_m$ other than the last microlens $L_N$ in the sequence focuses the illuminating radiation onto the next corresponding microlens $L_{m+1}$, the last microlens $L_N$ in each sequence focuses the illuminating radiation onto a corresponding focal point on a printing surface, the modulator mechanism modulates the radiation, whereby the focal points' exposure intensity levels are controllably varied, the modulator mechanism is a spatial light modulator comprising an array of modulator elements, each pixel further comprises one such modulator element disposed between that pixel's microlens $L_1$ and the printing surface, the exposure intensity at each pixel's corresponding focal point is modulated independently of other pixels, and the scanning mechanism establishes relative motion between the printing surface and the printhead in synchronization with the modulator mechanism as the printing surface is exposed, whereby a synthesized, high-resolution exposure image is formed on the printing surface.

2. A printing exposure apparatus comprising a radiation source, an illumination system, a modulator mechanism, a printhead, and a scanning mechanism, wherein the printhead comprises a printhead aperture and an array of printer pixels distributed across the printhead aperture, each pixel comprises a sequence of corresponding microlenses, which are symbolically designated as $L_1$, $L_2, \ldots, L_N$, wherein N is an integer greater than 1, the illumination system conveys radiation from the radiation source to the printhead, whereupon the first microlens $L_1$ in each sequence receives illuminating radiation, each microlens $L_m$ other than the last microlens $L_N$ in the sequence focuses the illuminating radiation onto the next corresponding microlens $L_{m+1}$, the last microlens $L_N$ in each sequence focuses the illuminating radiation onto a corresponding focal point on a printing surface, the modulator mechanism modulates the radiation before it is conveyed to the printhead and all the focal points' exposure intensity levels are subjected to the same modulation, and the scanning mechanism establishes relative motion between the printing surface and the printhead in synchronization with the modulator mechanism as the printing surface is exposed, whereby a synthesized, high-resolution exposure image is formed on the printing surface.

3. A printing exposure apparatus comprising:

a radiation source;

a printhead comprising a printhead aperture and an array of printer pixels distributed across the printhead aperture, wherein each pixel comprises a sequence of corresponding microlenses including at least first and last microlenses, and a modulator element disposed between the first microlens and the printing surface;

an illumination system that conveys radiation from the radiation source to the printhead, whereupon for each pixel in the printhead the first microlens in the sequence receives illuminating radiation, each microlens other than the last microlens in the sequence focuses received illuminating radiation onto the next corresponding microlens, and the last microlens in the sequence focuses received illuminating radiation onto a corresponding focal point on a printing surface;

a modulator control mechanism that controls the modulators in the printhead independently of each other so that the exposure intensity at each pixel's corresponding focal point is modulated independently of other pixels; and a scanning mechanism that establishes relative motion between the printing surface and the printhead in synchronization with the modulator control mechanism as the printing surface is exposed.

4. A printing exposure apparatus comprising:

a radiation source;

a printhead comprising a printhead aperture and an array of printer pixels distributed across the printhead aperture, wherein each pixel comprises a sequence of corresponding microlenses including at least first and last microlenses, and an illumination system that conveys radiation from the radiation source to the printhead, whereupon for each pixel in the printhead the first microlens in the sequence receives illuminating radiation, each microlens other than the last microlens in the sequence focuses received illuminating radiation onto the next corresponding microlens, and the last microlens in the sequence focuses received illuminating radiation onto a corresponding focal point on a printing surface;

a modulator mechanism that modulates the radiation before it is conveyed to the printhead so that the exposure intensity at each pixel's corresponding focal point is subjected to the same modulation; and a scanning mechanism that establishes relative motion between the printing surface and the printhead in synchronization with the modulator control mechanism as the printing surface is exposed.

5. The exposure apparatus of claim 1 or 2 or 3 or 4, wherein the radiation comprises EUV radiation in the 10 to 15 nanometer wavelength range.

6. The exposure apparatus of claim 5, wherein the radiation source is a xenon laser-produced plasma source.

7. The exposure apparatus of claim 1 or 2 or 3 or 4, wherein the radiation source is a synchrotron and the radiation is EUV or x-ray radiation.

8. The exposure apparatus of claim 1 or 2 or 3 or 4, wherein at least one of each pixel's corresponding microlenses is a singlet, continuous-profile lens element.

9. The exposure apparatus of claim 5, wherein at least one of each pixel's corresponding microlenses is a singlet, continuous-profile meniscus lens element composed of an optical material whose complex refractive index has a real part less than 1 over the operating EUV wavelength range.

10. The exposure apparatus of claim 9, wherein the singlet element is composed of one of the materials molybdenum, niobium, ruthenium, rhodium, or yttrium.

11. The exposure apparatus of claim 1 or 2 or 3 or 4, wherein each pixel's last microlens is a multiple-element lens.

12. The exposure apparatus of claim 5, wherein each pixel's last microlens is a triplet lens comprising two continuous-profile, meniscus elements with a convex spacer element between them.

13. The exposure apparatus of claim 1 or 2 or 3 or 4, wherein at least one of each pixel's corresponding microlenses is a phase Fresnel lens.

14. The exposure apparatus of claim 1 or 2 or 3 or 4, wherein at least one of each pixel's corresponding microlenses is a Fresnel zone plate.

15. The exposure apparatus of claim 1, wherein each pixel further comprises a micromechanical actuation mechanism for fine-adjusting the lateral position of the pixel's corresponding last microlens.

16. The apparatus of claim 1 or 2 or 3 or 4 wherein the number of microlenses per pixel is two.

17. The apparatus of claim 1 or 2 or 3 or 4, further comprising at least one additional printhead to define a plurality of printheads that define a wafer print module, wherein the printing surface is on a semiconductor wafer, and the printheads simultaneously expose a common printing surface on the wafer.

18. The exposure apparatus of claim 1 or 2 or 3 or 4, wherein each modulator element comprises a micromechanically-actuated shutter.

19. The exposure apparatus of claim 1 or 2 or 3 or 4, wherein each modulator element is a grating modulator comprising two proximate, lamellar transmission gratings, one of which is micromechanically actuated to modulate the gratings' combined transmittance in the zero order.

20. The exposure apparatus of claim 1 or 2 or 3 or 4, wherein the printhead further comprises a position sensor system that detects the printhead's position relative to the printing surface, and wherein the detected positional information is used to accurately control the relative alignment between the printing surface and the printhead while scanning.

21. The exposure apparatus of claim 3, wherein the illumination system comprises collection optics that produce a collimated radiation beam of substantially uniform irradiance, and distribution optics that efficiently partition the collimated beam into individual illumination zones covering individual printhead apertures.

22. The exposure apparatus of claim 17, wherein the collection optics comprises a condenser mirror and collimator mirror, and wherein the mirrors' surface shapes are configured to simultaneously satisfy the collimation and uniformity conditions, taking into account the radiation source's angular emission distribution and the mirror's reflectivity dependence on incidence angle.

23. The exposure apparatus of claim 21, wherein the collection optics comprises a condenser mirror and collimator mirror, the mirrors comprise reflective coatings, the collimator is spherical, and the mirrors' surface shapes and reflective coatings are configured to simultaneously satisfy the collimation and uniformity conditions, taking into account the radiation source's angular emission distribution and the mirror's reflectivity dependence on incidence angle.

24. The exposure apparatus of claim 21, wherein the distribution optics comprise two sets of flat, terraced fold mirrors, including a first set of fold mirrors that partition the collimated beam from the collection optics into a set of first reduced-aperture collimated beams, and a second set of fold mirrors that partition each first reduced-aperture beam into a set of second reduced-aperture collimated beams, wherein each second reduced-aperture collimated beam illuminates a particular corresponding printhead aperture.

25. The exposure apparatus of claim 24, wherein the radiation comprises EUV radiation in the 10 to 15 nanometer wavelength range, the radiation source is a xenon laser-produced plasma source, and the fold mirrors comprise reflective coatings whose reflectivities counterbalance and compensate for exposure illumination variations between printheads due to EUV absorption by ambient xenon gas.

26. The exposure apparatus of claim 1 or 2 or 3 or 4, wherein the scanning mechanism translates the printhead relative to a stationary printing surface during exposure.

27. The exposure apparatus of claim 26, wherein the printing surface is exposed through multiple exposure scans and is stepped between scans so that the printhead raster-scans multiple exposure fields.

28. The exposure apparatus of claim 1 or 2 or 3 or 4, wherein the scanning mechanism translates the printing surface during exposure, while the printhead remains substantially stationary except for small positional corrections to maintain accurate positional alignment between the printhead and printing surface.

29. The exposure apparatus of claim 1 or 2 or 3 or 4, wherein the scanning motion interleaves or overlaps exposure patterns from different pixels so that any typical exposure point on the printing surface receives exposure energy from multiple pixels, whereby the resulting exposure image is not significantly affected by isolated pixel defects or nonfunctional pixels.

30. The apparatus of claim 3, further comprising at least one additional wafer print module to define a plurality of wafer print modules, wherein the modules simultaneously expose different print surfaces on separate wafers.

31. The exposure apparatus of claim 12, wherein the meniscus elements are made of molybdenum.

32. The exposure apparatus of claim 12, wherein the spacer is made of beryllium.

33. The exposure apparatus of claim 12, wherein the spacer is a vacuum space.

* * * * *

UNITED STATES PATENT AND TRADEMARK OFFICE
CERTIFICATE OF CORRECTION

PATENT NO. : 6,498,685 B1
DATED : December 24, 2002
INVENTOR(S) : Kenneth Carlisle Johnson It is certified that error appears in the above-identified patent and that said Letters Patent is hereby corrected as shown below:

Title page,
Item [56], OTHER PUBLICATIONS, Reference "Lüthi, Roli et al.",
change "probate" to -- probe --.

Column 1,
Line 26, change "ETV" to -- EUV --.
Line 63, change "mn" to -- nm --.
Line 66, change "LW" to -- UV --.

Column 2,
Line 52, change "10" to -- $10^{12}$ --.

Column 6,
Line 18, change "ETV" to -- EUV --.
Line 45, change "EUI" to -- EUV --.

Column 12,
Line 26, change "such as a" to -- such as --.

Column 13,
Line 48, change "((" to -- ( --.
Equation 2.1, change "$\eta_1$" to -- $_1$ --, change "$c^2{}_{f1}$" to -- $c_{f1}{}^2$ --, and change "$c^2{}_{f2}$" to -- $c_{f2}{}^2$ --.

Column 14,
Equation 2.4, change "$c^3 s$" to -- $c_s{}^3$ --.

Columns 15 Equations 2.10 and Column 16, 2.11, move "$\tilde{n}_{Mo} = n_{Mo} - ik_{Mo}$" from the bottom of Equation 2.10 to the top of Equation 2.11.

Column 17,
Line 32, change "µm" to -- nm --.

Column 18,
Line 31, change "$L_1$" to -- $L_f$ --.
Line 55, change "EWV" to -- EUV --.

UNITED STATES PATENT AND TRADEMARK OFFICE
CERTIFICATE OF CORRECTION

PATENT NO. : 6,498,685 B1
DATED : December 24, 2002
INVENTOR(S) : Kenneth Carlisle Johnson It is certified that error appears in the above-identified patent and that said Letters Patent is hereby corrected as shown below:

Column 23,
Line 9, change "MI" to -- M1 --.
Line 17, change "MI" to M1 --.
Line 29, change "ETV" to -- EUV --.

Column 24,
Line 3, change "M4.3" to -- M4.3.1 --.

Column 26,
Line 22, change "250" to -- 25° --. (This is not a figure reference numeral.)
Equation 6.3, change "$ñ^2{}_{Mo}$" to -- $ñ_{Mo}{}^2$ --.
Equation 6.4, change "$ñ^2{}_{Be}$" to -- $ñ_{Be}{}^2$ --.

Column 27,
Lines 32-33, change "2901 a" to -- 2901a --.

Column 28,
Line 9, delete "10".
Line 22, change "Eqs." to -- (from Eqs. --.

Line 28, in Eq. 6.19, change "$\int$" to -- $\int$ --.
Lines 49, 51, 53 and 65, "$1_1$" to -- $l_1$ -- .
Lines 49 and 66, change "$1_2$" to -- $l_2$ --.

Column 29,
Equation 6.29, change "$y_1{}^2{}_{+z_12}$" to -- $y_1{}^2 + z_1{}^2$ --.
Line 66, change "$I_2$" to -- $l_2$ --.
Equation 6.30, change "$y_1 - l_1 \sin \Phi_1$" to -- $y_1 = -l_1 \sin \Phi_1$ --.
Equation 6.31, change "$1_1$" to -- $l_1$ --.
Equation 6.32 and 6.33, change "$1_2$" to -- $l_2$ --.

Column 30,
Equation 34, 6.37, 6.41, 6.46 and lines 13, 21, 29, 34 and 54, change "$1_1$" to -- $l_1$ --.
Equation 34 and lines 2, 4, 11 and 52, change "$1_2$" to -- $l2$ --.

Column 31,
Line 1, change "$1_1$" to -- $1_1$ --.
Line 1, change "$1_2$" to -- $l_2$ --.

UNITED STATES PATENT AND TRADEMARK OFFICE
CERTIFICATE OF CORRECTION

PATENT NO. : 6,498,685 B1
DATED : December 24, 2002
INVENTOR(S) : Kenneth Carlisle Johnson It is certified that error appears in the above-identified patent and that said Letters Patent is hereby corrected as shown below:

Column 37,
Lines 13-14, change "$N_{pulse/line}$, $\Delta X_{field}$, and $N_{xscan}$" to -- $N'_{pulse/line}$, $\Delta X'_{field}$, and $N'_{xscan}$ --.
Equation 8.13, change "$N_{pules/line}$" to -- $N'_{pulse/line}$ --.
Equation 8.15, change "$N_{xscan}$" to -- $N'_{xscan}$ --.
Equation 8.16, change "$I = \{j_x, j_y\}$" to -- $j = \{j_x, j_y\}$ --; and change "$k = \{k_y, k_y\}$" to -- $k = \{k_x, k_y\}$ --.

Column 38,
Line 17, change "union over $l$ of $Dot[i,j,k]$" to -- union over l of $Dot[i,k,l]$ --.

Column 39,
Lines 10-11, remove the line breake in "$N_{line/scan}$".
Lines 11-12, remove the line break in "$N_{pules/scan}$".

Column 40,
Equation 8.29, change "$0 < 1_x < N_{pulse/line}$" to -- $0 \leq 1_x < N_{pulse/line}$ --.
Equation 8.30, change "$0 < 1_y < N_{line/scan}$" to -- $0 \leq 1_y < N_{line/scan}$ --.

Column 41,
Line 39, change "$\vec{o}$" to -- $\vec{0}$ --.

Column 44,
Equation 8.89, change "$\Delta_{Ypixel=((}$" to -- $\Delta Y_{pixel} = ((\,$ --.

Column 45,
Equation 8.102, change "$v_{scan}$" to -- $v_{scan}$ --.

Column 46,
Line 44, change "$Scan[\{1, j_y\}]$, $Scan[\{1, j_y\}]$" to -- $Scan[\{0, j_y\}]$, $Scan[\{1, j_y\}]$ --.
Lines, 48-49, remove the line break in "$N'_{x\,scan}$".
Equation 8.109, change "$N_{x\,scan}$" to -- $N'_{x\,scan}$ --.

Column 47,
Equation 8.115, change "$N'_{pulse/scan} = N_{pulse/line}\,N_{line/scan}$" to -- $N'_{pulse/scan} = N'_{pulse/line}\,N'_{line/scan}$ --.
Equation 8.116, change "x" to -- / --.

UNITED STATES PATENT AND TRADEMARK OFFICE
CERTIFICATE OF CORRECTION

PATENT NO.    : 6,498,685 B1
DATED         : December 24, 2002
INVENTOR(S)   : Kenneth Carlisle Johnson It is certified that error appears in the above-identified patent and that said Letters Patent is hereby corrected as shown below:

Column 48,
Equation 8.120, change "-6.86" to -- 6.86 --.
Equation 8.121, change "-21.9" to -- 21.9 --.

Column 50,
Equation 8.139, change "= 66260.3" to -- ≅ 66260.3 --.
Equation 8.150, change "$K_x = 1$" to -- $K_x = -1$ --.

Column 51,
Equation 8.158, change "$N_{pulse/line}$" to -- $N'_{pulse/line}$ --.

Column 53,
Line 45, change "$cm_2$" to -- $cm^2$ --.

Column 56,
Line 13, change "±2.9" to -- + 2.9 --; change "±1" to -- ±111 --.
Line 14, change "±3.4" to -- + 3.4 --.

Column 63,
Line 19, change "3" to -- 17 --.
Line 25, change "17" to -- 21 --.

Column 64,
Line 33, change "3" to -- 17 --.

Signed and Sealed this

Sixteenth Day of September, 2003

JAMES E. ROGAN
*Director of the United States Patent and Trademark Office*